United States Patent
Lin et al.

(10) Patent No.: US 7,132,741 B1
(45) Date of Patent: Nov. 7, 2006

(54) SEMICONDUCTOR CHIP ASSEMBLY WITH CARVED BUMPED TERMINAL

(75) Inventors: Charles W. C. Lin, Singapore (SG); Cheng-Lien Chiang, Taipei (TW)

(73) Assignee: Bridge Semiconductor Corporation, Taipei (TW)

( * ) Notice: Subject to any disclaimer, the term of this patent is extended or adjusted under 35 U.S.C. 154(b) by 185 days.

(21) Appl. No.: 10/994,836

(22) Filed: Nov. 22, 2004

Related U.S. Application Data

(60) Continuation-in-part of application No. 10/922,280, filed on Aug. 19, 2004, now Pat. No. 7,009,297, which is a continuation-in-part of application No. 10/307,218, filed on Nov. 29, 2002, now Pat. No. 6,809,414, which is a division of application No. 09/997,973, filed on Nov. 29, 2001, now Pat. No. 6,492,252, which is a continuation-in-part of application No. 09/917,339, filed on Jul. 27, 2001, now Pat. No. 6,537,851, which is a continuation-in-part of application No. 09/878,626, filed on Jun. 11, 2001, now Pat. No. 6,653,217, which is a continuation-in-part of application No. 09/687,619, filed on Oct. 13, 2000, now Pat. No. 6,440,835.

(60) Provisional application No. 60/523,566, filed on Nov. 20, 2003, provisional application No. 60/497,672, filed on Aug. 25, 2003, provisional application No. 60/497,425, filed on Aug. 22, 2003.

(51) Int. Cl.
  *H01L 23/48* (2006.01)
  *H01L 23/495* (2006.01)
  *H01L 23/12* (2006.01)

(52) U.S. Cl. ............... 257/696; 257/673; 257/674; 257/700; 257/737; 257/738

(58) Field of Classification Search ............... 257/669, 257/673, 674, 692, 696, 698, 700, 737, 738
See application file for complete search history.

(56) References Cited

U.S. PATENT DOCUMENTS

| | | | |
|---|---|---|---|
| 4,442,967 A | 4/1984 | van de Pas et al. | 228/159 |
| 4,661,192 A | 4/1987 | McShane | 156/292 |
| 4,717,066 A | 1/1988 | Goldenberg et al. | 228/179 |
| 4,750,666 A | 6/1988 | Neugebauer et al. | 228/160 |
| 4,807,021 A | 2/1989 | Okumura | 357/75 |
| 4,925,083 A | 5/1990 | Farassat et al. | 228/102 |
| 4,937,653 A | 6/1990 | Blonder et al. | 357/68 |
| 4,955,523 A | 9/1990 | Calomagno et al. | 228/179 |
| 4,970,571 A | 11/1990 | Yamakawa et al. | 357/71 |

(Continued)

FOREIGN PATENT DOCUMENTS

| | | |
|---|---|---|
| EP | 0 718 882 A1 | 6/1996 |

(Continued)

OTHER PUBLICATIONS

Markstein et al., "Controlling the Variables in Stencil Printing," Electronic Packaging & Production, Feb. 1997, pp. 48-56.

(Continued)

*Primary Examiner*—Ngân V. Ngô
(74) *Attorney, Agent, or Firm*—David M. Sigmond

(57) ABSTRACT

A semiconductor chip assembly includes a semiconductor chip that includes a conductive pad, a conductive trace that includes a routing line, a bumped terminal and a metal filler, a connection joint that electrically connects the routing line and the pad, and an encapsulant. The routing line is contiguous with and integral with the bumped terminal and extends laterally beyond the bumped terminal and the metal filler, and the metal filler contacts the bumped terminal in a cavity that extends through the bumped terminal.

100 Claims, 32 Drawing Sheets

U.S. PATENT DOCUMENTS

| | | | |
|---|---|---|---|
| 4,984,358 A | 1/1991 | Nelson | 29/830 |
| 5,014,111 A | 5/1991 | Tsuda et al. | 357/68 |
| 5,060,843 A | 10/1991 | Yasuzato et al. | 228/179 |
| 5,074,947 A | 12/1991 | Estes et al. | 156/307.3 |
| 5,090,119 A | 2/1992 | Tsuda et al. | 29/843 |
| 5,106,461 A | 4/1992 | Volfson et al. | 205/125 |
| 5,116,463 A | 5/1992 | Lin et al. | 156/653 |
| 5,137,845 A | 8/1992 | Lochon et al. | 437/183 |
| 5,167,992 A | 12/1992 | Lin et al. | 472/437 |
| 5,172,851 A | 12/1992 | Matsushita et al. | 228/179 |
| 5,196,371 A | 3/1993 | Kulesza et al. | 437/183 |
| 5,209,817 A | 5/1993 | Ahmad et al. | 156/643 |
| 5,237,130 A | 8/1993 | Kulesza et al. | 174/260 |
| 5,260,234 A | 11/1993 | Long | 437/203 |
| 5,261,593 A | 11/1993 | Casson et al. | 228/180.22 |
| 5,275,330 A | 1/1994 | Isaacs et al. | 228/180.2 |
| 5,284,796 A | 2/1994 | Nakanishi et al. | 437/183 |
| 5,293,067 A | 3/1994 | Thompson et al. | 257/668 |
| 5,294,038 A | 3/1994 | Nakano | 228/179.1 |
| 5,327,010 A | 7/1994 | Uenaka et al. | 257/679 |
| 5,334,804 A | 8/1994 | Love et al. | 174/267 |
| 5,346,750 A | 9/1994 | Hatakeyama et al. | 428/209 |
| 5,355,283 A | 10/1994 | Marrs et al. | 361/760 |
| 5,358,621 A | 10/1994 | Oyama | 205/123 |
| 5,364,004 A | 11/1994 | Davidson | 228/1.1 |
| 5,397,921 A | 3/1995 | Karnezos | 257/779 |
| 5,407,864 A | 4/1995 | Kim | 437/203 |
| 5,424,245 A | 6/1995 | Gurtler et al. | 437/183 |
| 5,438,477 A | 8/1995 | Pasch | 361/689 |
| 5,439,162 A | 8/1995 | George et al. | 228/180.22 |
| 5,447,886 A | 9/1995 | Rai | 437/183 |
| 5,454,161 A | 10/1995 | Beilin et al. | 29/852 |
| 5,454,928 A | 10/1995 | Rogers et al. | 205/125 |
| 5,475,236 A | 12/1995 | Yoshizaki | 257/48 |
| 5,477,933 A | 12/1995 | Nguyen | 174/262 |
| 5,478,007 A | 12/1995 | Marrs | 228/180.22 |
| 5,483,421 A | 1/1996 | Gedney et al. | 361/771 |
| 5,484,647 A | 1/1996 | Nakatani et al. | 428/209 |
| 5,485,949 A | 1/1996 | Tomura et al. | 228/180.5 |
| 5,487,218 A | 1/1996 | Bhatt et al. | 29/852 |
| 5,489,804 A | 2/1996 | Pasch | 257/778 |
| 5,493,096 A | 2/1996 | Koh | 219/121.71 |
| 5,508,229 A | 4/1996 | Baker | 437/183 |
| 5,525,065 A | 6/1996 | Sobhani | 439/67 |
| 5,536,973 A | 7/1996 | Yamaji | 257/737 |
| 5,542,601 A | 8/1996 | Fallon et al. | 228/119 |
| 5,547,740 A | 8/1996 | Higdon et al. | 428/209 |
| 5,556,810 A | 9/1996 | Fujitsu | 437/209 |
| 5,556,814 A | 9/1996 | Inoue et al. | 437/230 |
| 5,564,181 A | 10/1996 | Dineen et al. | 29/841 |
| 5,572,069 A | 11/1996 | Schneider | 257/690 |
| 5,576,052 A | 11/1996 | Arledge et al. | 427/98 |
| 5,583,073 A | 12/1996 | Lin et al. | 439/183 |
| 5,595,943 A | 1/1997 | Itabashi et al. | 437/230 |
| 5,599,744 A | 2/1997 | Koh et al. | 437/195 |
| 5,611,140 A | 3/1997 | Kulesza et al. | 29/832 |
| 5,611,884 A | 3/1997 | Bearinger et al. | 156/325 |
| 5,613,296 A | 3/1997 | Kurino et al. | 29/852 |
| 5,614,114 A | 3/1997 | Owen | 219/121.66 |
| 5,615,477 A | 4/1997 | Sweitzer | 29/840 |
| 5,619,791 A | 4/1997 | Lambrecht, Jr. et al. | 29/852 |
| 5,627,405 A | 5/1997 | Chillara | 257/668 |
| 5,627,406 A | 5/1997 | Pace | 257/700 |
| 5,633,204 A | 5/1997 | Tago et al. | 438/614 |
| 5,637,920 A | 6/1997 | Loo | 257/700 |
| 5,641,113 A | 6/1997 | Somaki et al. | 228/180.22 |
| 5,645,628 A | 7/1997 | Endo et al. | 106/1.23 |
| 5,646,067 A | 7/1997 | Gaul | 437/180 |
| 5,648,686 A | 7/1997 | Hirano et al. | 257/778 |
| 5,654,584 A | 8/1997 | Fujitsu | 257/666 |
| 5,656,858 A | 8/1997 | Kondo et al. | 257/737 |
| 5,663,598 A | 9/1997 | Lake et al. | 257/737 |
| 5,665,652 A | 9/1997 | Shimizu | 438/127 |
| 5,666,008 A | 9/1997 | Tomita et al. | 257/778 |
| 5,669,545 A | 9/1997 | Pham et al. | 228/1.1 |
| 5,674,785 A | 10/1997 | Akram et al. | 437/217 |
| 5,674,787 A | 10/1997 | Zhao et al. | 437/230 |
| 5,682,061 A | 10/1997 | Khandros et al. | 257/666 |
| 5,686,353 A | 11/1997 | Yagi et al. | 437/183 |
| 5,691,041 A | 11/1997 | Frankeny et al. | 428/209 |
| 5,722,162 A | 3/1998 | Chou et al. | 29/852 |
| 5,723,369 A | 3/1998 | Barber | 438/106 |
| 5,731,223 A | 3/1998 | Padmanabhan | 437/183 |
| 5,736,456 A | 4/1998 | Akram | 438/614 |
| 5,739,585 A | 4/1998 | Akram et al. | 257/698 |
| 5,744,827 A | 4/1998 | Jeong et al. | 257/686 |
| 5,744,859 A | 4/1998 | Ouchida | 257/668 |
| 5,757,071 A | 5/1998 | Bhansali | 257/697 |
| 5,757,081 A | 5/1998 | Chang et al. | 257/778 |
| 5,764,486 A | 6/1998 | Pendse | 361/774 |
| 5,774,340 A | 6/1998 | Chang et al. | 361/771 |
| 5,789,271 A | 8/1998 | Akram | 438/18 |
| 5,798,285 A | 8/1998 | Bentlage et al. | 438/108 |
| 5,801,072 A | 9/1998 | Barber | 438/107 |
| 5,801,447 A | 9/1998 | Hirano et al. | 257/778 |
| 5,803,340 A | 9/1998 | Yeh et al. | 228/56.3 |
| 5,804,771 A | 9/1998 | McMahon et al. | 174/255 |
| 5,808,360 A | 9/1998 | Akram | 257/738 |
| 5,811,879 A | 9/1998 | Akram | 257/723 |
| 5,813,115 A | 9/1998 | Misawa et al. | 29/832 |
| 5,817,541 A | 10/1998 | Averkiou et al. | 438/107 |
| 5,822,856 A | 10/1998 | Bhatt et al. | 29/832 |
| 5,834,844 A | 11/1998 | Akagawa et al. | 257/734 |
| 5,854,507 A | 12/1998 | Miremadi et al. | 257/686 |
| 5,861,666 A | 1/1999 | Bellaar | 257/686 |
| 5,863,816 A | 1/1999 | Cho | 438/123 |
| 5,870,289 A | 2/1999 | Tokuda et al. | 361/779 |
| 5,883,435 A | 3/1999 | Geffken et al. | 257/758 |
| 5,925,931 A | 7/1999 | Yamamoto | 257/737 |
| 5,973,393 A | 10/1999 | Chia et al. | 257/690 |
| 5,994,222 A | 11/1999 | Smith et al. | 438/689 |
| 6,001,671 A | 12/1999 | Fjelstad | 438/112 |
| 6,012,224 A | 1/2000 | DiStefano et al. | 29/840 |
| 6,013,877 A | 1/2000 | Degani et al. | 174/264 |
| 6,017,812 A | 1/2000 | Yonezawa et al. | 438/613 |
| 6,018,196 A | 1/2000 | Noddin | 257/777 |
| 6,020,561 A | 2/2000 | Ishida et al. | 174/261 |
| 6,025,650 A | 2/2000 | Tsuji et al. | 257/786 |
| 6,037,665 A | 3/2000 | Miyazaki | 257/773 |
| 6,046,909 A | 4/2000 | Joy | 361/748 |
| 6,072,233 A | 6/2000 | Corisis et al. | 257/686 |
| 6,084,297 A | 7/2000 | Brooks et al. | 257/698 |
| 6,084,781 A | 7/2000 | Klein | 361/771 |
| 6,088,236 A | 7/2000 | Tomura et al. | 361/783 |
| 6,103,552 A | 8/2000 | Lin | 438/113 |
| 6,103,992 A | 8/2000 | Noddin | 219/121.71 |
| 6,127,204 A | 10/2000 | Isaacs et al. | 438/106 |
| 6,159,770 A | 12/2000 | Tetaka et al. | 438/112 |
| 6,180,881 B1 | 1/2001 | Isaak | 174/52.4 |
| 6,188,127 B1 | 2/2001 | Senba et al. | 257/686 |
| 6,218,728 B1 | 4/2001 | Kimura | 257/693 |
| 6,281,568 B1 | 8/2001 | Glenn et al. | 257/684 |
| 6,303,997 B1 | 10/2001 | Lee | 257/778 |
| 6,483,718 B1 | 11/2002 | Hashimoto | 361/803 |
| 6,504,241 B1 | 1/2003 | Yanagida | 257/686 |
| 6,608,371 B1 | 8/2003 | Kurashima et al. | 257/686 |
| 6,897,567 B1* | 5/2005 | Horie | 257/779 |
| 2004/0155338 A1* | 8/2004 | Shim et al. | 257/738 |
| 2006/0113682 A1* | 6/2006 | Farnworth et al. | 257/782 |

FOREIGN PATENT DOCUMENTS

| | | |
|---|---|---|
| WO | WO 97/38563 | 10/1997 |

| WO | WO 99/57762 | 11/1999 |

OTHER PUBLICATIONS

Elenius, "Choosing a Flip Chip Bumping Supplier—Technology an IC Package contractor should look for," Advanced Packing, Mar./Apr. 1998, pp. 70-73.

Erickson, "Wafer Bumping: The Missing Link for DCA," Electronic Packaging & Production, Jul. 1998, pp. 43-46.

Kuchenmeister et al., "Film Chip Interconnection Systems Prepared By Wet Chemical Metallization," IEEE publication 0-7803-4526-6/98, Jun. 1998, 5 pages.

Ghaffarian, "Long Time BGA Assembly Reliability," Advancing Microelectronics, vol. 25, No. 6, Sep./Oct. 1998, pp. 20-23.

U.S. Appl. No. 09/465,024, filed Dec. 16, 1999, entitled "Bumpless Flip Chip Assembly With Solder Via".

U.S. Appl. No. 09/464,562, filed Dec. 16, 1999, entitled "Bumpless Flip Chip Assembly With Strips And Via-Fill".

U.S. Appl. No. 09/464,561, filed Dec. 16, 1999, entitled "Bumpless Flip Chip Assembly With Strips-In-Via And Plating".

U.S. Appl. No. 09/120,408, filed Jul. 22, 1998, entitled "Flip Chip Assembly With Via Interconnection".

U.S. Appl. No. 09/643,212, filed Aug. 22, 2000, entitled "Semiconductor Chip Assembly With Simultaneously Electroplated Contact Terminal and Connection Joint".

U.S. Appl. No. 09/643,214, filed Aug. 22, 2000, entitled "Semiconductor Chip Assembly With Simultaneously Electrolessly Plated Contact Terminal and Connection Joint".

U.S. Appl. No. 09/643,213, filed Aug. 22, 2000, entitled "Method of Making A Support Circuit For A Semiconductor Chip Assembly".

U.S. Appl. No. 09/643,445, filed Aug. 22, 2000, entitled "Method of Making A Semiconductor Chip Assembly".

U.S. Appl. No. 09/665,928, filed Sep. 20, 2000, entitled "Semiconductor Chip Assembly With Ball Bond Connection Joint".

U.S. Appl. No. 09/665,931, filed Sep. 20, 2000, entitled "Method of Making A Support Circuit With A Tapered Through-Hole For A Semiconductor Chip Assembly".

U.S. Appl. No. 09/677,207, filed Oct. 2, 2000, entitled "Method of Making A Semiconductor Chip Assembly With A Conductive Trace Subtractively Formed Before And After Chip Attachment".

U.S. Appl. No. 09/865,367, filed May 24, 2001, entitled "Semiconductor Chip Assembly With Simultaneously Electroplated Contact Terminal and Connection Joint".

U.S. Appl. No. 09/864,555, filed May 24, 2001, entitled "Semiconductor Chip Assembly with Simultaneously Electrolessly Plated Contact Terminal and Connection Joint".

U.S. Appl. No. 09/864,773, filed May 24, 2001, entitled "Semiconductor Chip Assembly With Ball Bond Connection Joint".

U.S. Appl. No. 10/714,794, filed Nov. 17, 2003, entitled "Semiconductor Chip Assembly With Embedded Metal Pillar".

* cited by examiner

SEMICONDUCTOR CHIP ASSEMBLY WITH CARVED BUMPED TERMINAL

CROSS-REFERENCE TO RELATED APPLICATIONS

This application is a continuation-in-part of U.S. application Ser. No. 10/922,280, filed Aug. 19, 2004, now U.S. Pat. No. 7,009,297, which is a continuation-in-part of U.S. application Ser. No. 10/307,218, filed Nov. 29, 2002, now U.S. Pat. No. 6,809,414, which is a divisional of U.S. application Ser. No. 09/997,973, filed Nov. 29, 2001, now U.S. Pat. No. 6,492,252, which is a continuation-in-part of U.S. application Ser. No. 09/917,339, filed Jul. 27, 2001, now U.S. Pat. No. 6,537,851, which is a continuation-in-part of U.S. application Ser. No. 09/878,626, filed Jun. 11, 2001, now U.S. Pat. No. 6,653,217, which is a continuation-in-part of U.S. application Ser. No. 09/687,619, filed Oct. 13, 2000, now U.S. Pat. No. 6,440,835 each of which is incorporated by reference.

This application also claims the benefit of U.S. Provisional Application Ser. No. 60/523,566, filed Nov. 20, 2003, which is incorporated by reference.

U.S. application Ser. No. 10/922,280, filed Aug. 19, 2004 also claims the benefit of U.S. Provisional Application Ser. No. 60/497,672, filed Aug. 25, 2003, and U.S. Provisional Application Ser. No. 60/497,425 filed Aug. 22, 2003, each of which is incorporated by reference.

BACKGROUND OF THE INVENTION

1. Field of the Invention

The present invention relates to a semiconductor chip assembly, and more particularly to a semiconductor chip assembly with a bumped terminal and its method of manufacture.

2. Description of the Related Art

Semiconductor chips have input/output pads that must be connected to external circuitry in order to function as part of an electronic system. The connection media is typically an array of metallic leads (e.g., a lead frame) or a support circuit (e.g., a substrate), although the connection can be made directly to a circuit panel (e.g., a mother board). Several connection techniques are widely used. These include wire bonding, tape automated bonding (TAB) and flip-chip bonding.

Wire bonding is by far the most common and economical connection technique. In this approach, wires are bonded, one at a time, from the chip to external circuitry by thermocompression, thermosonic or ultrasonic processes. In thermocompression bonding, fine gold wire is fed from a spool through a clamp and a capillary. A thermal source is swept past an end of the wire to form a wire ball that protrudes from the capillary. The chip or capillary is then heated to about 200 to 300° C., the capillary is brought down over an aluminum pad, the capillary exerts pressure on the wire ball, and the wire ball forms a ball bond on the pad. The capillary is then raised and moved to a terminal on the support circuit, the capillary is brought down again, and the combination of force and temperature forms a wedge bond between the wire and the terminal. Thus, the connection between the pad and the terminal includes the ball bond (which only contacts the pad), the wedge bond (which only contacts the terminal) and the wire between the bonds. After raising the capillary again, the wire is ripped from the wedge bond, the thermal source is swept past the wire to form a new wire ball, and the process is repeated for other pads on the chip. Thermosonic bonding is similar to thermocompression bonding but adds ultrasonic vibration as the ball and wedge bonds are formed so that less heat is necessary. Ultrasonic bonding uses aluminum wire to form wedge bonds without applying heat. There are many variations on these basic methods.

TAB involves bonding gold-bumped pads on the chip to external circuitry on a polymer tape using thermocompression bonding. TAB requires mechanical force such as pressure or a burst of ultrasonic vibration and elevated temperature to accomplish metallurgical welding between the wires or bumps and the designated surface.

Flip-chip bonding involves providing pre-formed solder bumps on the pads, flipping the chip so that the pads face down and are aligned with and contact matching bond sites, and melting the solder bumps to wet the pads and the bond sites. After the solder reflows it is cooled down and solidified to form solder joints between the pads and the bond sites. Organic conductive adhesive bumps with conductive fillers in polymer binders have been used in place of solder bumps, but they do not normally form a metallurgical interface in the classical sense. A major advantage of flip-chip bonding over wiring bonding and TAB is that it provides shorter connection paths between the chip and the external circuitry, and therefore has better electrical characteristics such as less inductive noise, cross-talk, propagation delay and waveform distortion. In addition, flip-chip bonding requires minimal mounting area and weight which results in overall cost saving since no extra packaging and less circuit board space are used.

While flip-chip technology has tremendous advantages over wire bonding and TAB, its cost and technical limitations are significant. For instance, the cost of forming bumps on the pads is significant. In addition, an adhesive is normally underfilled between the chip and the support circuit to reduce stress on the solder joints due to thermal mismatch between the chip and the support circuit, and the underfilling process increases both manufacturing complexity and cost.

Other techniques besides wire bonding, TAB and flip-chip technologies have been developed to provide connection joints that electrically connect pads on chips to external conductive traces. These connection joints can be formed by electroplated metal, electrolessly plated metal, solder or conductive adhesive.

Electroplating provides deposition of an adherent metallic coating onto a conductive object placed into an electrolytic bath composed of a solution of the salt of the metal to be plated. Using the terminal as an anode (possibly of the same metal as the one used for plating), a DC current is passed through the solution affecting transfer of metal ions onto the cathode surface. As a result, the metal continually electroplates on the cathode surface. Electroplating using AC current has also been developed.

Electroplating is relatively fast and easy to control. However, a plating bus is needed to supply current where electroplating is desired. The plating bus creates design constraints and must be removed after the electroplating occurs. Non-uniform plating may arise at the bottom of relatively deep through-holes due to poor current density distribution. Furthermore, the electrolytic bath is relatively expensive.

Electroless plating provides metal deposition by an exchange reaction between metal complexes in a solution and a catalytic metal that activates or initiates the reaction. As a result, the electroless metal continually plates (i.e., deposits or grows) on the catalytic metal. Advantageously, the reaction does not require externally applied electric current. Therefore, electroless plating can proceed without a plating bus. However, electroless plating is relatively slow. Furthermore, the electroless bath is relatively expensive.

Solder joints are relatively inexpensive, but exhibit increased electrical resistance as well as cracks and voids over time due to fatigue from thermo-mechanical stresses. Further, the solder is typically a tin-lead alloy and lead-based materials are becoming far less popular due to environmental concerns over disposing of toxic materials and leaching of toxic materials into ground water supplies.

Conductive adhesive joints with conductive fillers in polymer binders are relatively inexpensive, but do not normally form a metallurgical interface in the classical sense. Moisture penetration through the polymer binder may induce corrosion or oxidation of the conductive filler particles resulting in an unstable electrical connection. Furthermore, the polymer binder and the conductive filler may degrade leading to an unstable electrical connection. Thus, the conductive adhesive may have adequate mechanical strength but poor electrical characteristics.

Accordingly, each of these connection joint techniques has various advantages and disadvantages. The optimal approach for a given application depends on design, reliability and cost considerations.

The semiconductor chip assembly is subsequently connected to another circuit such as a printed circuit board (PCB) or mother board during next level assembly. Different semiconductor assemblies are connected to the next level assembly in different ways. For instance, ball grid array (BGA) packages contain an array of solder balls, and land grid array (LGA) packages contain an array of metal pads that receive corresponding solder traces on the PCB.

Thermo-mechanical wear or creep of the solder joints that connect the semiconductor chip assembly to the next level assembly is a major cause of failure in most board assemblies. This is because non-uniform thermal expansion and/or contraction of different materials causes mechanical stress on the solder joints.

Thermal mismatch induced solder joint stress can be reduced by using materials having a similar coefficient of thermal expansion (CTE). However, due to large transient temperature differences between the chip and other materials during power-up of the system, the induced solder joint stress makes the assembly unreliable even when the chip and the other materials have closely matched thermal expansion coefficients.

Thermal mismatch induced solder joint stress can also be reduced by proper design of the support circuit. For instance, BGA and LGA packages have been designed with pillar post type contact terminals that extend above the package and act as a stand-off or spacer between the package and the PCB in order to absorb thermal stress and reduce solder joint fatigue. The higher the aspect ratio of the pillar, the more easily the pillar can flex to follow expansion of the two ends and reduce shear stress.

Conventional approaches to forming the pillar either on a wafer or a separate support circuit include a bonded interconnect process (BIP) and plating using photoresist.

BIP forms a gold ball on a pad of the chip and a gold pin extending upwardly from the gold ball using a thermocompression wire bonder. Thereafter, the gold pin is brought in contact with a molten solder bump on a support circuit, and the solder is reflowed and cooled to form a solder joint around the gold pin. A drawback to this approach is that when the wire bonder forms the gold ball on the pad it applies substantial pressure to the pad which might destroy active circuitry beneath the pad. In addition, gold from the pin can dissolve into the solder to form a gold-tin intermetallic compound which mechanically weakens the pin and therefore reduces reliability.

U.S. Pat. No. 5,722,162 discloses fabricating a pillar by electroplating the pillar on a selected portion of an underlying metal exposed by an opening in photoresist and then stripping the photoresist. Although it is convenient to use photoresist to define the location of the pillar, electroplating the pillar in an opening in the photoresist has certain drawbacks. First, the photoresist is selectively exposed to light that initiates a reaction in regions of the photoresist that correspond to the desired pattern. Since photoresist is not fully transparent and tends to absorb the light, the thicker the photoresist, the poorer the penetration efficiency of the light. As a result, the lower portion of the photoresist might not receive adequate light to initiate or complete the intended photo-reaction. Consequently, the bottom portion of the opening in the photoresist might be too narrow, causing a pillar formed in the narrowed opening to have a diameter that decreases with decreasing height. Such a pillar has a high risk of fracturing at its lower portion in response to thermally induced stress. Furthermore, photoresist residue on the underlying metal might cause the pillar to have poor quality or even prevent the pillar from being formed. Second, if the photoresist is relatively thick (such as 100 microns or more), the photoresist may need to be applied with multiple coatings and receive multiple light exposures and bakes, which increases cost and reduces yield. Third, if the photoresist is relatively thick, the electroplated pillar may be non-uniform due to poor current density distribution in the relatively deep opening. As a result, the pillar may have a jagged or pointed top surface instead of a flat top surface that is better suited for providing a contact terminal for the next level assembly.

In view of the various development stages and limitations in currently available semiconductor chip assemblies, there is a need for a semiconductor chip assembly that is cost-effective, reliable, manufacturable, versatile, provides a vertical conductor with excellent mechanical and electrical properties, and makes advantageous use the particular connection joint technique best suited for a given application.

SUMMARY OF THE INVENTION

An object of the present invention is to provide a semiconductor chip assembly with a chip and a conductive trace that provides a low cost, high performance, high reliability package.

Another object of the present invention is to provide a convenient, cost-effective method for manufacturing a semiconductor chip assembly.

Generally speaking, the present invention provides a semiconductor chip assembly that includes a semiconductor chip that includes a conductive pad, a conductive trace that includes a routing line, a bumped terminal and a metal filler, a connection joint that electrically connects the routing line and the pad, and an encapsulant. The routing line is contiguous with and integral with the bumped terminal and extends laterally beyond the bumped terminal and the metal filler, and the metal filler contacts the bumped terminal in a cavity that extends through the bumped terminal.

Generally speaking, the present invention also provides a method of making a semiconductor chip assembly that includes providing a metal base, a routing line, a bumped terminal and a metal filler, then mechanically attaching a semiconductor chip to the metal base, the routing line, the bumped terminal and the metal filler, then forming an encapsulant, then etching the metal base to expose the bumped terminal, and then grinding the bumped terminal to expose the metal filler.

In accordance with an aspect of the invention, a semiconductor chip assembly includes a semiconductor chip that includes first and second opposing surfaces, wherein the first surface of the chip includes a conductive pad, a conductive trace that includes a routing line, a bumped terminal and a metal filler, wherein the bumped terminal includes a cavity, a connection joint that electrically connects the routing line and the pad, and an encapsulant that includes first and second opposing surfaces, wherein the first surface of encapsulant faces in a first direction, the second surface of the encapsulant faces in a second direction opposite the first direction, the chip is embedded in the encapsulant, the routing line extends laterally beyond the bumped terminal and the metal filler and extends vertically beyond the chip in the second direction, the bumped terminal is contiguous with and integral with the routing line and extends vertically beyond the routing line in the second direction, the cavity extends through the bumped terminal in the first and second directions, the metal filler contacts the bumped terminal in the cavity, extends vertically beyond the routing line, the bumped terminal and the cavity in the first direction and extends vertically beyond the routing line in the second direction, and the bumped terminal, the cavity and the metal filler are laterally aligned with one another at a surface that faces in the second direction and are not covered in the second direction by the encapsulant or any other insulative material of the assembly.

The chip can be the only chip embedded in the encapsulant, or alternatively, multiple chips can be embedded in the encapsulant. The first surface of the chip can face in the first direction and the second surface of the chip can face in the second direction, or alternatively, the first surface of the chip can face in the second direction and the second surface of the chip can face in the first direction. The chip can extend vertically beyond the routing line, the bumped terminal and the metal filler in the first direction. The chip can also extend vertically beyond the conductive trace in the first direction. In addition, any chip embedded in the encapsulant can extend vertically beyond the conductive trace in the first direction.

The routing line can extend laterally beyond the bumped terminal and the metal filler towards the chip. The routing line can be disposed vertically beyond the chip in the second direction. The routing line can extend within and outside the periphery of the chip, or alternatively, be disposed outside the periphery of the chip. The routing line can be essentially flat and parallel to the first and second surfaces of the chip. Furthermore, the routing line can be in an electrically conductive path between the bumped terminal and any chip embedded in the encapsulant and between the metal filler and any chip embedded in the encapsulant. That is, any chip embedded in the encapsulant can be electrically connected to the bumped terminal and the metal filler by an electrically conductive path that includes the routing line.

The bumped terminal can be disposed vertically beyond the routing line in the second direction. The bumped terminal can be disposed within or outside the periphery of the chip. The bumped terminal can have a curved shape and a uniform thickness.

The routing line and the bumped terminal can include first and second metal layers, wherein the first metal layer is adjacent to the cavity and contacts the metal filler and extends vertically beyond the second metal layer in the first direction, the second metal layer is spaced from the cavity and is laterally aligned with the first metal layer, the cavity and the metal filler at a surface that faces in the second direction, and the first and second metal layers are different metals. Furthermore, the first and second metal layers can contact one another, the first metal layer can be thicker than the second metal layer, and the first metal layer and the metal filler can have a same or different composition. For instance, the first metal layer can be copper, the second metal layer can be nickel, and the metal filler can be copper or solder. Moreover, the routing line and the bumped terminal can have a same composition and thickness.

The cavity can extend across a majority of a height and diameter of the bumped terminal and the metal filler. The cavity can extend vertically beyond the routing line in the second direction and can have a diameter that decreases as the cavity extends in the second direction. The cavity can include first and second opposing ends that are adjacent to the bumped terminal and tapered sidewalls therebetween, wherein the first end of the cavity faces in the first direction, the second end of the cavity faces in the second direction, and the tapered sidewalls are adjacent to the first and second ends and slant inwardly towards the second end. Furthermore, the second end of the cavity can be disposed within a surface area of the first end of the cavity, and a surface area of the first end of the cavity can be at least 20 percent larger than a surface area of the second end of the cavity. Similarly, the second end of the cavity can be disposed within a surface area of the bumped terminal, and a surface area of the bumped terminal can be at least 20 percent larger than a surface area of the second end of the cavity. Similarly, the second end of the cavity can be disposed within a surface area of the metal filler, and a surface area of the metal filler can be at least 20 percent larger than a surface area of the second end of the cavity.

The metal filler can overlap or not overlap the routing line in the first direction, cover or not cover the bumped terminal in the first direction, cover or not cover the cavity in the first direction, fill or not fill the cavity, and have a uniform or non-uniform thickness. The metal filler can be disposed within or outside the periphery of the chip. The metal filler can include first and second opposing surfaces, wherein the first surface of the metal filler faces in the first direction, and the second surface of the metal filler faces in the second direction. The first surface of the metal filler can extend into, extend into and outside, or not extend into the cavity.

The connection joint can extend between and electrically connect the routing line and the pad. The connection joint can be electroplated metal, electrolessly plated metal, solder, conductive adhesive or a wire bond.

The encapsulant can contact the chip and the conductive trace. The encapsulant can cover the chip and the conductive trace in the first direction. The encapsulant extend into or not extend into the cavity, and the encapsulant and the metal filler can fill the cavity.

The assembly can include an insulative base that contacts the routing line and the bumped terminal, is spaced from and overlapped by the chip and extends vertically beyond the chip, the routing line and the encapsulant in the second direction. The insulative base can be spaced from the metal filler and laterally aligned with the bumped terminal, the cavity and the metal filler at a surface that faces in the second direction.

The assembly can include an insulative adhesive that contacts the chip and the encapsulant and extends vertically beyond the chip in the second direction. The adhesive can extend into or not extend into the cavity, and the adhesive and the metal filler can fill the cavity.

The assembly can include a plated terminal that contacts and is electrically connected to the bumped terminal and the metal filler, is spaced from the routing line and the connection joint and extends vertically beyond the chip, the routing line, the bumped terminal, the metal filler, the connection joint, the encapsulant and the insulative base in the second direction. The plated terminal can be exposed and the routing line, the bumped terminal and the metal filler can be unexposed.

The assembly can be a first-level package that is a single-chip or multi-chip package.

In accordance with another aspect of the invention, a method of making a semiconductor chip assembly includes providing a metal base, a routing line, a bumped terminal and a metal filler, wherein the routing line and the bumped terminal are contiguous with one another and contact the metal base, the routing line is disposed outside a recess in the metal base, the bumped terminal extends into the recess and includes a cavity that extends into and faces away from the recess, and the metal filler contacts the bumped terminal in the cavity and extends into the recess, then mechanically attaching a semiconductor chip to the metal base, the routing line, the bumped terminal and the metal filler, wherein the chip includes first and second opposing surfaces, and the first surface of the chip includes a conductive pad, forming a connection joint that electrically connects the routing line and the pad, forming an encapsulant after attaching the chip to the metal base, the routing line, the bumped terminal and the metal filler, wherein the encapsulant includes a first surface that faces in a first direction and a second surface that faces in a second direction opposite the first direction, the encapsulant covers the chip and extends vertically beyond the chip, the metal base, the routing line, the bumped terminal and the metal filler in the first direction, the chip is embedded in the encapsulant, the metal base extends vertically beyond the chip, the routing line, the bumped terminal and the metal filler in the second direction, the bumped terminal extends vertically beyond the routing line and the metal filler in the second direction, and the cavity extends through the bumped terminal in the first direction but not the second direction and is covered by the metal base and the bumped terminal in the second direction, etching the metal base after forming the encapsulant, thereby exposing the routing line and the bumped terminal without exposing the metal filler, and then grinding the bumped terminal, thereby exposing the metal filler in the cavity such that the cavity extends through the bumped terminal in the second direction.

The method can include forming the routing line, the bumped terminal and the metal filler by selectively depositing the routing line and the bumped terminal on the metal base, and then depositing the metal filler on the bumped terminal.

The method can include providing the metal base, then forming the recess in the metal base, then forming the routing line and the bumped terminal on the metal base, wherein the routing line and the bumped terminal are contiguous with one another and contact the metal base, the routing line is disposed outside the recess, and the bumped terminal extends into the recess and includes the cavity that extends into and faces away from the recess, and then forming the metal filler on the bumped terminal, wherein the metal filler contacts the bumped terminal in the cavity, is spaced from the metal base and extends into the recess.

The method can include forming the routing line and the bumped terminal by forming a plating mask on the metal base, wherein the plating mask includes an opening that exposes a portion of the metal base, and then electroplating the routing line and the bumped terminal on the exposed portion of the metal base through the opening in the plating mask.

The method can include, in sequence, forming an etch mask on the metal base, etching the metal base using the etch mask to selectively expose the metal base, thereby forming the recess in the metal base, removing the etch mask, forming a plating mask on the metal base, electroplating the routing line and the bumped terminal on the metal base using the plating mask to selectively expose the metal base, removing the plating mask, and depositing the metal filler on the bumped terminal. In this manner, the routing line and the bumped terminal can be simultaneously electroplated on the metal base, and then the metal filler can be deposited on the bumped terminal.

The method can include forming the metal filler by forming a plating mask on the metal base, wherein the plating mask includes an opening that exposes the bumped terminal, electroplating the metal filler on the bumped terminal through the opening in the plating mask, and then removing the plating mask. Alternatively, the method can include forming the metal filler by depositing solder paste on the bumped terminal and then hardening the solder paste. In this manner, the metal filler can be electroplated metal or solder.

The method can include attaching the chip to the metal base, the routing line, the bumped terminal and the metal filler by disposing an insulative adhesive between the chip and the metal base and then hardening the adhesive.

The method can include forming the encapsulant by transfer molding or curing.

The method can include forming the connection joint by plating the connection joint between the routing line and the pad. For instance, the connection joint can be electroplated or electrolessly plated between the routing line and the pad. Alternatively, the method can include forming the connection joint by depositing a non-solidified material between the routing line and the pad and then hardening the non-solidified material. For instance, solder paste can be deposited between the routing line and the pad and then hardened by reflowing, or conductive adhesive can be deposited between the routing line and the pad and then hardened by curing. Alternatively, the method can include forming the connection joint by wire bonding. For instance, the wire bond can extend vertically beyond the chip and the routing line in the first direction when the first surface of the chip faces in the first direction, or alternatively, the wire bond can extend vertically beyond the chip and the routing line in the second direction when the first surface of the chip faces in the second direction.

The method can include etching the metal base, thereby eliminating contact area between the metal base and the routing line and between the metal base and the bumped terminal. Etching the metal base can remove all of the metal base within the periphery of the pad, can remove all of the metal base within the periphery of the chip, and can remove all of the metal base.

The method can include etching the metal base, thereby electrically isolating the routing line from other routing lines formed on the metal base and electrically isolating the pad from other pads of the chip. For instance, the method can include forming the connection joint by wire bonding, then forming the encapsulant, and then etching the metal base, thereby electrically isolating the routing line from the other routing lines and the pad from other pads. Alternatively, the method can include forming the encapsulant, then forming the connection joint by electroplating using the metal base as a plating bus, and then etching the metal base, thereby electrically isolating the routing line from the other routing lines and the pad from the other pads.

The method can include attaching the chip to the metal base, the routing line, the bumped terminal and the metal filler and then forming the connection joint, or alternatively, simultaneously attaching the chip to the metal base, the routing line, the bumped terminal and the metal filler and forming the connection joint.

The method can include forming the connection joint and then forming the encapsulant, or alternatively, forming the encapsulant and then forming the connection joint.

The method can include forming the connection joint and then etching the metal base, or alternatively, etching the metal base and then forming the connection joint.

The method can include forming the encapsulant, then forming the connection joint and then etching the metal base, or alternatively, forming the encapsulant, then etching the metal base and then forming the connection joint.

The method can include forming the insulative base by depositing the insulative base such that the insulative base covers and extends vertically beyond the chip, the routing line, the bumped terminal, the metal filler and the encapsulant in the second direction and the bumped terminal and the metal filler are not exposed and then grinding the insulative base such that the bumped terminal is exposed, or alternatively, depositing the insulative base such that the insulative base does not cover the bumped terminal in the second direction and the bumped terminal is exposed.

The method can include grinding the insulative base without grinding the bumped terminal and without grinding the metal filler, then grinding the insulative base and the bumped terminal without grinding the metal filler, and then grinding the insulative base, the bumped terminal and the metal filler. Grinding the insulative base and the bumped terminal can laterally align the insulative base and the bumped terminal at a surface that faces in the second direction. Likewise, grinding the insulative base, the bumped terminal and the metal filler can laterally align the insulative base, the bumped terminal, the cavity and the metal filler at a surface that faces in the second direction. The method can also include plasma etching the insulative base after grinding the insulative base, the bumped terminal and the metal filler such that the insulative base is recessed relative to the bumped terminal and the metal filler in the second direction, and thus the bumped terminal and the metal filler extend vertically beyond the insulative base in the second direction.

The method can include electrolessly plating the plated terminal on the bumped terminal and the metal filler after grinding the insulative base, the bumped terminal and the metal filler.

An advantage of the present invention is that the semiconductor chip assembly can be manufactured conveniently and cost effectively. Another advantage is that the encapsulant can be provided before the metal base is etched and removed, thereby enhancing the mechanical support and protection for the routing line, the bumped terminal and the metal filler. Another advantage is that the metal filler can contact the bumped terminal in the cavity, thereby enhancing reliability if the bumped terminal is damaged. Another advantage is that the connection joint can be made from a wide variety of materials and processes, thereby making advantageous use of mature connection joint technologies in a unique and improved manufacturing approach. Another advantage is that the assembly need not include wire bonds or TAB leads, although the process is flexible enough to accommodate these techniques if desired. Another advantage is that the assembly can be manufactured using low temperature processes which reduces stress and improves reliability. A further advantage is that the assembly can be manufactured using well-controlled processes which can be easily implemented by circuit board, lead frame and tape manufacturers. Still another advantage is that the assembly can be manufactured using materials that are compatible with copper chip and lead-free environmental requirements.

These and other objects, features and advantages of the invention will be further described and more readily apparent from a review of the detailed description of the preferred embodiments which follows.

BRIEF DESCRIPTION OF THE DRAWINGS

The following detailed description of the preferred embodiments can best be understood when read in conjunction with the following drawings, in which:

FIGS. 1A–23A are cross-sectional views showing a method of making a semiconductor chip assembly in accordance with a first embodiment of the present invention;

FIGS. 1B–23B are top plan views corresponding to FIGS. 1A–23A, respectively;

FIGS. 1C–23C are bottom plan views corresponding to FIGS. 1A–23A, respectively;

DETAILED DESCRIPTION OF THE PREFERRED EMBODIMENTS

FIGS. 1A–23A, 1B–23B and 1C–23C are cross-sectional, top and bottom views, respectively, of a method of making a semiconductor chip assembly in accordance with a first embodiment of the present invention.

Figure 1A:
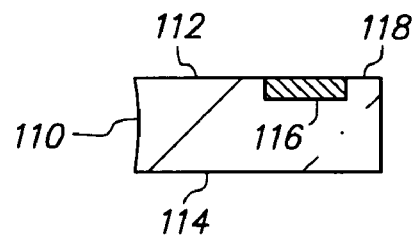
Figure 1B:
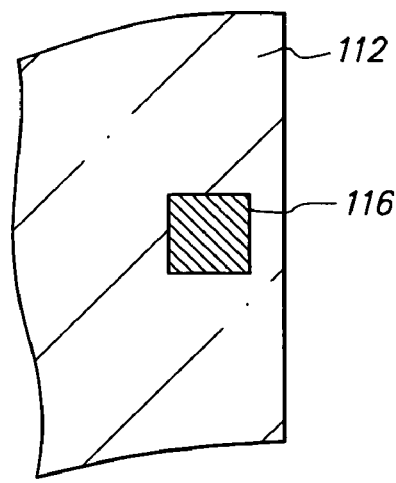
Figure 1C:
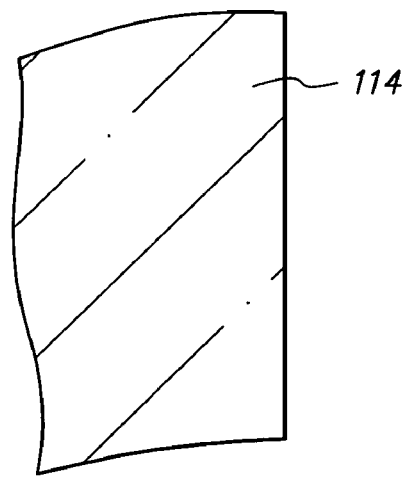

FIGS. 1A, 1B and 1C are cross-sectional, top and bottom views, respectively, of semiconductor chip 110 which is an integrated circuit in which various transistors, circuits, interconnect lines and the like are formed (not shown). Chip 110 includes opposing major surfaces 112 and 114 and has a thickness (between surfaces 112 and 114) of 150 microns. Surface 112 is the active surface and includes conductive pad 116 and passivation layer 118.

Pad 116 is substantially aligned with passivation layer 118 so that surface 112 is essentially flat. Alternatively, if desired, pad 116 can extend above or be recessed below passivation layer 118. Pad 116 provides a bonding site to electrically couple chip 110 with external circuitry. Thus, pad 116 can be an input/output pad or a power/ground pad. Pad 116 has a length and width of 100 microns.

Pad 116 has an aluminum base that is cleaned by dipping chip 110 in a solution containing 0.05 M phosphoric acid at room temperature for 1 minute and then rinsed in distilled water. Pad 116 can have the aluminum base serve as a surface layer, or alternatively, pad 116 can be treated to include a surface layer that covers the aluminum base, depending on the nature of a connection joint that shall subsequently contact the surface layer. In this embodiment, the connection joint is a gold wire bond. Therefore, pad 116 need not be treated to accommodate this connection joint. Alternatively, pad 116 can be treated by depositing several metal layers, such as chromium/copper/gold or titanium/nickel/gold on the aluminum base. The chromium or titanium layer provides a barrier for the aluminum base and an adhesive between the overlaying metal and the aluminum base. The metal layers, however, are typically selectively deposited by evaporation, electroplating or sputtering using a mask which is a relatively complicated process. Alternatively, pad 116 is treated by forming a nickel surface layer on the aluminum base. For instance, chip 110 is dipped in a zinc solution to deposit a zinc layer on the aluminum base. This step is commonly known as zincation. Preferably, the zinc solution contains about 150 grams/liter of NaOH, 25 grams/liter of ZnO, and 1 gram/liter of $NaNO_3$, as well as tartaric acid to reduce the rate at which the aluminum base dissolves. Thereafter, the nickel surface layer is electrolessly deposited on the zincated aluminum base. A suitable electroless nickel plating solution is Enthone Enplate NI-424 at 85° C.

Chip 110 includes many other pads on surface 112, and only pad 116 is shown for convenience of illustration. In addition, chip 110 has already been singulated from other chips that it was previously attached to on a wafer.

Figure 2A:
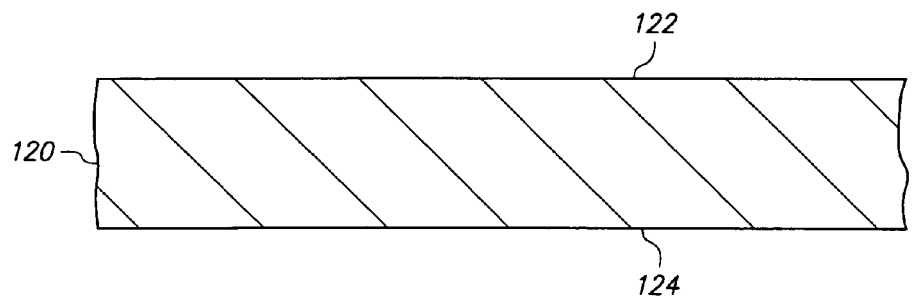
Figure 2B:
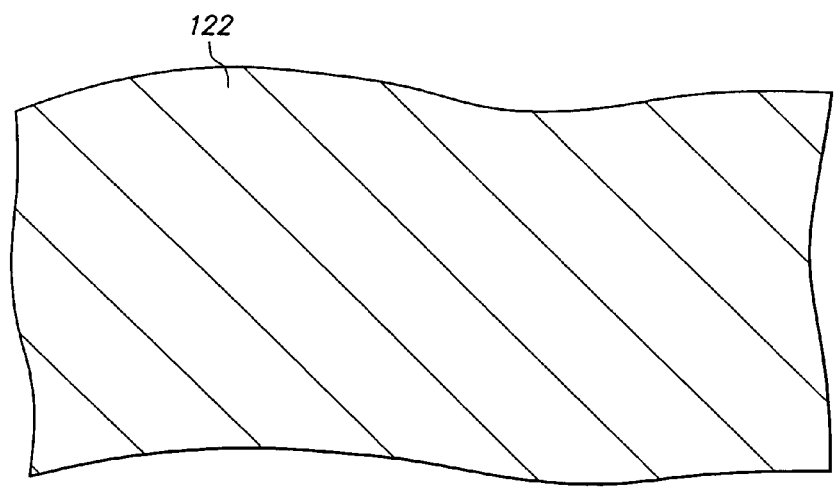
Figure 2C:
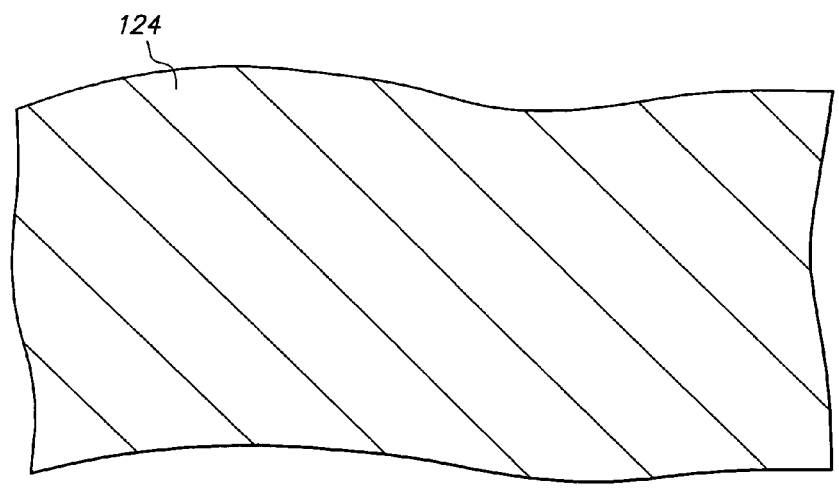

FIGS. 2A, 2B and 2C are cross-sectional, top and bottom views, respectively, of metal base 120 which includes opposing major surfaces 122 and 124. Metal base 120 is a copper plate with a thickness of 200 microns.

Figure 3A:
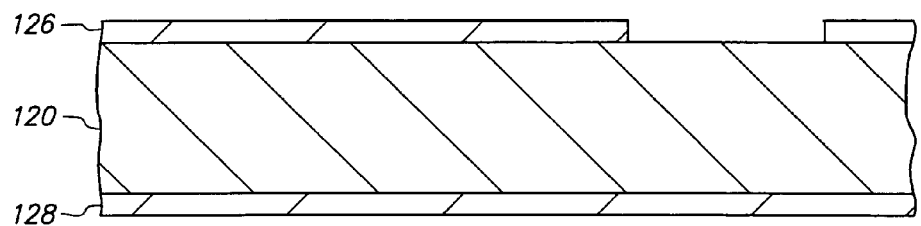
Figure 3B:
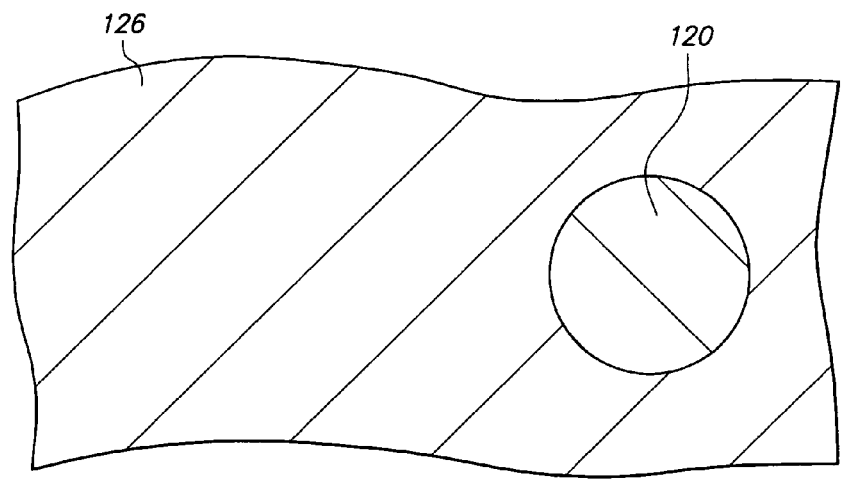
Figure 3C:
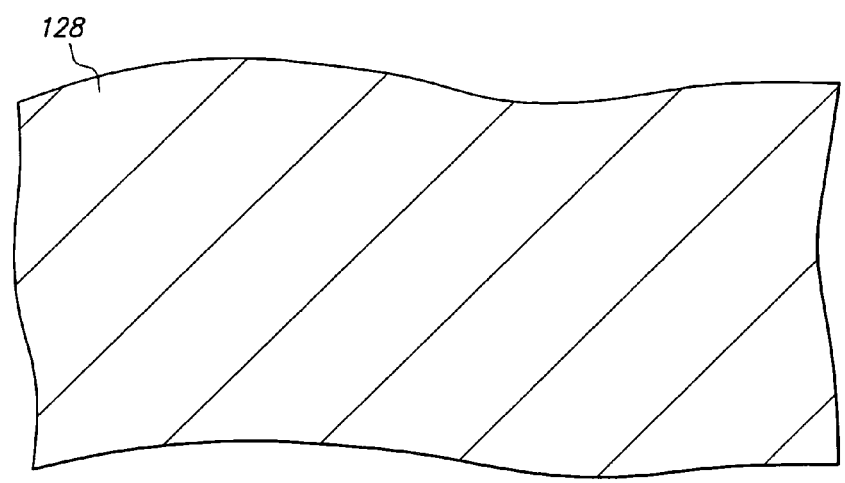

FIGS. 3A, 3B and 3C are cross-sectional, top and bottom views, respectively, of photoresist layers 126 and 128 formed on metal base 120. Photoresist layers 126 and 128 are deposited using a dry film lamination process in which hot rolls simultaneously press photoresist layers 126 and 128 onto surfaces 122 and 124, respectively. A reticle (not shown) is positioned proximate to photoresist layer 126. Thereafter, photoresist layer 126 is patterned by selectively applying light through the reticle, applying a developer solution to remove the photoresist portion rendered soluble by the light, and then hard baking, as is conventional. As a result, photoresist layer 126 contains an opening that selectively exposes surface 122 of metal base 120, and photoresist layer 128 remains unpatterned. Photoresist layers 126 and 128 have a thickness of 25 microns beyond surfaces 122 and 124, respectively.

Figure 4A:
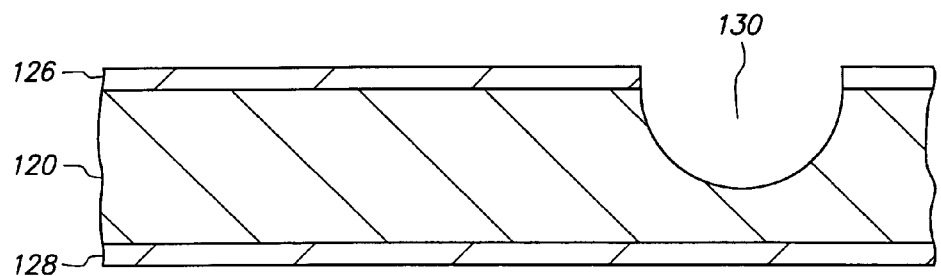
Figure 4B:
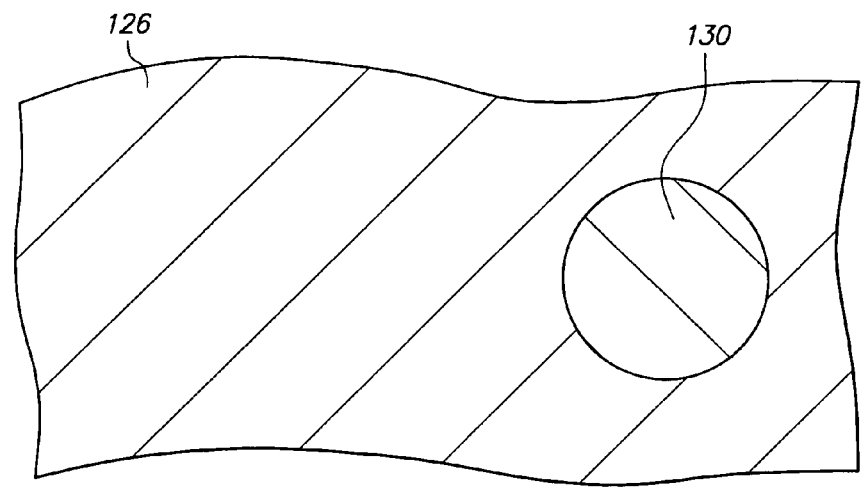
Figure 4C:
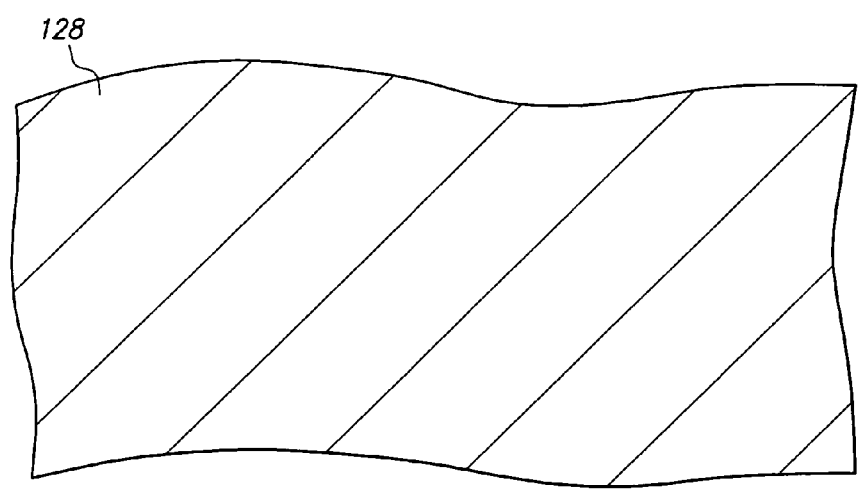

FIGS. 4A, 4B and 4C are cross-sectional, top and bottom views, respectively, of recess 130 formed in metal base 120.

Recess 130 is formed by applying a front-side wet chemical etch to the exposed portion of surface 122 using photoresist layer 126 as an etch mask. For instance, a top spray nozzle (not shown) can spray the wet chemical etch on metal base 120 while a bottom spray nozzle (not shown) is deactivated, or the structure can be dipped in the wet chemical etch since photoresist layer 128 provides back-side protection. The wet chemical etch is highly selective of copper and etches 140 microns into metal base 120. As a result, recess 130 extends from surface 122 into but not through metal base 120. Recess 130 has a diameter of 300 microns at surface 122, a depth of 140 microns relative to surface 122 and is spaced from surface 124 by 60 microns.

A suitable wet chemical etch can be provided by a solution containing alkaline ammonia. The optimal etch time for exposing metal base 120 to the wet chemical etch in order to form recess 130 with the desired dimensions can be established through trial and error.

Figure 5A:
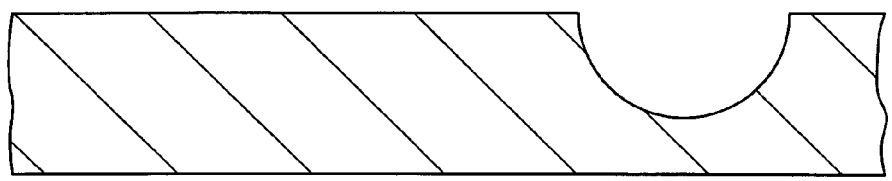
Figure 5B:
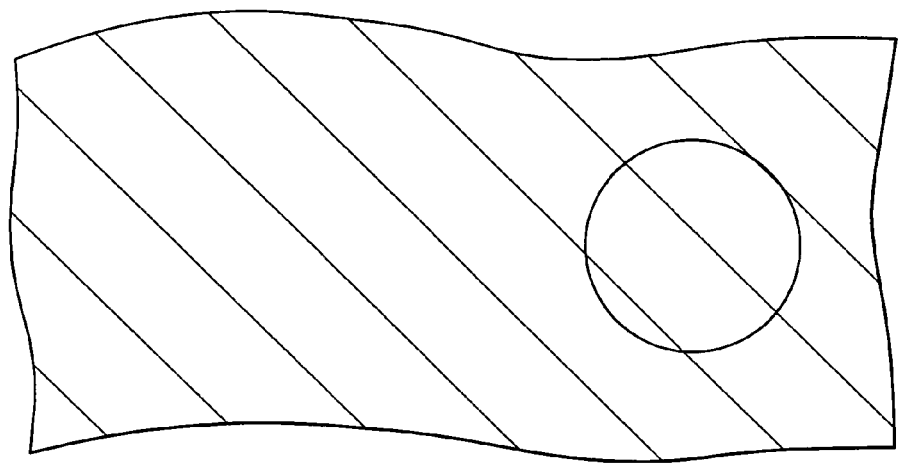
Figure 5C:
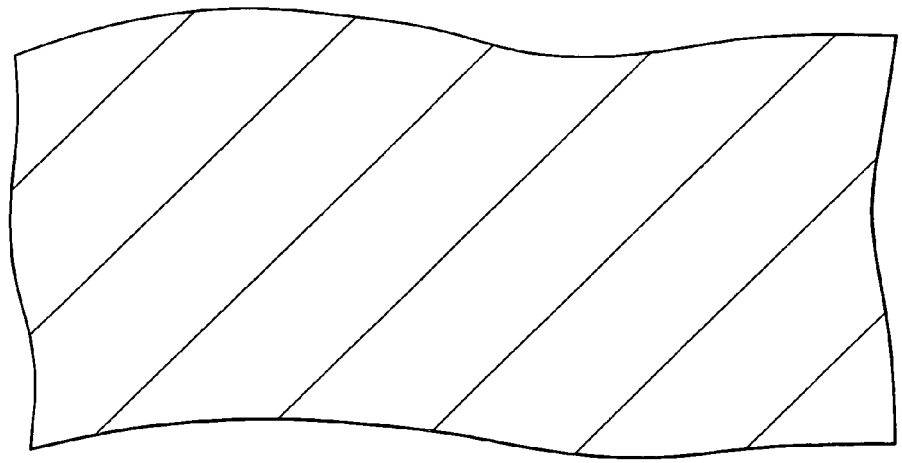

FIGS. 5A, 5B and 5C are cross-sectional, top and bottom views, respectively, of metal base 120 after photoresist layers 126 and 128 are stripped. Photoresist layers 126 and 128 are removed using a solvent, such as a mild alkaline solution with a pH of 9, that is highly selective of photoresist with respect to copper. Therefore, no appreciable amount of metal base 120 is removed.

Figure 6A:
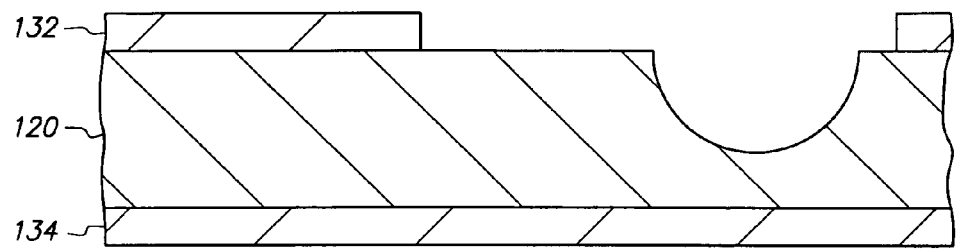
Figure 6B:
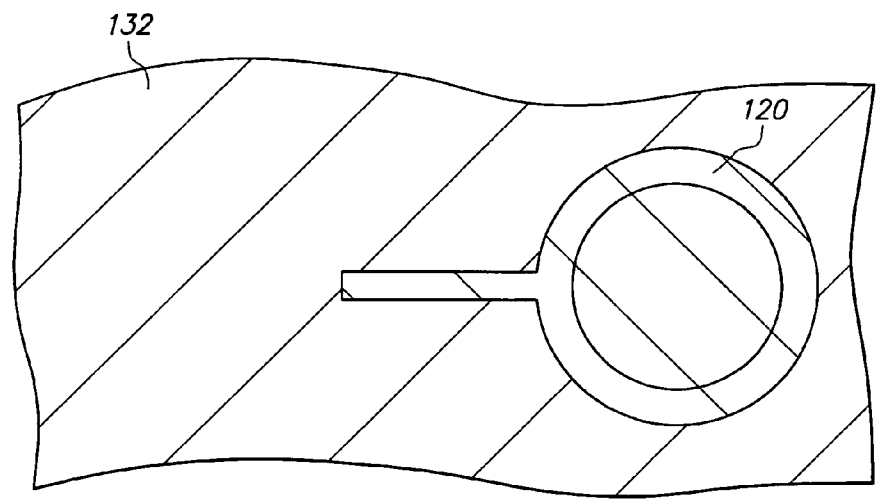
Figure 6C:
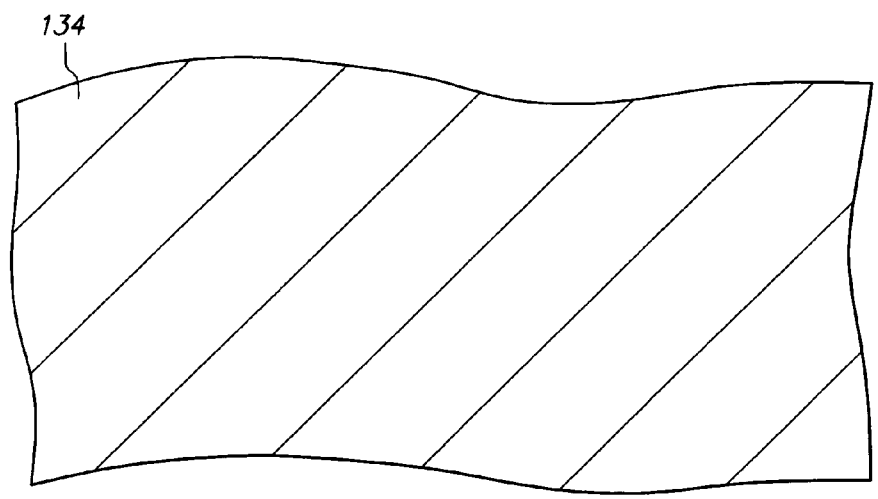

FIGS. 6A, 6B and 6C are cross-sectional, top and bottom views, respectively, of photoresist layers 132 and 134 formed on metal base 120. Photoresist layers 132 and 134 are deposited using a dry film lamination process in which hot rolls simultaneously press photoresist layers 132 and 134 onto surfaces 122 and 124, respectively. A reticle (not shown) is positioned proximate to photoresist layer 132. Thereafter, photoresist layer 132 is patterned by selectively applying light through the reticle, applying a developer solution to remove the photoresist portion rendered soluble by the light, and then hard baking, as is conventional. As a result, photoresist layer 132 contains an opening that selectively exposes surface 122 of metal base 120 and recess 130, and photoresist layer 134 remains unpatterned. Photoresist layers 132 and 134 have a thickness of 25 microns beyond surfaces 122 and 124, respectively.

Figure 7A:
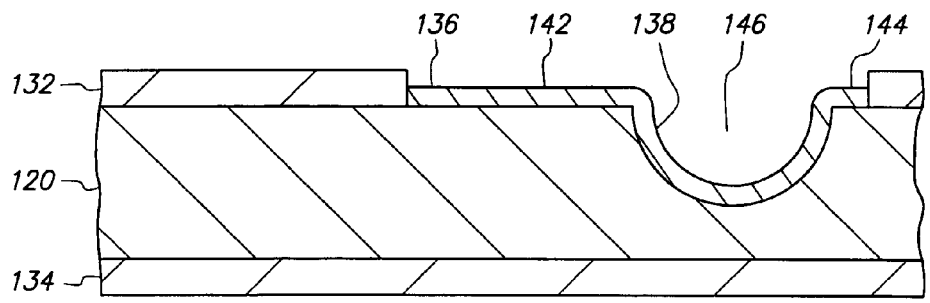
Figure 7B:
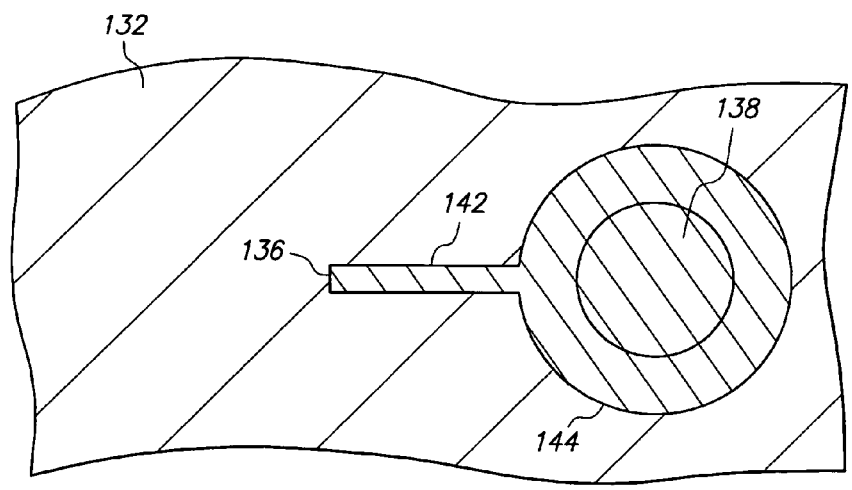
Figure 7C:
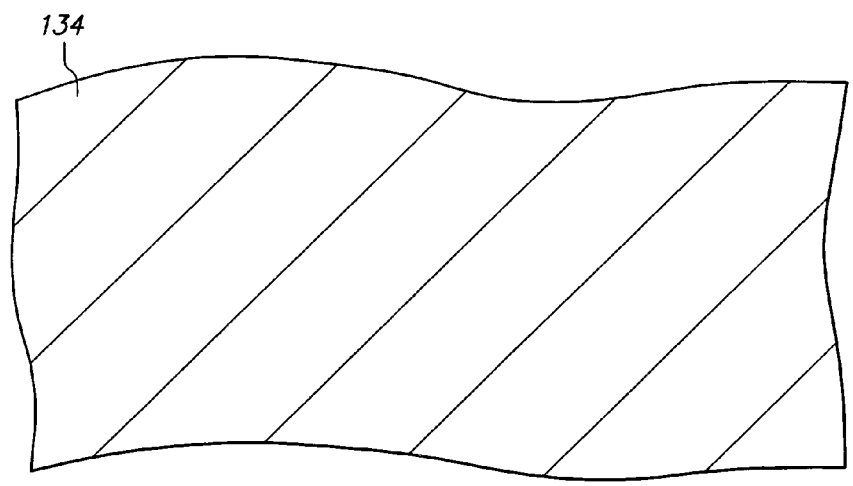

FIGS. 7A, 7B and 7C are cross-sectional, top and bottom views, respectively, of routing line 136 and bumped terminal 138 formed on metal base 120.

Routing line 136 contacts metal base 120 at surface 122 outside recess 130, and bumped terminal 138 contacts metal base 120 at recess 130. Thus, routing line 136 is disposed outside recess 130, and bumped terminal 138 is disposed within recess 130. Routing line 136 and bumped terminal 138 are contiguous with and integral with one another and have the same composition and thickness.

Routing line 136 and bumped terminal 138 are composed of a nickel layer electroplated on metal base 120 and a copper layer electroplated on the nickel layer. The nickel layer contacts and is sandwiched between metal base 120 and the copper layer, the copper layer contacts the nickel layer and is spaced from metal base 120. Thus, the nickel layer is buried beneath the copper layer, and the copper layer is exposed. Routing line 136 and bumped terminal 138 have a thickness of 20 microns. In particular, the nickel layer has a thickness of 1 micron, and the copper layer has a thickness of 19 microns. For convenience of illustration, the nickel and copper layers are shown as a single layer.

Routing line 136 and bumped terminal 138 are simultaneously formed by an electroplating operation using photoresist layers 132 and 134 as plating masks. Thus, routing line 136 and bumped terminal 138 are formed additively. Initially, a plating bus (not shown) is connected to metal base 120, current is applied to the plating bus from an external power source, and metal base 120 is submerged in an electrolytic nickel plating solution such as Technic Techni Nickel "S" at room temperature. As a result, the nickel layer electroplates (deposits or grows) on the exposed portions of metal base 120. The nickel electroplating operation continues until the nickel layer has the desired thickness. Thereafter, the structure is removed from the electrolytic nickel plating solution and submerged in an electrolytic copper plating solution such as Sel-Rex CUBATH M™ at room temperature while current is applied to the plating bus to electroplate the copper layer on the nickel layer. The copper electroplating operation continues until the copper layer has the desired thickness. Thereafter, the structure is removed from the electrolytic copper plating solution and rinsed in distilled water to remove contaminants.

Routing line 136 includes elongated routing portion 142 and enlarged annular portion 144. Elongated routing portion 142 and enlarged annular portion 144 are adjacent to and coplanar with one another. Elongated routing portion 142 is a flat planar lead with a width (orthogonal to its elongated length) of 100 microns, and enlarged annular portion 144 is a ring with an inner diameter of 300 microns, an outer diameter of 400 microns and a width of 50 microns ((400–300)/2). Furthermore, elongated routing portion 142 extends laterally from bumped terminal 138, and enlarged annular portion 144 is adjacent to and encircles bumped terminal 138.

Bumped terminal 138 is a curved hollow dome with a downwardly extending height of 140 microns and a diameter of 300 microns. Thus, bumped terminal 138 extends downwardly beyond routing line 136. Furthermore, bumped terminal 138 includes or defines cavity 146 that is spaced from metal base 120, extends into and faces away from recess 130 and extends downwardly beyond routing line 136.

Cavity 146 is adjacent to and extends across a majority of the height and diameter of bumped terminal 138 and has a concave, crater-like shape. Furthermore, cavity 146 extends into but not through bumped terminal 138, is not covered by bumped terminal 138 in the upward direction and is covered by bumped terminal 138 in the downward direction. In other words, cavity 146 extends through bumped terminal 138 in the upward direction but not the downward direction.

Figure 8A:
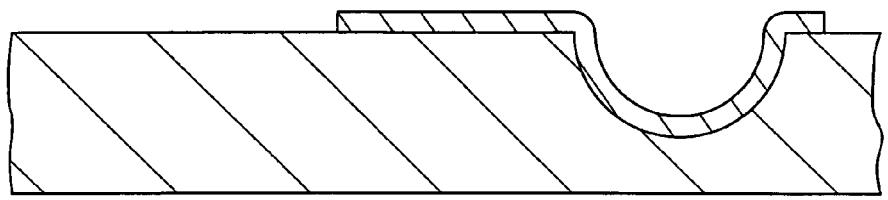
Figure 8B:
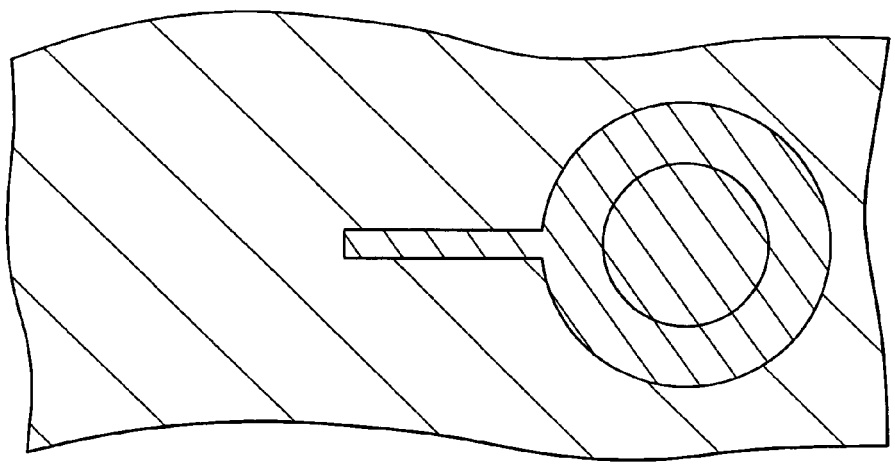
Figure 8C:
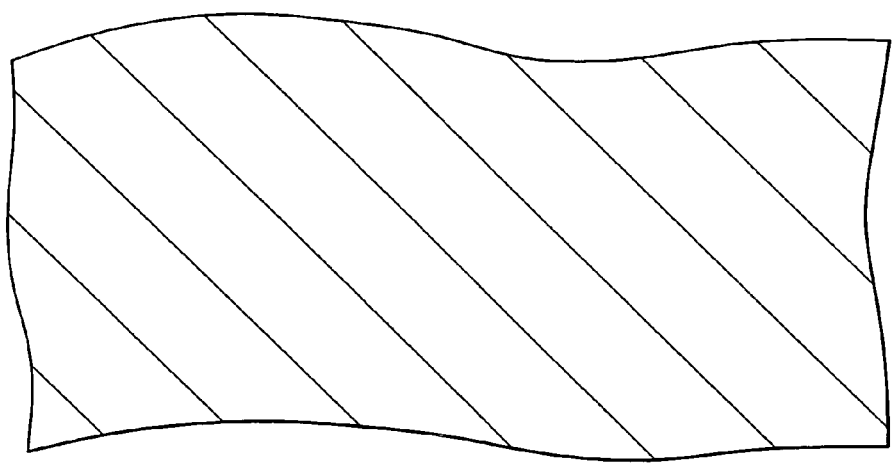

FIGS. 8A, 8B and 8C are cross-sectional, top and bottom views, respectively, of metal base 120, routing line 136 and bumped terminal 138 after photoresist layers 132 and 134 are stripped. Photoresist layers 132 and 134 are removed using a solvent, such as a mild alkaline solution with a pH of 9, that is highly selective of photoresist with respect to copper and nickel. Therefore, no appreciable amount of metal base 120, routing line 136 or bumped terminal 138 is removed.

Figure 9A:
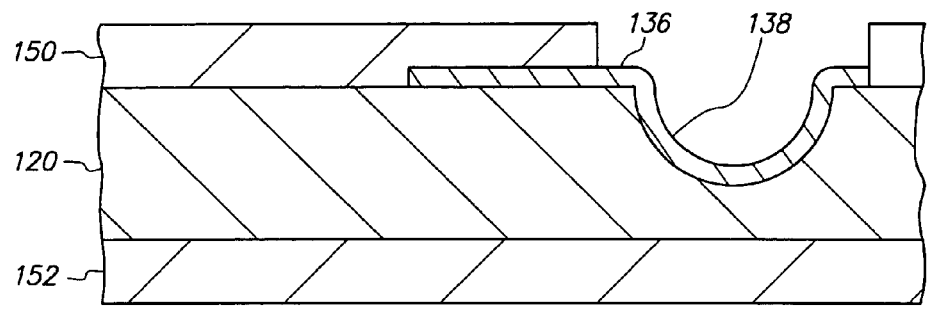
Figure 9B:
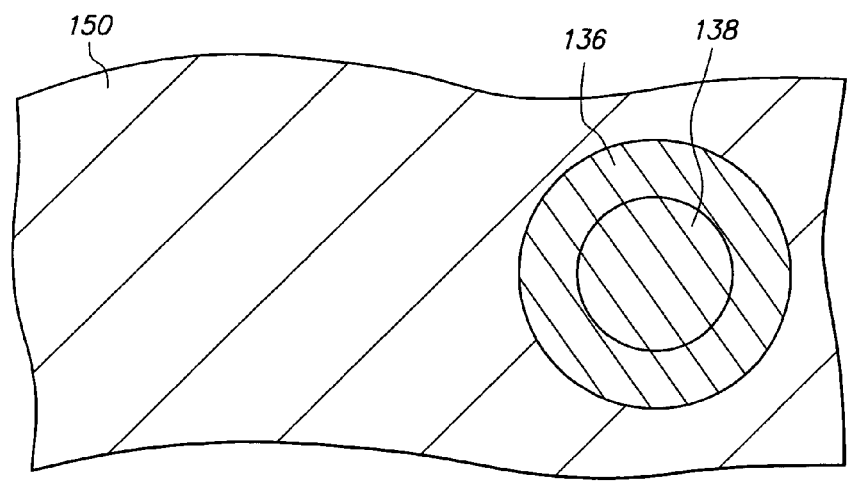
Figure 9C:
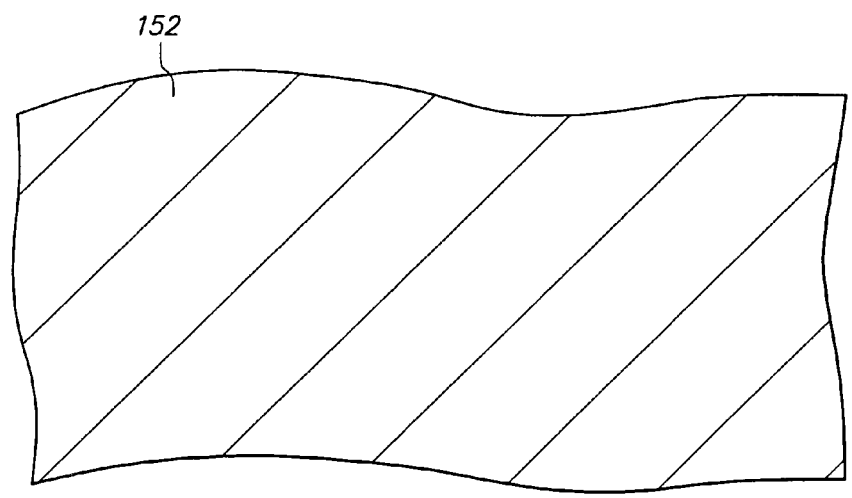

FIGS. 9A, 9B and 9C are cross-sectional, top and bottom views, respectively, of photoresist layers 150 and 152 formed on metal base 120. Photoresist layers 150 and 152 are deposited in liquid form using roller coating onto surfaces 122 and 124, respectively. A reticle (not shown) is positioned proximate to photoresist layer 150. Thereafter, photoresist layer 150 is patterned by selectively applying light through the reticle, applying a developer solution to remove the photoresist portion rendered soluble by the light, and then hard baking, as is conventional. As a result, photoresist layer 150 contains an opening that selectively exposes routing line 136 and bumped terminal 138, and photoresist layer 152 remains unpatterned. Photoresist layers 150 and 152 each have a thickness of 100 microns beyond surfaces 122 and 124, respectively.

Figure 10A:
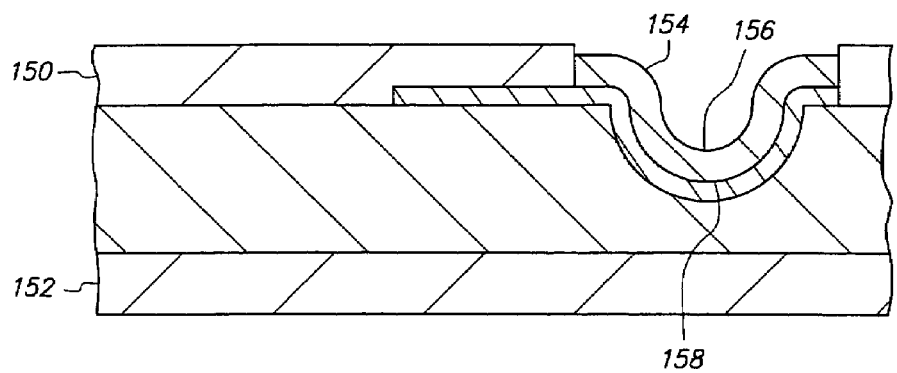
Figure 10B:
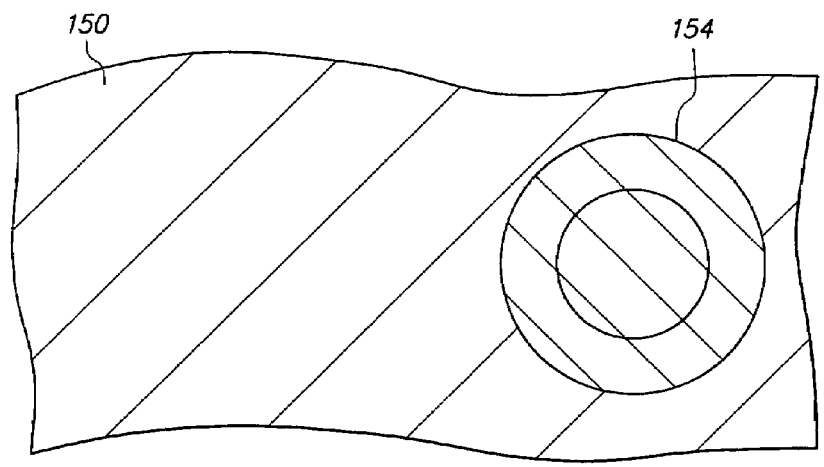
Figure 10C:
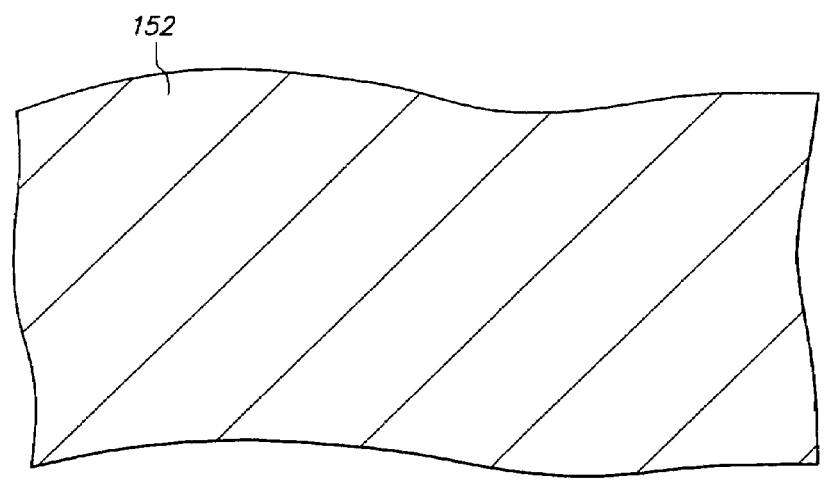

FIGS. 10B and 10C are cross-sectional, top and bottom views, respectively, of metal filler 154 formed on bumped terminal 138.

Metal filler 154 contacts and is electrically connected to routing line 136 and bumped terminal 138 and is spaced from metal base 120. Metal filler 154 contacts bumped terminal 138 within cavity 146, covers bumped terminal 138 and cavity 146 in the upward direction, extends within and outside but does not fill cavity 146, and overlaps but does not cover routing line 136 in the upward direction. Metal filler 154 is composed of a copper layer electroplated on routing line 136 and bumped terminal 138 and has a thickness of 60 microns.

Metal filler 154 is formed by an electroplating operation using photoresist layers 150 and 152 as plating masks. Thus, metal filler 154 is formed additively. Initially, a plating bus (not shown) is connected to metal base 120, current is applied to the plating bus from an external power source, and the structure is submerged in an electrolytic copper plating solution such as Sel-Rex CUBATH M™ at room temperature while current is applied to the plating bus to electroplate the copper layer on routing line 136 and bumped terminal 138. The copper electroplating operation continues until the copper layer has the desired thickness. Thereafter, the structure is removed from the electrolytic copper plating solution and rinsed in distilled water to remove contaminants.

Metal filler 154 includes opposing surfaces 156 and 158. Surface 156 faces upwardly, is spaced from and faces away from routing line 136 and bumped terminal 138 and is exposed, and surface 158 faces downwardly and faces towards and contacts routing line 136 and bumped terminal 138 and is unexposed. Surfaces 156 and 158 are curved and contour to bumped terminal 138 and extend within and outside cavity 146.

Metal filler 154 is disposed outside the periphery of chip 110, extends upwardly beyond metal base 120, routing line 136 and bumped terminal 138 and extends downwardly beyond routing line 136. Furthermore, metal filler 154 overlaps but does not cover routing line 136 in the upward direction and covers bumped terminal 138 and cavity 146 in the upward direction.

Figure 11A:
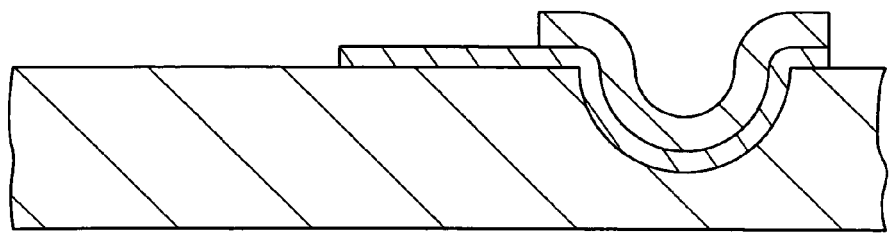
Figure 11B:
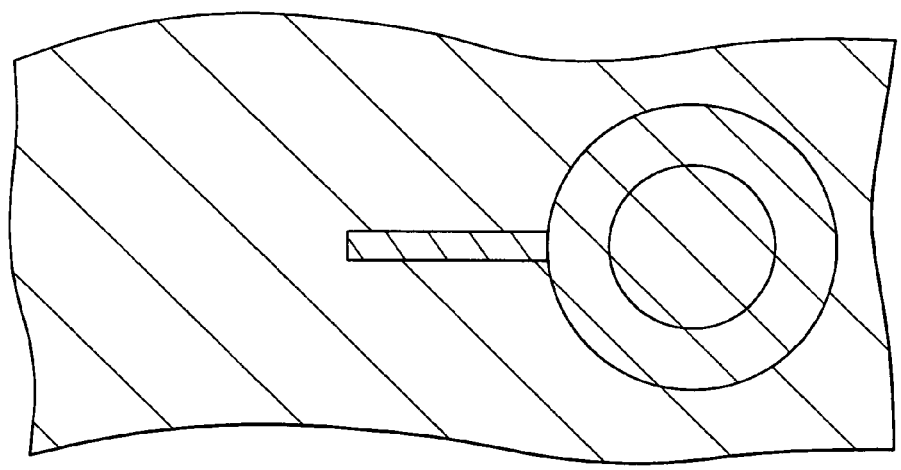
Figure 11C:
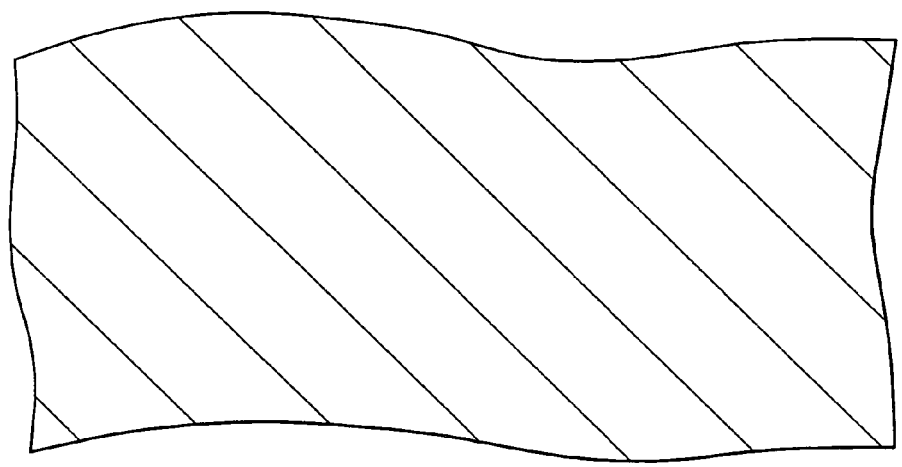

FIGS. 1A, 11B and 11C are cross-sectional, top and bottom views, respectively, of metal base 120, routing line 136, bumped terminal 138 and metal filler 154 after photoresist layers 150 and 152 are stripped. Photoresist layers 150 and 152 are removed using a solvent, such as a mild alkaline solution with a pH of 9, that is highly selective of photoresist with respect to copper and nickel. Therefore, no appreciable amount of metal base 120, routing line 136, bumped terminal 138 or metal filler 154 is is removed.

Figure 12A:
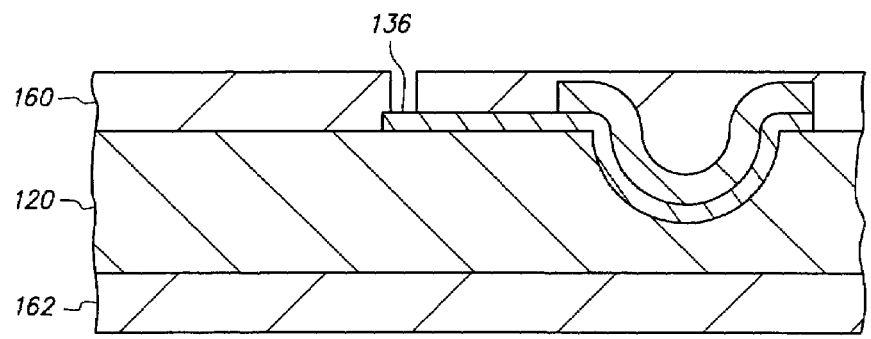
Figure 12B:
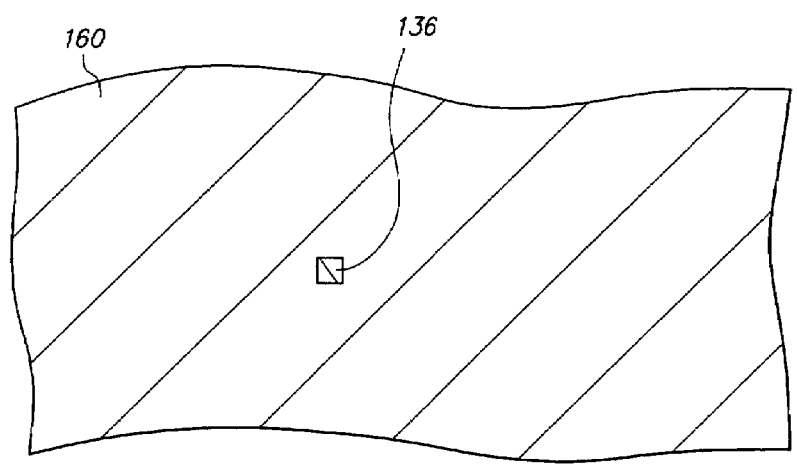
Figure 12C:
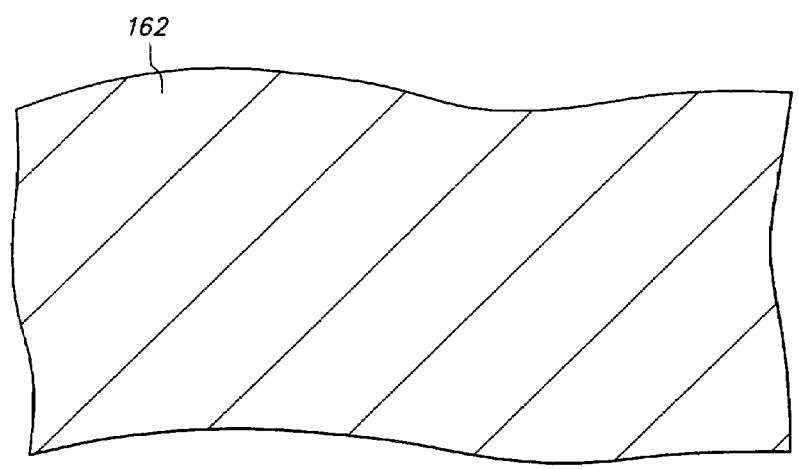

FIGS. 12A, 12B and 12C are cross-sectional, top and bottom views, respectively, of photoresist layers 160 and 162 formed on metal base 120. Photoresist layers 160 and 162 are deposited in liquid form using roller coating onto surfaces 122 and 124, respectively. A reticle (not shown) is positioned proximate to photoresist layer 160. Thereafter, photoresist layer 160 is patterned by selectively applying light through the reticle, applying a developer solution to remove the photoresist portion rendered soluble by the light, and then hard baking, as is conventional. As a result, photoresist layer 160 contains an opening that selectively exposes routing line 136, and photoresist layer 162 remains unpatterned. Photoresist layers 160 and 162 each have a thickness of 75 microns beyond surfaces 122 and 124, respectively.

Figure 13A:
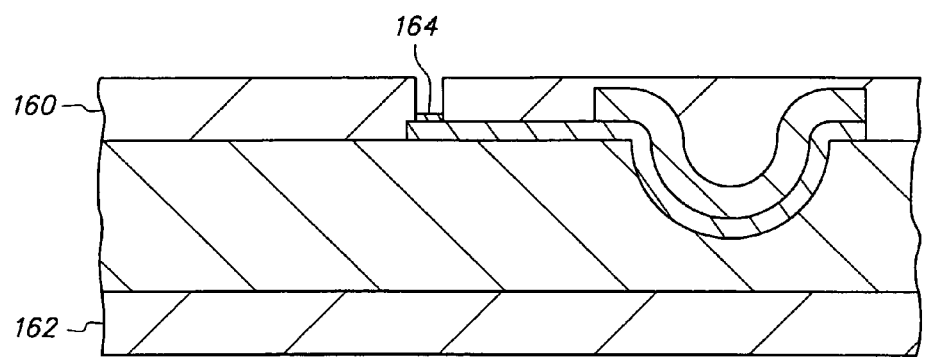
Figure 13B:
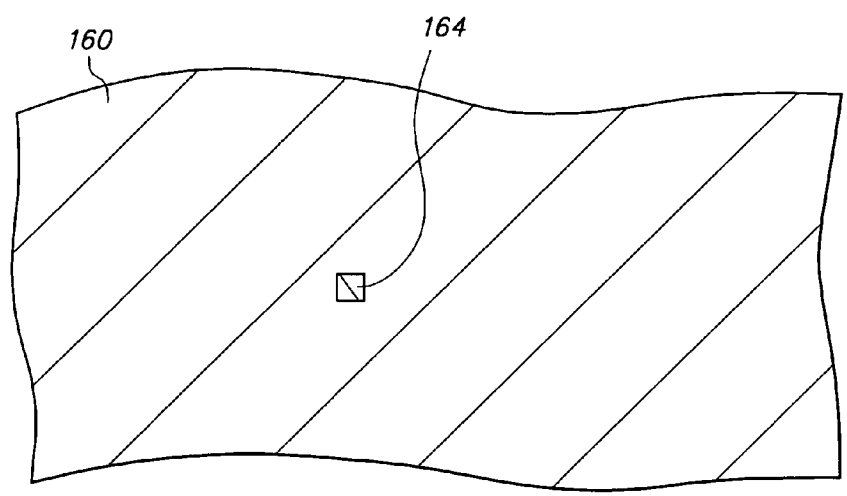
Figure 13C:
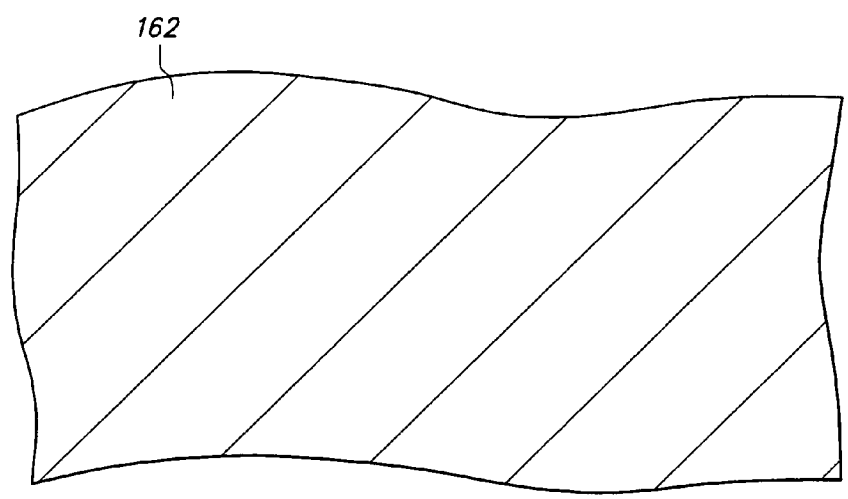

FIGS. 13A, 13B and 13C are cross-sectional, top and bottom views, respectively, of plated contact 164 formed on routing line 136.

Plated contact 164 contacts and is electrically connected to routing line 136, and is spaced from metal base 120, bumped terminal 138 and metal filler 154. Plated contact 164 is composed of a nickel layer electroplated on routing line 136 and a gold layer electroplated on the nickel layer. The nickel layer contacts and is sandwiched between routing line 136 and the gold layer, and the gold layer contacts the nickel layer and is spaced from routing line 136. Thus, the nickel layer is buried beneath the gold layer, and the gold layer is exposed. Plated contact 164 has a thickness of 3.5 microns. In particular, the nickel layer has a thickness of 3 microns, and the gold layer has a thickness of 0.5 microns. For convenience of illustration, the nickel and gold layers are shown as a single layer.

Plated contact 164 is formed by an electroplating operation using photoresist layers 160 and 162 as plating masks. Thus, plated contact 164 is formed additively. Initially, a plating bus (not shown) is connected to metal base 120, current is applied to the plating bus from an external power source, and the structure is submerged in an electrolytic nickel plating solution such as Technic Techni Nickel "S" at room temperature. As a result, the nickel layer electroplates on the exposed portion of routing line 136. The nickel electroplating operation continues until the nickel layer has the desired thickness. Thereafter, the structure is removed from the electrolytic nickel plating solution and submerged in an electrolytic gold plating solution such as Technic Orotemp at room temperature while current is applied to the plating bus to electroplate the gold layer on the nickel layer. The gold electroplating operation continues until the gold layer has the desired thickness. Thereafter, the structure is removed from the electrolytic gold plating solution and rinsed in distilled water to remove contaminants.

Figure 14A:
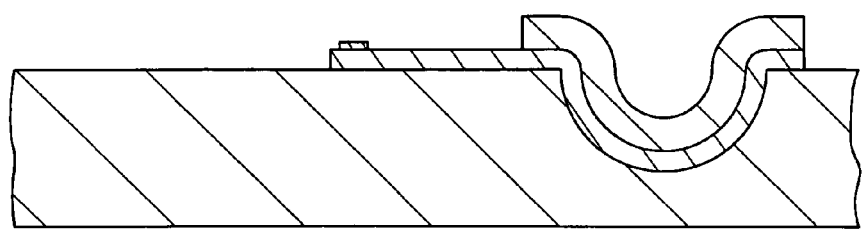
Figure 14B:
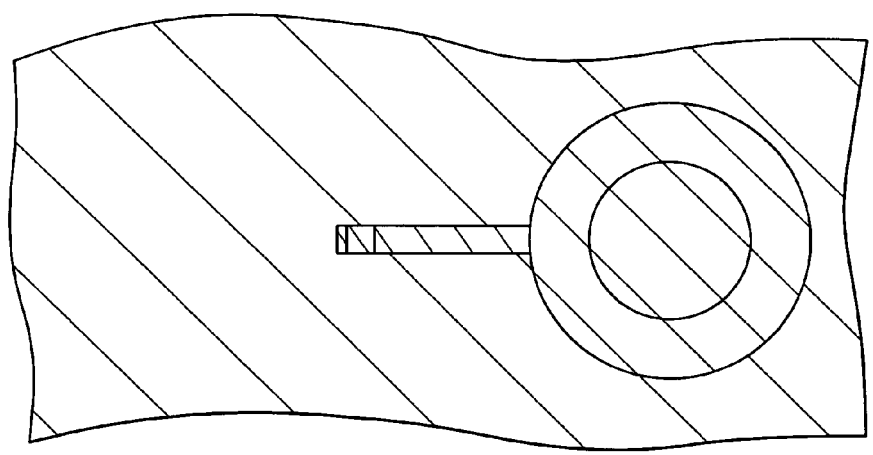
Figure 14C:
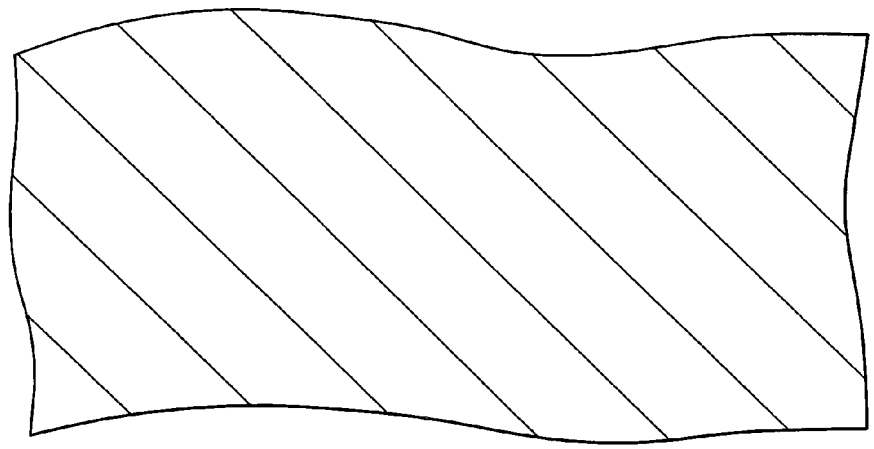

FIGS. 14A, 14B and 14C are cross-sectional, top and bottom views, respectively, of metal base 120, routing line 136, bumped terminal 138, metal filler 154 and plated contact 164 after photoresist layers 160 and 162 are stripped. Photoresist layers 160 and 162 are removed using a solvent, such as a mild alkaline solution with a pH of 9, that is highly selective of photoresist with respect to copper, nickel and gold. Therefore, no appreciable amount of metal base 120, routing line 136, bumped terminal 138, metal filler 154 or plated contact 164 is removed.

Figure 15A:
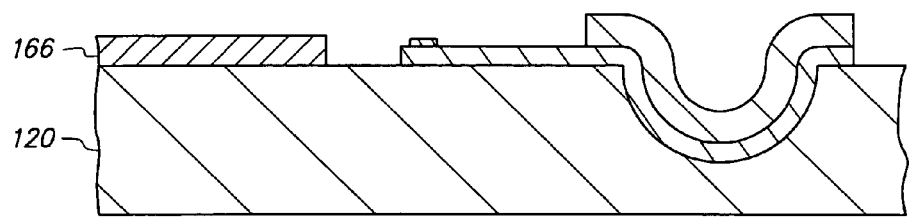
Figure 15B:
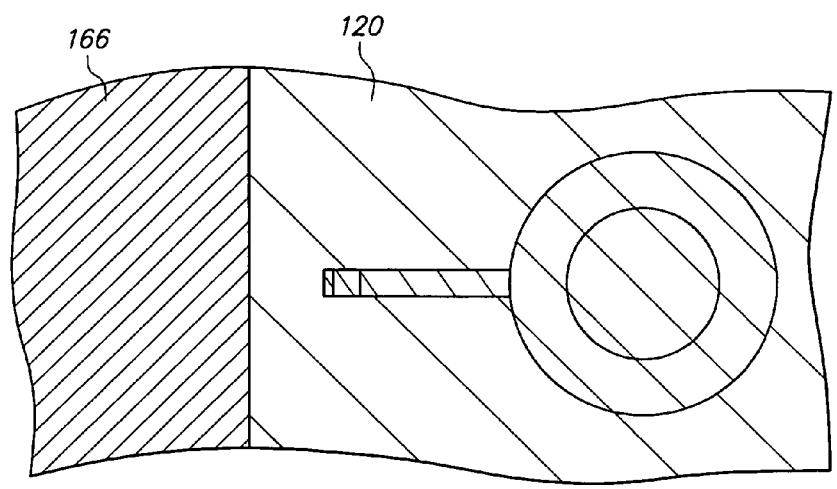
Figure 15C:
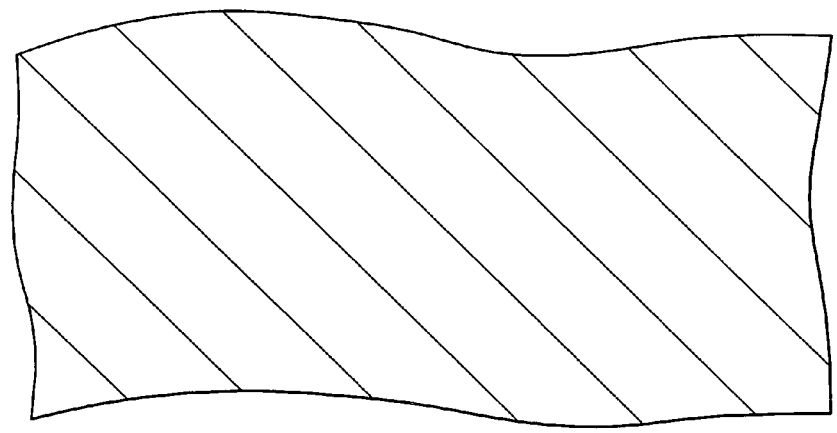

FIGS. 15A, 15B and 15C are cross-sectional, top and bottom views, respectively, of adhesive 166 formed on metal base 120.

Adhesive 166 may include an organic surface protectant such as HK 2000 which is promptly applied to the structure after photoresist layer 160 is removed to reduce native oxide formation on the exposed copper surfaces. The use of organic surface protectant layers in insulative adhesives for semiconductor chip assemblies is well-known in the art.

Thereafter, a liquid resin (A stage) such as polyamic acid is applied over metal base 120 using stencil printing. During stencil printing, a stencil (not shown) is placed over metal base 120, routing line 136, bumped terminal 138, metal filler 154 and plated contact 164, a stencil opening is aligned with metal base 120 and offset from routing line 136, bumped terminal 138, metal filler 154 and plated contact 164, and then a squeegee (not shown) pushes the liquid resin along the surface of the stencil opposite metal base 120, routing line 136, bumped terminal 138, metal filler 154 and plated contact 164, through the stencil opening and onto metal base 120 but not routing line 136, bumped terminal 138, metal filler 154 and plated contact 164. The liquid resin is compliant enough at room temperature to conform to virtually any shape. Therefore, the liquid resin flows over and covers a portion of metal base 120 but remains spaced from routing line 136, bumped terminal 138, cavity 146, metal filler 154 and plated contact 164.

Figure 16A:
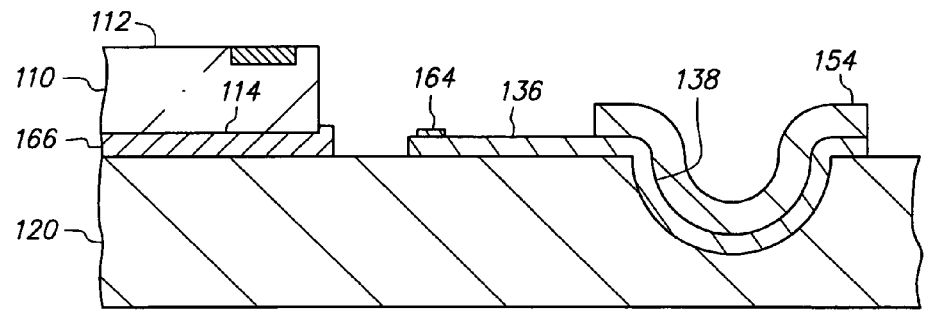
Figure 16B:
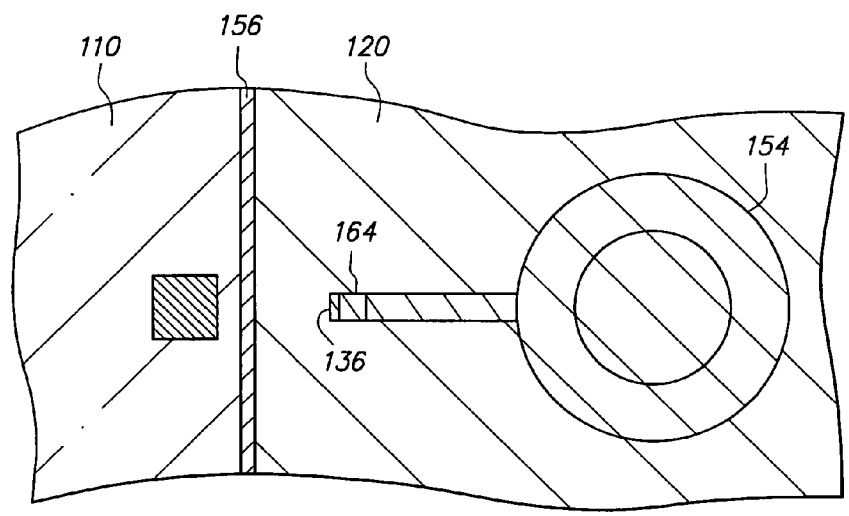
Figure 16C:
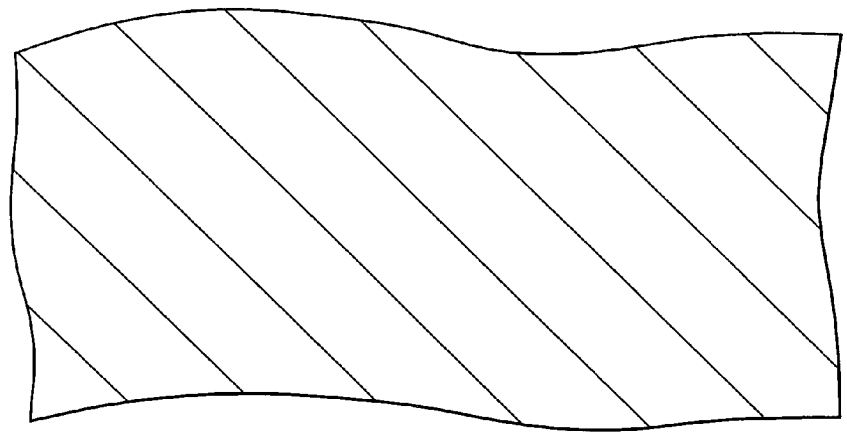

FIGS. 16A, 16B and 16C are cross-sectional, top and bottom views, respectively, of chip 110 mechanically attached to metal base 120, routing line 136, bumped terminal 138, metal filler 154 and plated contact 164 by adhesive 166.

Adhesive 166 contacts and extends between chip 110 and metal base 120 but remains spaced from routing line 136, bumped terminal 138, cavity 146, metal filler 154 and plated contact 164. Surface 112 of chip 110 faces upwardly and away from metal base 120 and is exposed, and surface 114 of chip 110 faces downwardly and towards metal base 120 and is covered by adhesive 166. Chip 110 and metal base 120 do not contact one another, and chip 110 and routing line 136 do not contact one another.

Adhesive 166 is sandwiched between chip 110 and metal base 120 using relatively low pressure from a pick-up head/that places chip 110 on adhesive 166, holds chip 110 against adhesive 166 for 5 seconds and then releases chip 110. The pick-up head is heated to a relatively low temperature such as 150° C., and adhesive 166 receives heat from the pick-up head transferred through chip 110. As a result, adhesive 166 proximate to chip 110 is partially polymerized (B stage) and forms a gel but is not fully cured, and adhesive 166 that is partially polymerized provides a loose mechanical bond between chip 110 and metal base 120.

Chip 110 and metal base 120 are positioned relative to one another so that chip 110 is disposed within the periphery of adhesive 166, and routing line 136, bumped terminal 138, metal filler 154 and plated contact 164 are disposed outside the periphery of chip 110. Chip 110 and metal base 120 can be aligned using an automated pattern recognition system.

Thereafter, the structure is placed in an oven and adhesive 166 is fully cured (C stage) at relatively low temperature in the range of 200 to 250° C. to form a solid adhesive insulative thermosetting polyimide layer that contacts and is sandwiched between and mechanically attaches chip 110 and metal base 120. Adhesive 166 is 30 microns thick between chip 110 and metal base 120.

At this stage, metal base 120 covers and extends downwardly beyond chip 110, routing line 136, bumped terminal 138, metal filler 154, plated contact 164 and adhesive 166, routing line 136 is disposed downwardly beyond and outside the periphery of chip 110 and extends laterally beyond bumped terminal 138 and metal filler 154 towards chip 110, bumped terminal 138 is disposed outside the periphery of chip 110 and extends downwardly beyond chip 110, routing line 136 and metal filler 154, cavity 146 faces upwardly and extends downwardly beyond chip 110 and routing line 136, metal filler 154 extends upwardly beyond routing line 136 and bumped terminal 138 and downwardly beyond chip 110 and routing line 136, and adhesive 166 extends downwardly beyond chip 110. Furthermore, chip 110 remains electrically isolated from routing line 136.

Figure 17A:
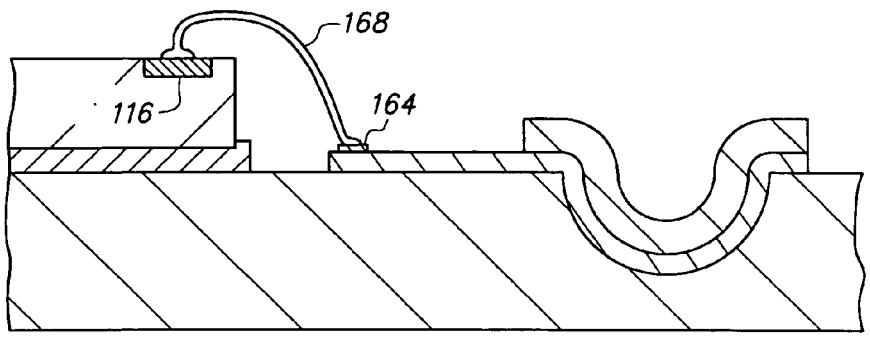
Figure 17B:
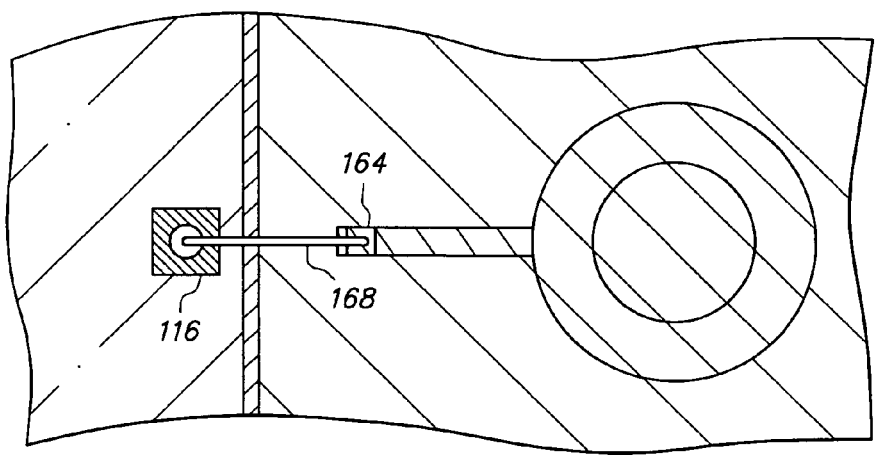
Figure 17C:
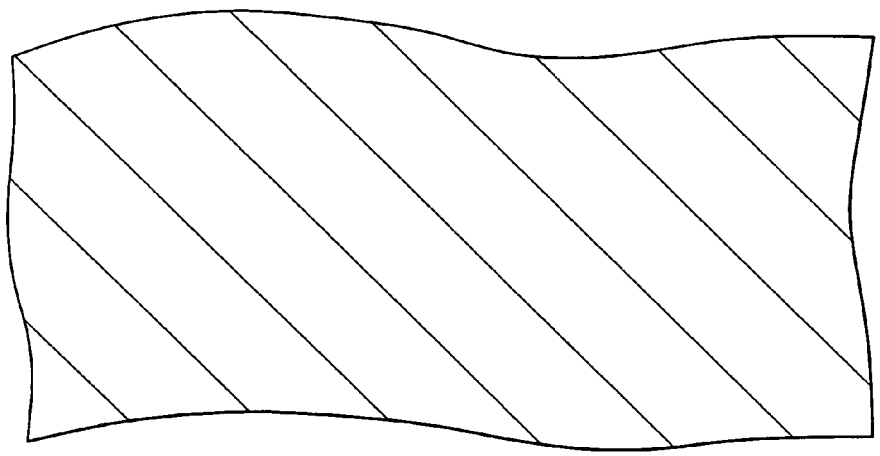

FIGS. 17A, 17B and 17C are cross-sectional, top and bottom views, respectively, of connection joint 168 formed on pad 116 and plated contact 164.

Connection joint 168 is a gold wire bond that is ball bonded to pad 116 and then wedge bonded to plated contact 164. The gold wire between the ball bond and the wedge bond has a thickness of 25 microns. Thus, connection joint 168 contacts and electrically connects pad 116 and plated contact 164, and consequently, electrically connects pad 116 to metal base 120, routing line 136, bumped terminal 138 and metal filler 154. Furthermore, connection joint 168 extends within and outside the periphery of chip 110, extends upwardly beyond chip 110 by 100 microns and is spaced from metal base 120, routing line 136, bumped terminal 138 and metal filler 154.

Figure 18A:
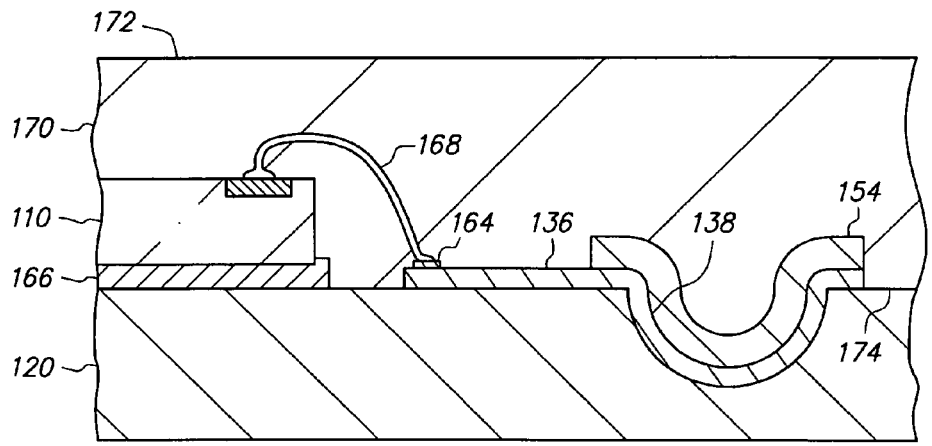
Figure 18B:
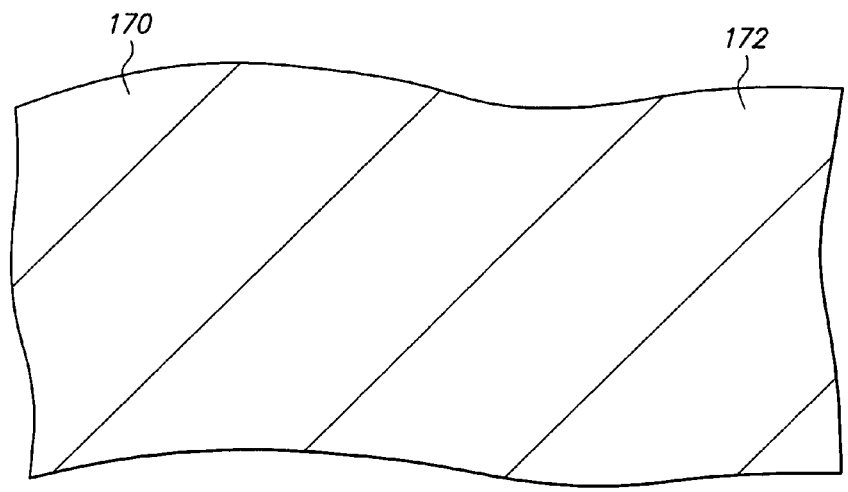
Figure 18C:
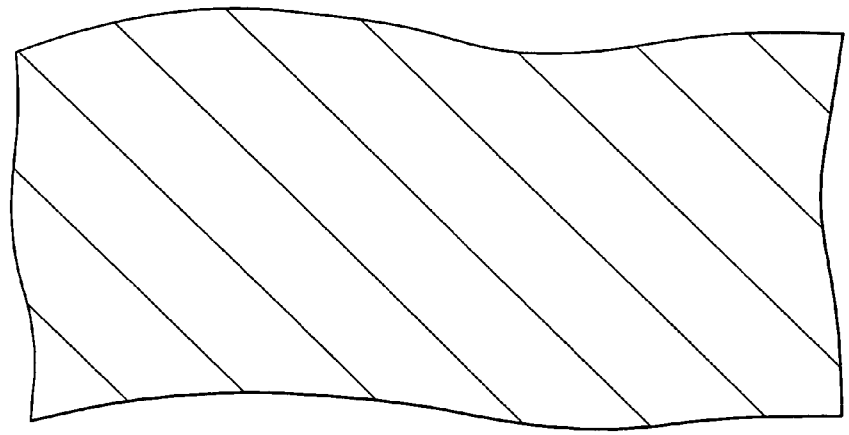

FIGS. 18A, 18B and 18C are cross-sectional, top and bottom views, respectively, of encapsulant 170 formed on chip 110, routing line 136, bumped terminal 138, metal filler 154, plated contact 164, adhesive 166 and connection joint 168.

Encapsulant 170 is deposited by transfer molding. Transfer molding is the most popular chip encapsulation method for essentially all plastic packages. Generally speaking, transfer molding involves forming components in a closed mold from a molding compound that is conveyed under pressure in a hot, plastic state from a central reservoir called the transfer pot through a tree-like array of runners and gates into closed cavities. Molding compounds are well-known in the art.

The preferred transfer molding system includes a preheater, a mold, a press and a cure oven. The mold includes an upper mold section and a lower mold section, also called "platens" or "halves" which define the mold cavities. The mold also includes the is transfer pot, runners, gates and vents. The transfer pot holds the molding compound. The runners and gates provide channels from the transfer pot to the cavities. The gates are placed near the entrances of the cavities and are constricted to control the flow and injection velocity of the molding compound into the cavities and to facilitate removal of the solidified molding compound after molding occurs. The vents allow trapped air to escape but are small enough to permit only a negligible amount of the molding compound to pass through them.

The molding compound is initially in tablet form. The preheater applies high-frequency energy to preheat the molding compound to a temperature in the range of 50 to 100° C. The preheated temperature is below the transfer temperature and therefore the preheated molding compound is not in a fluid state. In addition, the structure is placed in one of the mold cavities, and the press operates hydraulically to close the mold and seal the mold cavities by clamping together the upper and lower mold sections. Guide pins ensure proper mating of the upper and lower mold sections at the parting line. In addition, the mold is heated to a transfer temperature in the range of 150 to 250° C. by inserting electric heating cartridges in the upper and lower mold sections.

After closing the mold, the preheated molding compound in tablet form is placed in the transfer pot. Thereafter, a transfer plunger applies pressure to the molding compound in the transfer pot. The pressure is in the range of 10 to 100 kgf/cm$^2$ and preferably is set as high as possible without introducing reliability problems. The combination of heat from the mold and pressure from the transfer plunger converts the molding compound in the transfer pot into a fluid state. Furthermore, the pressure from the transfer plunger forces the fluid molding compound through the runners and the gates into the mold cavities. The pressure is maintained for a certain optimum time to ensure that the molding compound fills the cavities.

The lower mold section contacts and makes sealing engagement with and is generally flush with metal base 120. However, the upper mold section is spaced from connection joint 168 by 120 microns. As a result, the molding compound contacts the exposed portions of the chip 110, metal base 120, routing line 136, metal filler 154, plated contact 164, adhesive 166 and connection joint 168 in the cavity. After 1 to 3 minutes at the transfer temperature, the molding compound polymerizes and is partially cured in the mold.

Once the partially cured molding compound is resilient and hard enough to withstand ejection forces without significant permanent deformation, the press opens the mold, ejector pins remove the molded structure from the mold, and excess molding compound attached to the molded structure that solidified in the runners and the gates is trimmed and removed. The molded structure is then loaded into a magazine and postcured in the curing oven for 4 to 16 hours at a temperature somewhat lower than the transfer temperature but well above room temperature to completely cure the molding compound.

The molding compound is a multi-component mixture of an encapsulating resin with various additives. The principal additives include curing agents (or hardeners), accelerators, inert fillers, coupling agents, flame retardants, stress-relief agents, coloring agents and mold-release agents. The encapsulating resin provides a binder, the curing agent provides linear/cross-polymerization, the accelerator enhances the polymerization rate, the inert filler increases thermal conductivity and thermal shock resistance and reduces the thermal coefficient of expansion, resin bleed, shrinkage and residual stress, the coupling agent enhances adhesion to the structure, the flame retardant reduces flammability, the stress-relief agent reduces crack propagation, the coloring agent reduces photonic activity and device visibility, and the mold-release agent facilitates removal from the mold.

Encapsulant 170 contacts and covers chip 110, metal base 120, routing line 136, bumped terminal 138, metal filler 154, plated contact 164, adhesive 166 and connection joint 168. More particularly, encapsulant 170 contacts surface 112 and the outer edges of chip 110, but is spaced from surface 114 of chip 110 (due to adhesive 166). Furthermore encapsulant 170 covers but is spaced from bumped terminal 138 (due to metal filler 154).

Encapsulant 170 is a solid adherent compressible protective layer that provides environmental protection such as moisture resistance and particle protection for chip 110 as well as mechanical support for routing line 136, bumped terminal 138 and metal filler 154. Furthermore, chip 110 is embedded in encapsulant 170.

Encapsulant 170 includes opposing surfaces 172 and 174. Surface 172 faces upwardly, and surface 174 faces downwardly. Encapsulant 170 extends upwardly beyond chip 110, routing line 136, bumped terminal 138, metal filler 154, plated contact 164, adhesive 166 and connection joint 168, has a thickness of 400 microns and extends 120 microns upwardly beyond connection joint 168. Encapsulant 170 also extends into cavity 146, and metal filler 154 and encapsulant 170 fill cavity 146.

Figure 19A:
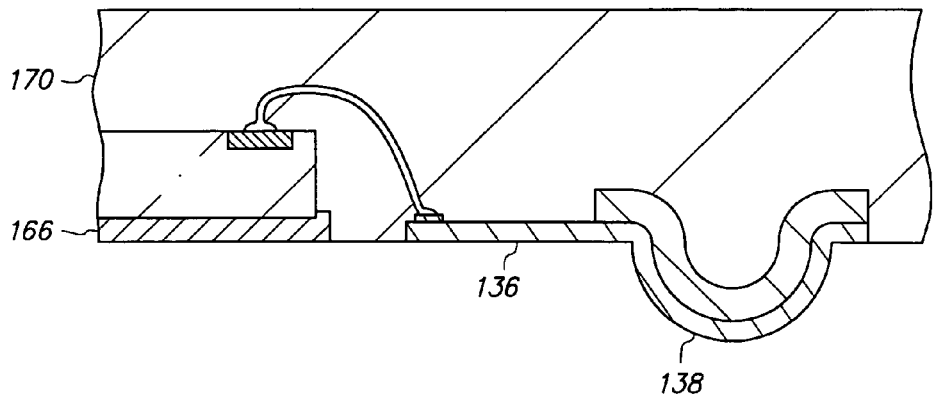
Figure 19B:
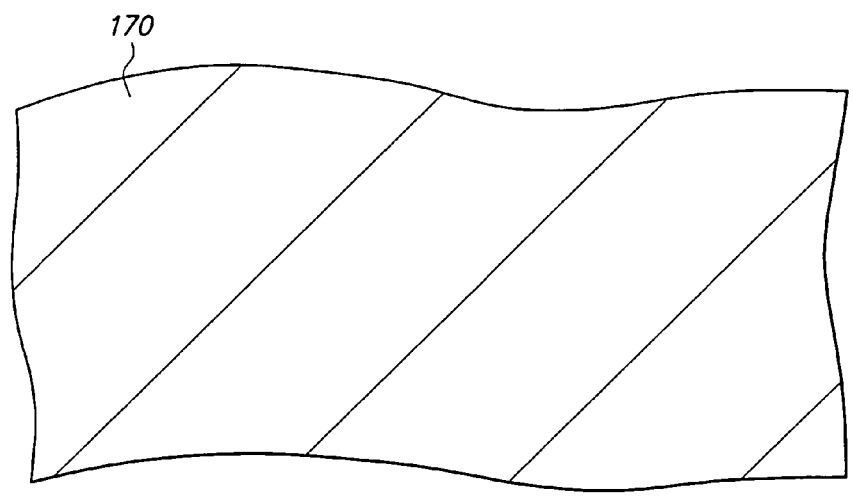
Figure 19C:
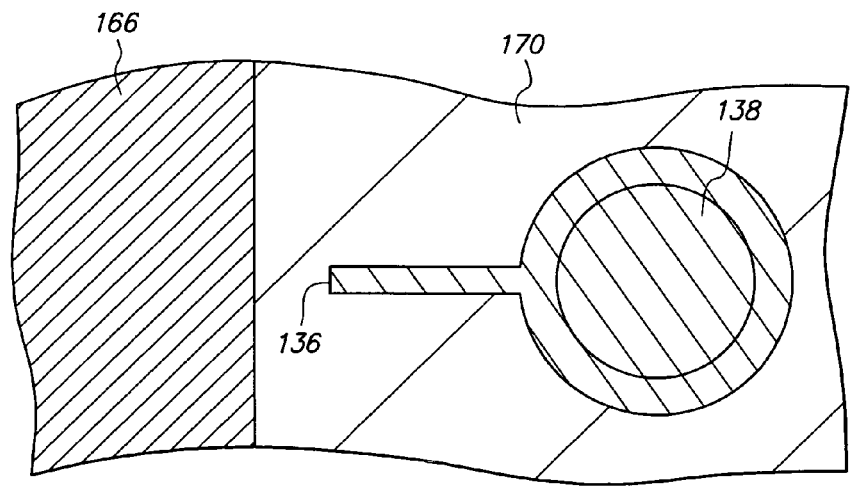

FIGS. 19A, 19B and 19C are cross-sectional, top and bottom views, respectively, of the structure after metal base 120 is removed.

Metal base 120 is removed by applying a blanket backside wet chemical etch. For instance, the bottom spray nozzle can spray the wet chemical etch on metal base 120 while the top spray nozzle is deactivated, or the structure can be dipped in the wet chemical etch since encapsulant 170 provides front-side protection. The wet chemical etch is highly selective of copper with respect to nickel, polyimide and the molding compound, and therefore, highly selective of metal base 120 with respect to the nickel layer of routing line 136 and bumped terminal 138, adhesive 166 and encapsulant 170. Furthermore, the nickel layer of routing line 136 and bumped terminal 138 protects the underlying copper layer of routing line 136 and bumped terminal 138 from the wet chemical etch. Therefore, no appreciable amount of routing line 136, bumped terminal 138, adhesive 166 or encapsulant 170 is removed. Furthermore, chip 110, metal filler 154, plated contact 164 and connection joint 168 are not exposed to the wet chemical etch.

The wet chemical etch removes metal base 120. As a result, the wet chemical etch eliminates contact area between metal base 120 and routing line 136, between metal base 120 and bumped terminal 138, between metal base 120 and adhesive 166 and between metal base 120 and encapsulant 170, and exposes routing line 136, bumped terminal 138, adhesive 166 and encapsulant 170 without exposing chip 110, metal filler 154, plated contact 166 and connection joint 168.

A suitable wet chemical etch can be provided by a solution containing alkaline ammonia. The optimal etch time for removing metal base 120 without excessively exposing routing line 136 and bumped terminal 138 to the wet chemical etch can be established through trial and error.

Encapsulant 170 provides mechanical support for routing line 136, bumped terminal 138 and metal filler 154 and reduces mechanical strain on adhesive 166, which is particularly useful after metal base 120 is removed. Encapsulant 170 protects routing line 136, bumped terminal 138 and metal filler 154 from mechanical damage by the wet chemical etch and subsequent cleaning steps (such as rinsing in distilled water and air blowing). For instance, encapsulant 170 absorbs physical force of the wet chemical etch and cleaning steps that might otherwise separate chip 110 and routing line 136. Thus, encapsulant 170 improves structural integrity and allows the wet chemical etch and subsequent cleaning steps to be applied more vigorously, thereby improving manufacturing throughput.

Figure 20A:
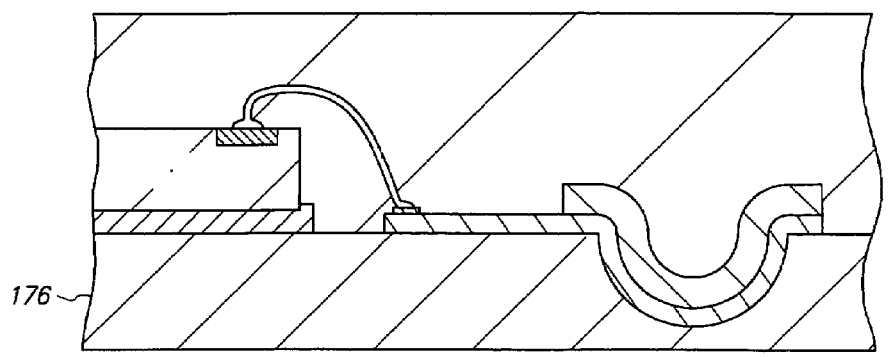
Figure 20B:
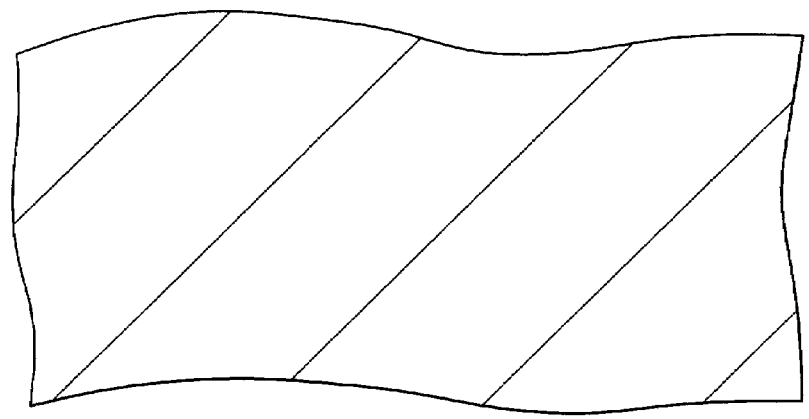
Figure 20C:
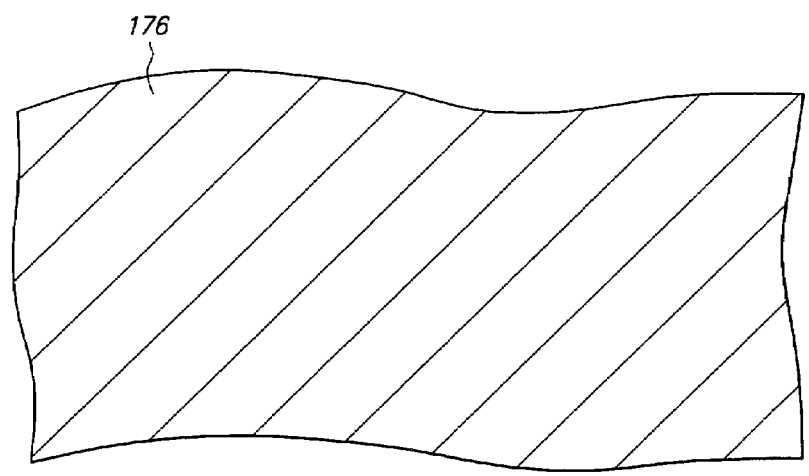

FIGS. 20A, 20B and 20C are cross-sectional, top and bottom views, respectively, of insulative base 176 formed on routing line 136, bumped terminal 138, adhesive 166 and encapsulant 170.

Insulative base 176 is initially an epoxy in paste form that includes an epoxy resin, a curing agent, an accelerator and a filler. The filler is an inert material, such as silica (powdered fused quartz), that improves thermal conductivity, thermal shock resistance, and thermal coefficient of expansion matching. The epoxy paste is blanketly deposited on routing line 136, bumped terminal 138, adhesive 166 and encapsulant 170, and then the epoxy paste is cured or hardened at a relatively low temperature in the range of 100 to 250° C. to form a solid adherent insulator that provides a protective seal for routing line 136.

Insulative base 176 contacts and covers and extends downwardly beyond routing line 136, bumped terminal 138, adhesive 166 and encapsulant 170, covers and extends downwardly beyond and is spaced from chip 110, metal filler 154, plated contact 164 and connection joint 168, and has a thickness of 160 microns. Thus, insulative base 176 extends downwardly beyond bumped terminal 138 by 20 microns and bumped terminal 138 is unexposed.

For convenience of illustration, insulative base 176 is shown below chip 110 to retain a single orientation throughout the figures for ease of comparison between the figures, although in this step the structure would be inverted so that gravitational force would assist the epoxy paste deposition.

Figure 21A:
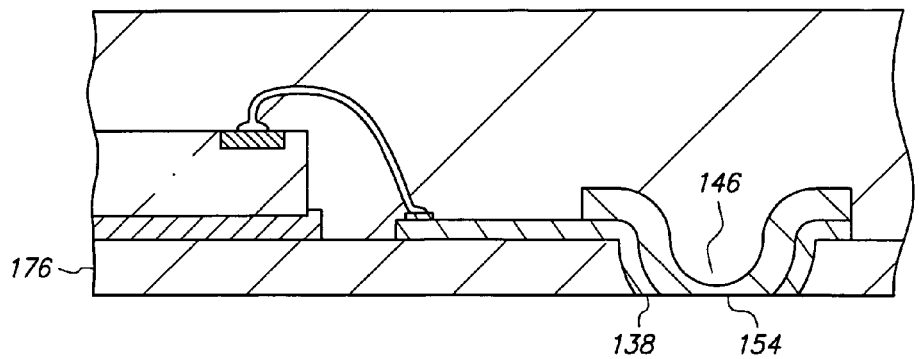
Figure 21B:
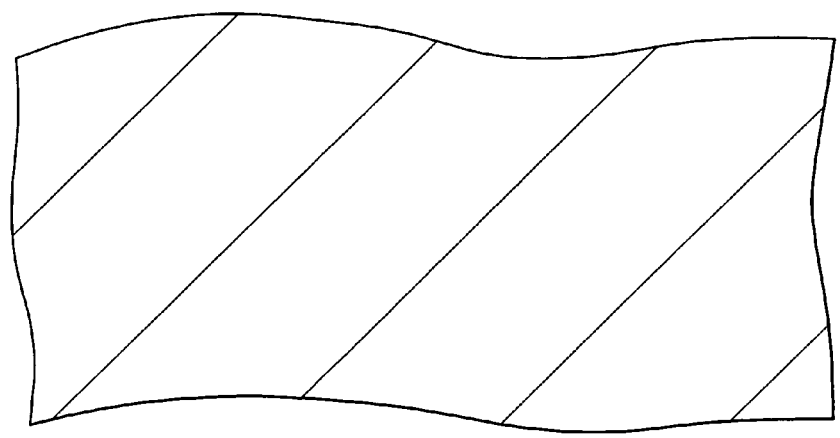
Figure 21C:
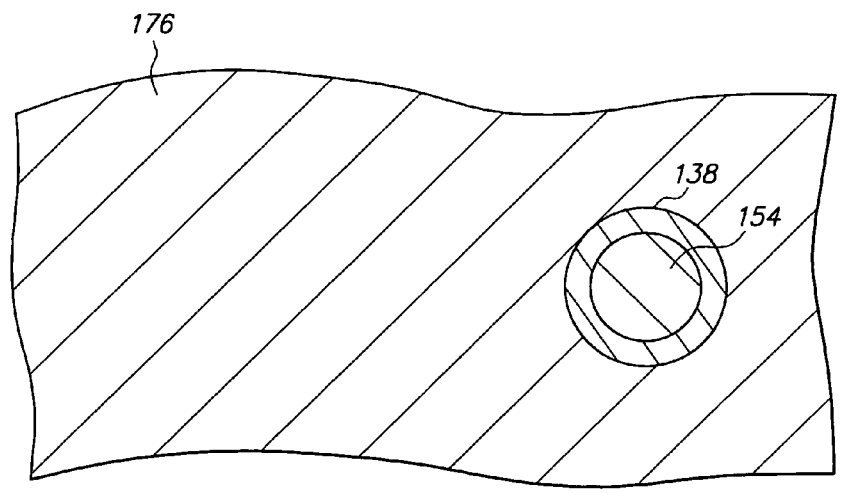

FIGS. 21A, 21B and 21C are cross-sectional, top and bottom views, respectively, of the structure after a lower portion of insulative base 176 is removed.

The lower portion of insulative base 176 is removed by grinding. In particular, a rotating diamond sand wheel and distilled water are applied to the back-side of insulative base 176. Initially, the diamond sand wheel grinds only insulative base 176. As the grinding continues, insulative base 176 becomes thinner as the grinded surface migrates upwardly. Eventually the diamond sand wheel contacts bumped terminal 138, and as a result, begins to grind bumped terminal 138 as well. As the grinding continues, bumped terminal 138 and insulative base 176 become thinner as their grinded surfaces migrate upwardly. Eventually the diamond sand wheel contacts metal filler 154, and as a result, begins to grind metal filler 154 as well. As the grinding continues, bumped terminal 138, metal filler 154 and insulative base 176 become thinner as their grinded surfaces migrate upwardly. The grinding continues until bumped terminal 138, metal filler 154 and insulative base 176 have the desired thickness, and then halts before it reaches chip 110, routing line 136, plated contact 164, adhesive 166, connection joint 168 or encapsulant 170. Thereafter, the structure is rinsed in distilled water to remove contaminants.

Bumped terminal 138, metal filler 154 and insulative base 176 extend downwardly beyond routing line 136 by 100 microns after the grinding operation. Thus, the grinding removes a 40 micron thick lower portion of bumped terminal 138, a 20 micron thick lower portion of metal filler 154 and a 60 micron thick lower portion of insulative base 176. Moreover, the grinding operation exposes bumped terminal 138 and metal filler 154.

Bumped terminal 138, cavity 146, metal filler 154 and insulative base 176 are laterally aligned with one another at a surface that faces downwardly. Thus, an exposed planarized horizontal surface that faces downwardly includes bumped terminal 138, cavity 146, metal filler 154 and insulative base 176. Furthermore, bumped terminal 138 appears as a ring that encircles metal filler 154 at this surface.

The copper layer of routing line 136 and bumped terminal 138 is adjacent to cavity 146, contacts metal filler 154 and extends upwardly beyond the nickel layer of routing line 136 and bumped terminal 138, and the nickel layer of routing line 136 and bumped terminal 138 is spaced from cavity 146 and metal filler 154. In addition, the copper and nickel layers are laterally aligned with cavity 146, metal filler 154, insulative base 176 and one another at a surface that faces downwardly. Furthermore, the nickel layer appears as a ring that contacts and is adjacent to insulative base 176 and the copper layer, is spaced from metal filler 154 and encircles the copper layer at this surface, and the copper layer appears as a ring that contacts and is adjacent to metal filler 154 and the copper layer, is spaced from insulative base 176 and encircles metal filler 154 at this surface.

Chip 110 remains embedded in encapsulant 170 and extends upwardly beyond routing line 136, bumped terminal 138, metal filler 154, adhesive 166 and insulative base 176, routing line 136 is disposed outside the periphery of chip 110 and downwardly beyond chip 110, plated contact 164 and connection joint 168 and extends laterally beyond bumped terminal 138 and metal filler 154 towards chip 110, bumped terminal 138 is disposed outside the periphery of chip 110 and downwardly beyond chip 110, routing line 136, plated contact 164 and connection joint 168 and extends downwardly beyond encapsulant 170, metal filler 154 is disposed outside the periphery of chip 110, extends upwardly beyond routing line 136, bumped terminal 138, plated contact 164, adhesive 166 and insulative base 176 and extends downwardly beyond chip 110, routing line 136, plated contact 164, adhesive 166, connection joint 168 and encapsulant 170, adhesive 166 extends downwardly beyond chip 110, connection joint 168 extends within and outside the periphery of chip 110, encapsulant 170 covers chip 110, routing line 136, bumped terminal 138, metal filler 154, plated contact 164, adhesive 166, connection joint 168 and insulative base 176 in the upward direction, and insulative base 176 extends downwardly beyond chip 110, routing line 136, plated contact 164, adhesive 166, connection joint 168 and encapsulant 170. In addition, routing line 136 remains unexposed, bumped terminal 138 and metal filler 154 are exposed and metal filler 154 and encapsulant 170 fill cavity 146.

Cavity 146 extends through bumped terminal 138 and is not covered by bumped terminal 138 in the upward or downward directions. In other words, cavity 146 extends through bumped terminal 138 in the upward and downward directions. Thus, the grinding operation converts cavity 146 from a blind via relative to bumped terminal 138 (that extends through bumped terminal 138 in only the upward direction) into a through-hole relative to bumped terminal 138 (that extends through bumped terminal 138 in the upward and downward directions).

Cavity 146 includes upper and lower opposing ends and tapered sidewalls therebetween. The upper end of cavity 146 is adjacent to bumped terminal 138 and faces upwardly, the lower end of cavity 146 is adjacent to bumped terminal 138 and faces downwardly, and the tapered sidewalls of cavity 146 are adjacent to the upper and lower ends of cavity 146 and slant inwardly towards the lower end of cavity 146. Thus, cavity 146 has a diameter that decreases as cavity 146 extends in the downward direction. Cavity 146 continues to extend across a majority of the height and diameter of bumped terminal 138 and metal filler 154, and also extends across the entire height of bumped terminal 138 (in the upward and downward directions).

The upper and lower ends of cavity 146 are vertically aligned with bumped terminal 138, enlarged annular portion 144 and one another. Thus, the lower end of cavity 146 is concentrically disposed within the surface area of bumped terminal 138, enlarged annular portion 144, metal filler 154 and the upper end of cavity 146. In addition, bumped terminal 138, metal filler 154 and the upper end of cavity 146 have a surface area that is at least 20 percent larger than the surface area of the lower end of cavity 146. Moreover, the lower end of cavity 146 and the lower surface (surface 158) of metal filler 154 are co-extensive and have identical size, shape and location.

Figure 22A:
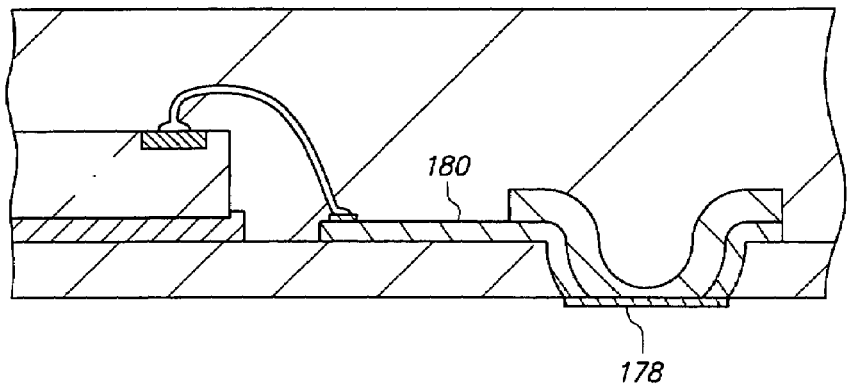
Figure 22B:
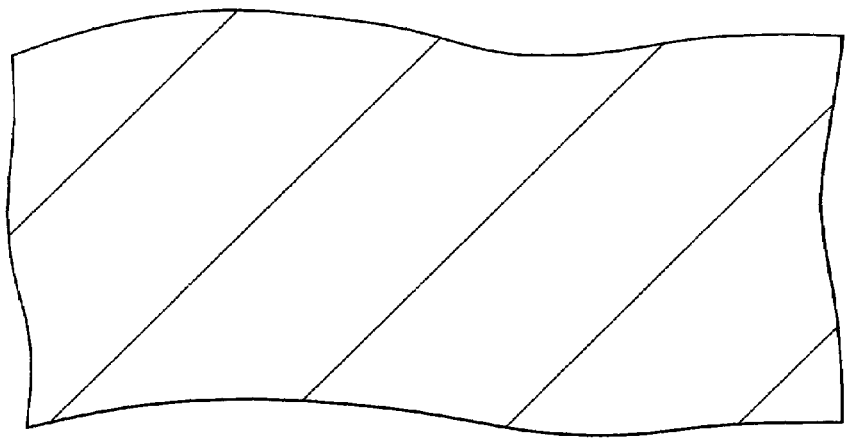
Figure 22C:
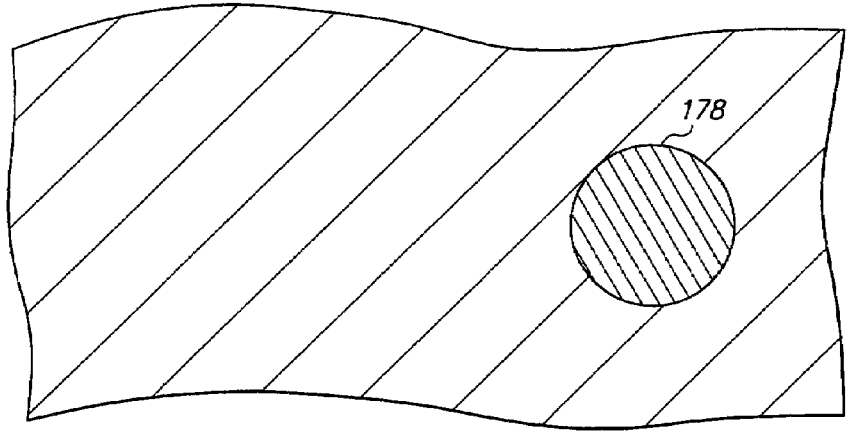

FIGS. 22A, 22B and 22C are cross-sectional, top and bottom views, respectively, of plated terminal 178 formed on bumped terminal 138 and metal filler 154.

Plated terminal 178 is electrolessly plated on bumped terminal 138 and metal filler 154. Plated terminal 178 is composed of a nickel layer electrolessly plated on bumped terminal 138 and metal filler 154 and a gold layer electrolessly plated on the nickel layer. The nickel layer contacts and is sandwiched between bumped terminal 138 and the gold layer and between metal filler 154 and the gold layer, and the gold layer is spaced from bumped terminal 138 and metal filler 154 and exposed. For convenience of illustration, the nickel and gold layers are shown as a single layer.

The structure is dipped in an activator solution such as dilute palladium chloride of approximately 0.1 grams of palladium chloride and 5 cubic centimeters of hydrochloric acid per liter of water to render bumped terminal 138 and metal filler 154 catalytic to electroless nickel, then the structure is rinsed in distilled water to remove the palladium from encapsulant 170 and insulative base 176.

The structure is then submerged in an electroless nickel plating solution such as Enthone Enplate NI-424 at 85° C. Preferred nickel plating solutions include nickel-sulfate and nickel-chloride and have a pH of about 9.5 to 10.5. A higher nickel concentration provides a faster plating rate but reduces the stability of the solution. The amount of chelating agents or ligands in the solution depends on the nickel concentration and their chemical structure, functionality and equivalent weight. Most of the chelating agents used in electroless nickel plating solutions are hydroxy organic acids which form one or more water soluble nickel ring complexes. These complexes reduce the free nickel ion concentration, thereby increasing the stability of the solution while retaining a reasonably fast plating rate. Generally, the higher the complex agent concentration, the slower the plating rate. In addition, the pH of the solution and the plating rate continually decrease as the electroless plating continues due to hydrogen ions being introduced into the solution as a byproduct of the nickel reduction. Accordingly, the solution is buffered to offset the effects of the hydrogen ions. Suitable buffering agents include sodium or potassium salts of mono and dibasic organic acids. Finally, those skilled in the art will understand that electroless nickel plating solutions do not deposit pure elemental nickel since a reducing agent such as $H_2PO_2$ will naturally decompose into the electrolessly plated nickel. Therefore, those skilled in the art will understand that electrolessly plated nickel refers to a nickel compound that is mostly nickel but not pure elemental nickel.

Bumped terminal 138 and metal filler 154 are catalytic to electroless nickel. Furthermore, encapsulant 170 and insulative base 176 are not catalytic to electroless nickel and therefore a plating mask is not necessary. As a result, plated terminal 178 plates on bumped terminal 138 and metal filler 154.

The electroless nickel plating operation continues until plated terminal 178 is 4 microns thick. At this point, plated terminal 178 is primarily nickel and contain about 4 to 9 weight percentage phosphorus.

Thereafter, the structure is removed from the electroless nickel plating solution and briefly submerged in an electroless gold plating solution such as is MacDermid PLANAR™ at 70° C. Plated terminal 178 includes an exposed nickel surface layer and therefore is catalytic to electroless gold. Furthermore, encapsulant 170 and insulative base 176 are not catalytic to electroless gold and therefore a plating mask is not necessary. As a result, the gold deposits on the nickel surface layer. The gold electroless plating operation continues until the gold surface layer is 0.5 microns thick. Thereafter, the structure is removed from the electroless gold plating solution and rinsed in distilled water.

Plated terminal 178 contacts and is electrically connected to bumped terminal 138 and metal filler 154 and extends downwardly beyond bumped terminal 138, metal filler 154 and insulative base 176. Thus, plated terminal 178 is spaced from and extends downwardly beyond chip 110, routing line 136, plated contact 164, adhesive 166, connection joint 168 and encapsulant 170. Moreover, plated terminal 178 provides a robust, permanent electrical connection to bumped terminal 138 and metal filler 154 that protrudes downwardly from bumped terminal 138 and metal filler 154 and is exposed. Plated terminal 178 includes a buried nickel layer and a gold surface layer. The buried nickel layer provides the primary mechanical and electrical connection to bumped terminal 138 and metal filler 154, and the gold surface layer provides a wettable surface to facilitate solder reflow.

Conductive trace 180 includes routing line 136, bumped terminal 138, metal filler 154, plated contact 164 and plated terminal 178. Conductive trace 180 is electrically connected to pad 116 by connection joint 168 and is adapted for providing horizontal and vertical routing between pad 116 and a next level assembly.

Figure 23A:
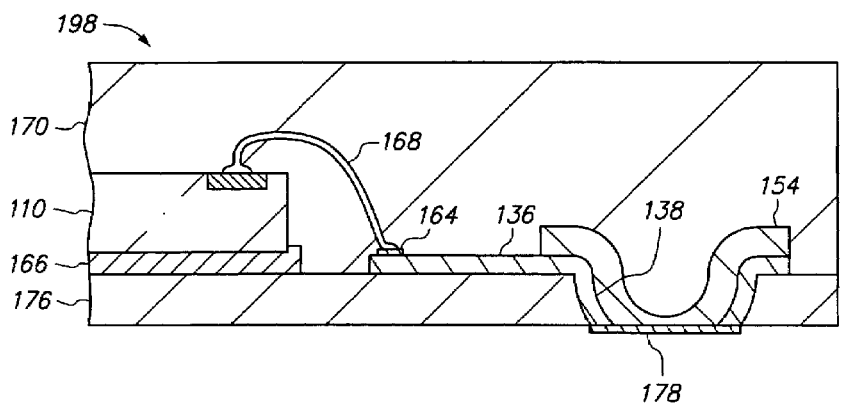
Figure 23B:
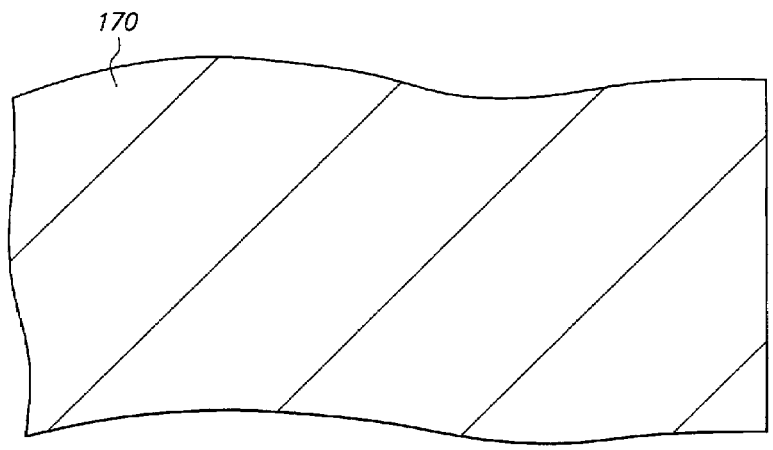
Figure 23C:
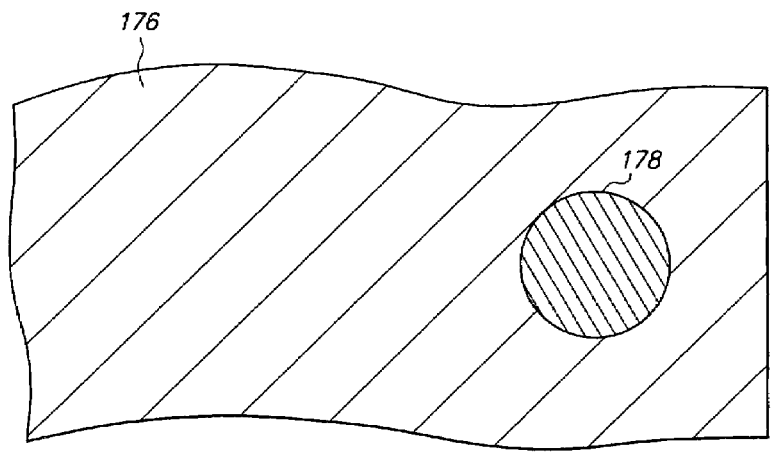

FIGS. 23A, 23B and 23C are cross-sectional, top and bottom views, respectively, of the structure after cutting encapsulant 170 and insulative base 176 with an excise blade to singulate the assembly from other assemblies.

At this stage, the manufacture of semiconductor chip assembly 198 that includes chip 110, routing line 136, bumped terminal 138, metal filler 154, plated contact 164, adhesive 166, connection joint 168, encapsulant 170, insulative base 176 and plated terminal 178 can be considered complete.

Routing line 136 is mechanically coupled to chip 110 by adhesive 166, and is electrically coupled to chip 110 by connection joint 168. Routing line 136 and connection joint 168 provide horizontal fan-out routing between pad 116 and external circuitry, and bumped terminal 138, metal filler 154 and plated terminal 178 provide vertical routing between pad 116 and external circuitry. Encapsulant 170 and insulative base 176 provide mechanical support and environmental protection for the assembly. Encapsulant 170 covers chip 110 and conductive trace 180 in the upward direction. Although bumped terminal 138 and metal filler 154 are not exposed, and are overlapped by insulative base 176 and plated terminal 178 in the downward direction, bumped terminal 138 and metal filler 154 are not covered in the downward direction by encapsulant 170, insulative base 176 or any other insulative material of the assembly.

The semiconductor chip assembly is a single-chip first-level package that is devoid of TAB leads.

The semiconductor chip assembly includes other conductive traces embedded in encapsulant 170, and only a single conductive trace 180 is shown for convenience of illustration. The conductive traces are spaced and separated and electrically isolated from one another. The conductive traces each include a respective routing line, bumped terminal, metal filler, plated contact and plated terminal. The conductive traces are each electrically connected to a respective pad on chip 110 by a respective connection joint. The conductive traces each provide horizontal fan-out routing and vertical routing for their respective pads. Furthermore, the conductive traces each include a downwardly protruding plated terminal to provide a land grid array (LGA) package.

Chip 110 is designed with the pads electrically isolated from one another. However, the corresponding routing lines are initially electroplated on metal base 120 and electrically connected to one another by metal base 120. Furthermore, the connection joints electrically connect the routing lines and the corresponding pads, thereby electrically connecting the pads with one another. Thereafter, once metal base 120 is removed, the routing lines are electrically isolated from one another, and therefore the pads return to being electrically isolated from one another.

Advantageously, there is no plating bus or related circuitry that need be disconnected or severed from the conductive traces after the metal base removed.

Figure 24A:
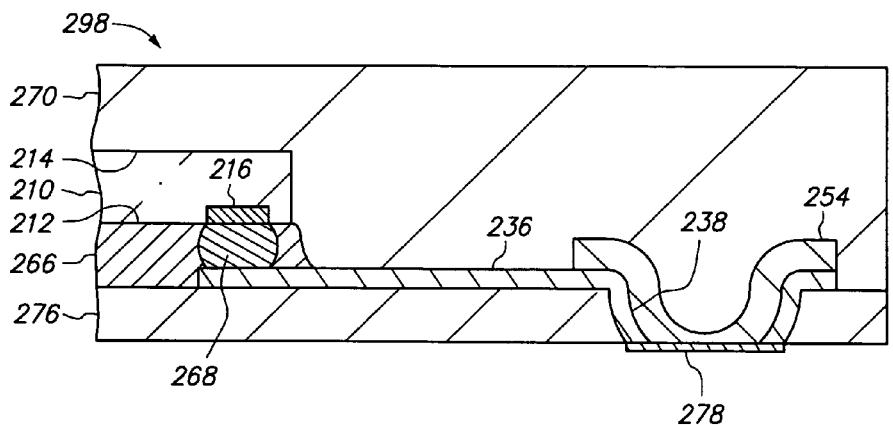
FIGS. 24A, 24B and 24C are cross-sectional, top and bottom views, respectively, of a semiconductor chip assembly in accordance with a second embodiment of the present invention.
Figure 24B:
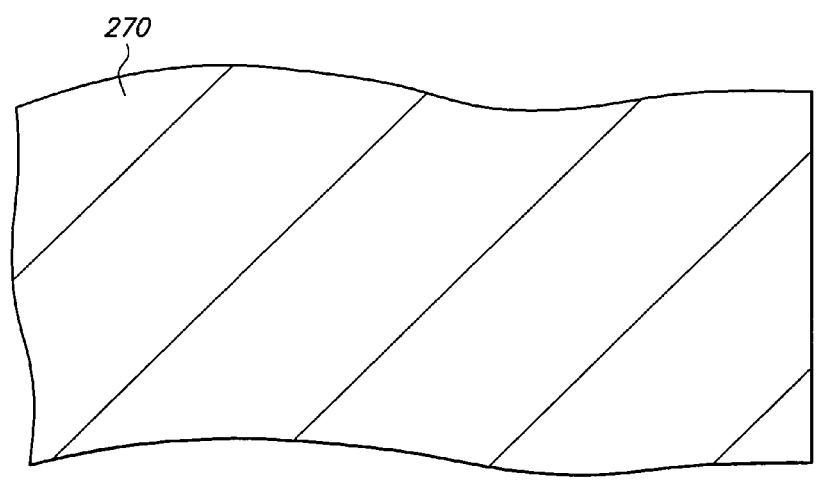
Figure 24C:
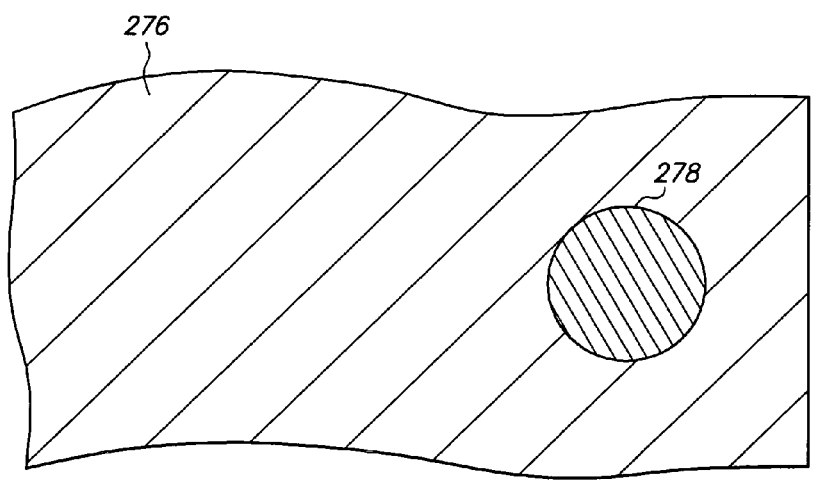

FIGS. 24A, 24B and 24C are cross-sectional, top and bottom views, respectively, of a semiconductor chip assembly in accordance with a second embodiment of the present invention. In the second embodiment, the chip is flip-chip bonded. For purposes of brevity, any description in the first embodiment is incorporated herein insofar as the same is applicable, and the same description need not be repeated. Likewise, elements of the second embodiment similar to those in the first embodiment have corresponding reference numerals indexed at two-hundred rather than one-hundred. For instance, chip 210 corresponds to chip 110, routing line 236 corresponds to routing line 136, etc.

Connection joint 268 is initially a solder bump deposited on pad 216. The solder bump has a hemispherical shape and a diameter of 100 microns.

Routing line 236 extends within and outside the periphery of chip 210. Thus, the elongated routing portion (corresponding to elongated routing portion 142) is lengthened. This is accomplished by a slight adjustment to the electroplating operation previously described for routing line 136. In particular, the photoresist layer (corresponding to photoresist layer 132) is patterned to reshape the opening for routing line 236, and therefore routing line 236 is lengthened relative to routing line 136. Furthermore, the plated contact (corresponding to plated contact 164) is omitted.

Chip 210 is positioned such that surface 212 faces downwardly, surface 214 faces upwardly, routing line 236 extends laterally across pad 216, and connection joint 268 contacts and is sandwiched between pad 216 and routing line 236. Thereafter, heat is applied to reflow connection joint 268, and then the heat is removed and connection joint 268 cools and solidifies into a hardened solder joint that mechanically attaches and electrically connects pad 216 and routing line 236. Connection joint 268 exhibits localized wetting and does not collapse, and chip 210 remains spaced from routing line 236.

Thereafter, adhesive 266 is dispensed into and underfills the open gap between chip 210 and the metal base (corresponding to metal base 120), and then adhesive 266 is cured. As a result, adhesive 266 contacts and is sandwiched between chip 210 and the metal base, contacts connection joint 268 and is spaced from pad 216. Thus, adhesive 266 is significantly thicker than adhesive 166. A suitable underfill adhesive is Namics U8443.

Thereafter, encapsulant 260, insulative base 276 and plated terminal 278 are formed.

Semiconductor chip assembly 298 includes chip 210, routing line 236, bumped terminal 238, metal filler 254, adhesive 266, connection joint 268, encapsulant 270, insulative base 276 and plated terminal 278.

Figure 25A:
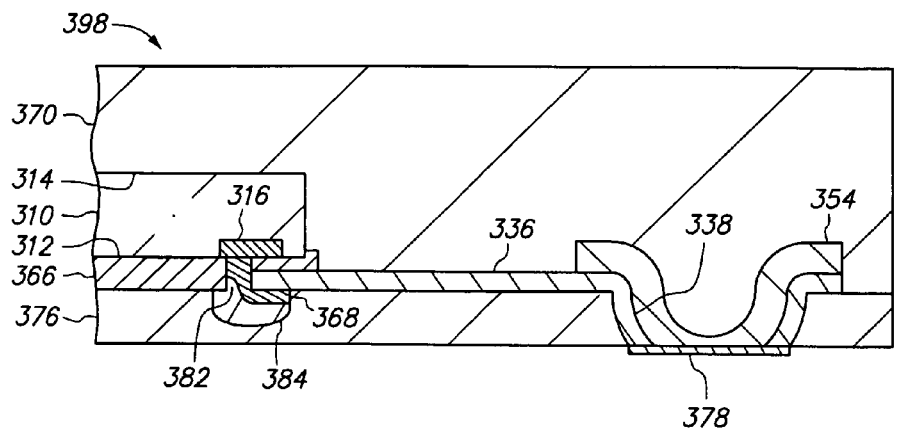
FIGS. 25A, 25B and 25C are cross-sectional, top and bottom views, respectively, of a semiconductor chip assembly in accordance with a third embodiment of the present invention.
Figure 25B:
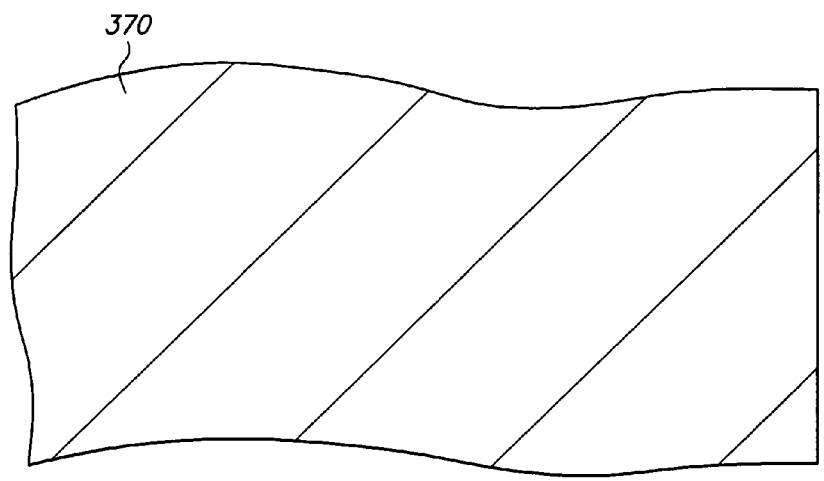
Figure 25C:
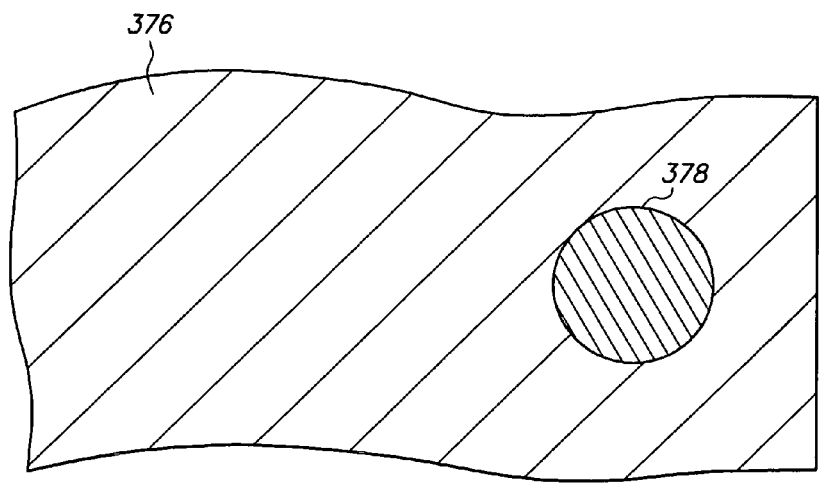

FIGS. 25A, 25B and 25C are cross-sectional, top and bottom views, respectively, of a semiconductor chip assembly in accordance with a third embodiment of the present invention. In the third embodiment, the connection joint is electroplated. For purposes of brevity, any description in the first embodiment is incorporated herein insofar as the same is applicable, and the same description need not be repeated. Likewise, elements of the third embodiment similar to those in the first embodiment have corresponding reference numerals indexed at three-hundred rather than one-hundred. For instance, chip 310 corresponds to chip 110, routing line 336 corresponds to routing line 136, etc.

Pad 316 is treated to accommodate an electroplated copper connection joint by forming a nickel surface layer on the aluminum base. For instance, chip 310 is dipped in a zinc solution to deposit a zinc layer on the aluminum base. This step is commonly known as zincation. Preferably, the zinc solution contains about 150 grams/liter of NaOH, 25 grams/liter of ZnO, and 1 gram/liter of $NaNO_3$, as well as tartaric acid to reduce the rate at which the aluminum base dissolves. Thereafter, the nickel surface layer is electrolessly deposited on the zincated aluminum base. A suitable electroless nickel plating solution is Enthone Enplate NI-424 at 85° C.

Routing line 336 extends within and outside the periphery of chip 310. Thus, the elongated routing portion (corresponding to elongated routing portion 142) is lengthened. This is accomplished by a slight adjustment to the electroplating operation previously described for routing line 136. In particular, the photoresist layer (corresponding to photoresist layer 132) is patterned to reshape the opening for routing line 336, and therefore routing line 336 is lengthened relative to routing line 136.

The metal base (corresponding to metal base 120) is etched to form a back-side recess (not shown), the plated contact (corresponding to plated contact 164) is omitted, and adhesive 366 is deposited on the metal base and routing line 336.

Chip 310 is inverted and positioned such that surface 312 faces downwardly, surface 314 faces upwardly, adhesive 366 contacts and is sandwiched between pad 316 and routing line 336, and routing line 336 partially overlaps pad 316. Thereafter, encapsulant 370 is formed, and then the metal base is etched again to convert the back-side recess into a slot (not shown) that extends through the metal base, exposes adhesive 366 and is vertically aligned with pad 316.

Thereafter, through-hole 382 is formed in adhesive 366 that exposes pad 316. Through-hole 382 is formed by applying a suitable etch that is highly selective of adhesive 366 with respect to pad 316 and routing line 336. In this instance, a selective TEA $CO_2$ laser etch is applied. The laser is directed at and vertically aligned with and centered relative to pad 316. The laser has a spot size of 70 microns, and pad 316 has a length and width of 100 microns. As a result, the laser strikes pad 316 and portions of routing line 336 and adhesive 366 that extend within the periphery of pad 316, and ablates adhesive 366. The laser drills through and removes a portion of adhesive 366. However, portions of adhesive 366 that extend across the peripheral edges of pad 316 are outside the scope of the laser and remain intact. Likewise, routing line 336 shields a portion of adhesive 366 from the laser etch, and a portion of adhesive 366 sandwiched between pad 316 and routing line 336 remains intact. The laser etch is anisotropic, and therefore little or none of adhesive 366 sandwiched between pad 316 and routing line 336 is undercut or removed. Through-hole 382 may slightly undercut adhesive 366 between pad 316 and routing line 336 and have a diameter that is slightly larger than 70 microns due to the beam angle of the laser, the thermal effects of the laser, and/or the isotropic nature of an oxygen plasma or wet chemical cleaning step. For convenience of explanation, this slight undercut and enlargement is ignored. However, through-hole 382 is formed without damaging chip 310 or routing line 336 and does not extend into chip 310.

Thereafter, a brief cleaning step can be applied to remove oxides and debris that may be present on the exposed portions of pad 316 and routing line 336. For instance, a brief oxygen plasma cleaning step can be applied to the structure. Alternatively, a brief wet chemical cleaning step using a solution containing potassium permanganate can be applied to the structure. In either case, the cleaning step cleans the exposed portions of pad 316 and routing line 336 without damaging the structure.

Thereafter, connection joint 368 is formed by an electroplating operation. Initially, the metal base is connected to a plating bus (not shown), current is applied to the plating bus from an external power source, and the structure is submerged in an electrolytic copper plating solution such as Sel-Rex CUBATH M™ at room temperature. As a result, connection joint 368 electroplates on the exposed portions of the metal base. In addition, since the plating bus provides the current to the metal base, which in turn provides the current to routing line 336, connection joint 368 electroplates on the exposed portions of routing line 336 in through-hole 382. At the initial stage, since adhesive 366 is an electrical insulator and pad 316 is not connected to the plating bus, connection joint 368 does not electroplate on pad 316 and is spaced from pad 316. However, as the copper electroplating continues, connection joint 368 continues to plate on routing line 336, extends through adhesive 366 and contacts pad 316. As a result, pad 316 is connected to the plating bus by the metal base, routing line 336 and connection joint 368, and therefore connection joint 368 begins to electroplate on pad 316 as well. The copper electroplating continues until connection joint 368 has the desired thickness. Thereafter, the structure is removed from the electrolytic copper plating solution and rinsed in distilled water to remove contaminants.

Thereafter, insulative plug 384 is formed on adhesive 366 and connection joint 368 and disposed within the slot, and then insulative base 376 and plated terminal 378 are formed.

Semiconductor chip assembly 398 includes chip 310, routing line 336, bumped terminal 338, metal filler 354, adhesive 366, connection joint 368, encapsulant 370, insulative base 376, plated terminal 378 and insulative plug 384.

Figure 26A:
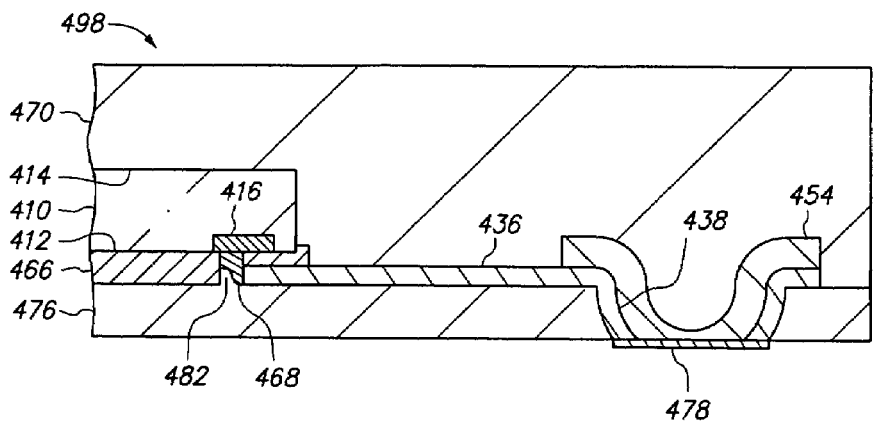
FIGS. 26A, 26B and 26C are cross-sectional, top and bottom views, respectively, of a semiconductor chip assembly in accordance with a fourth embodiment of the present invention.
Figure 26B:
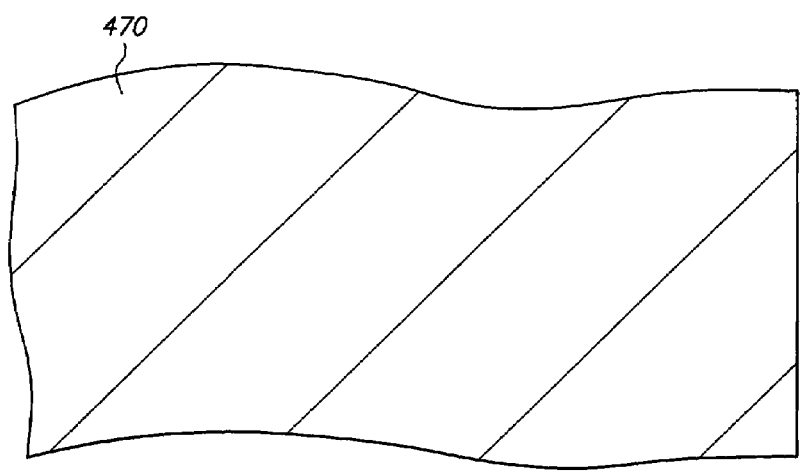
Figure 26C:
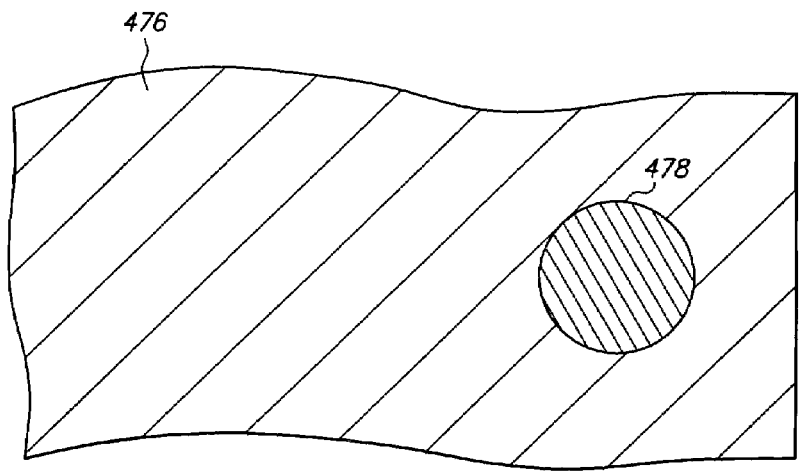

FIGS. 26A, 26B and 26C are cross-sectional, top and bottom views, respectively, of a semiconductor chip assembly in accordance with a fourth embodiment of the present invention. In the fourth embodiment, the connection joint is electrolessly plated. For purposes of brevity, any description in the first embodiment is incorporated herein insofar as the same is applicable, and the same description need not be repeated. Likewise, elements of the fourth embodiment similar to those in the first embodiment have corresponding reference numerals indexed at four-hundred rather than one-hundred. For instance, chip 410 corresponds to chip 110, routing line 436 corresponds to routing line 136, etc.

Pad 416 is treated to include a nickel surface layer in the same manner as pad 316, routing line 436 is configured in the same manner as routing line 336, adhesive 466 is deposited on the metal base (corresponding to metal base 120) and routing line 436 in the same manner that adhesive 366 is deposited on the metal base and routing line 336, and the plated contact (corresponding to plated contact 164) is omitted.

Chip 410 is inverted and positioned such that surface 412 faces downwardly, surface 414 faces upwardly, adhesive 466 contacts and is sandwiched between pad 416 and routing line 436, and routing line 436 partially overlaps pad 416. Thereafter, encapsulant 470 is formed, and then the metal base is removed. Thereafter, through-hole 482 is formed in adhesive 466 and exposes pad 416. Through-hole 482 is formed in the same manner as through-hole 382.

Thereafter, connection joint 468 is formed by an electroless plating operation. The structure is submerged in an electroless nickel plating solution such as Enthone Enplate NI-424 at 85° C. Pad 416 includes an exposed nickel surface layer and therefore is catalytic to electroless nickel. Connection joint 468 plates on pad 416 and eventually contacts and electrically connects pad 416 and routing line 436 in through-hole 482. The electroless nickel plating operation continues until connection joint 468 is about 10 microns thick. Thereafter, the structure is removed from the electroless nickel plating solution and rinsed in distilled water.

Thereafter, insulative base 476 and plated terminal 478 are formed.

Semiconductor chip assembly 498 includes chip 410, routing line 436, bumped terminal 438, metal filler 454, adhesive 466, connection joint 468, encapsulant 470, insulative base 476 and plated terminal 478.

Figure 27A:
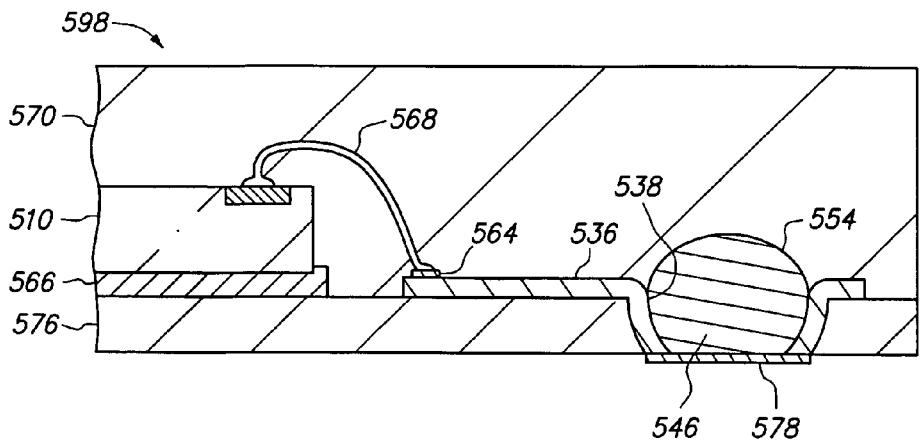
FIGS. 27A, 27B and 27C are cross-sectional, top and bottom views, respectively, of a semiconductor chip assembly in accordance with a fifth embodiment of the present invention.
Figure 27B:
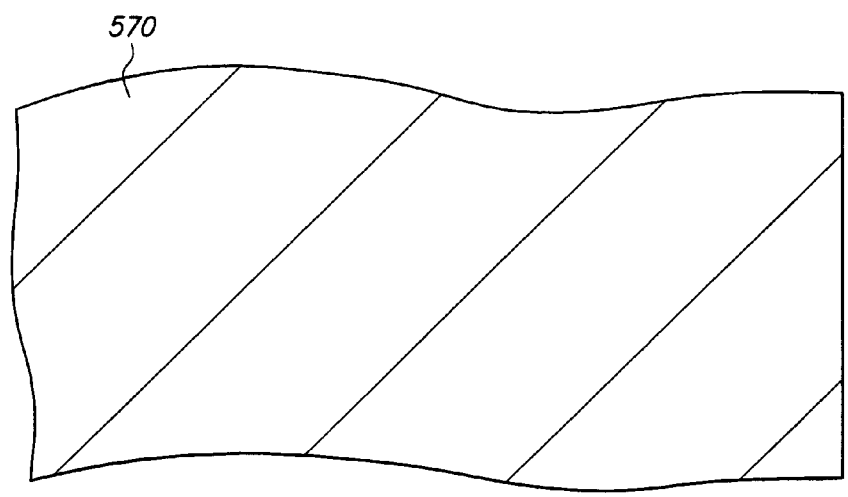
Figure 27C:
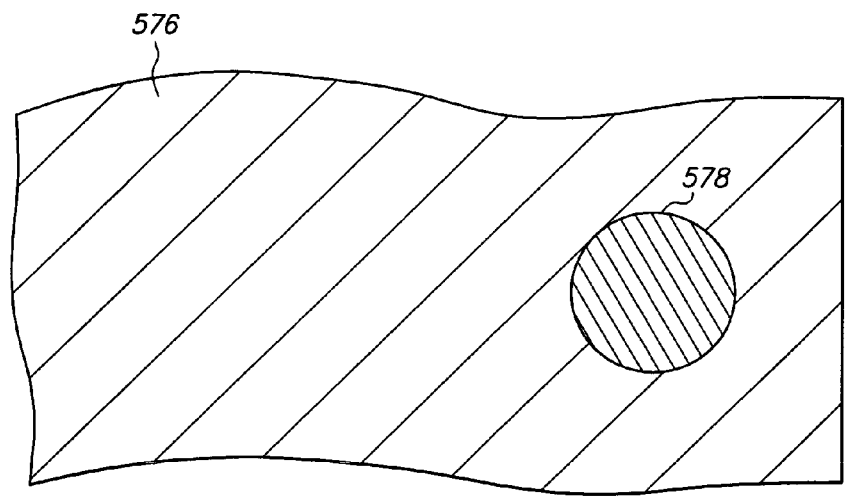

FIGS. 27A, 27B and 27C are cross-sectional, top and bottom views, respectively, of a semiconductor chip assembly in accordance with a fifth embodiment of the present invention. In the fifth embodiment, the metal filler is solder. For purposes of brevity, any description in the first embodiment is incorporated herein insofar as the same is applicable, and the same description need not be repeated. Likewise, elements of the fifth embodiment similar to those in the first embodiment have corresponding reference numerals indexed at five-hundred rather than one-hundred. For instance, chip 510 corresponds to chip 110, routing line 536 corresponds to routing line 136, etc.

Metal filler 554 is formed by depositing solder paste into cavity 546 and then reflowing the solder paste. Metal filler 554 is a solder ball that fills cavity 546, is disposed within the surface area of bumped terminal 538 and does not cover bumped terminal 538 in the upward direction, is spaced from routing line 536 and has a non-uniform thickness. The photoresist layers (corresponding to photoresist layers 150 and 152) and related electroplating operation for the metal filler are omitted.

Semiconductor chip assembly 598 includes chip 510, routing line 536, bumped terminal 538, metal filler 554, plated contact 564, adhesive 566, connection joint 568, encapsulant 570, insulative base 576 and plated terminal 578.

Figure 28A:
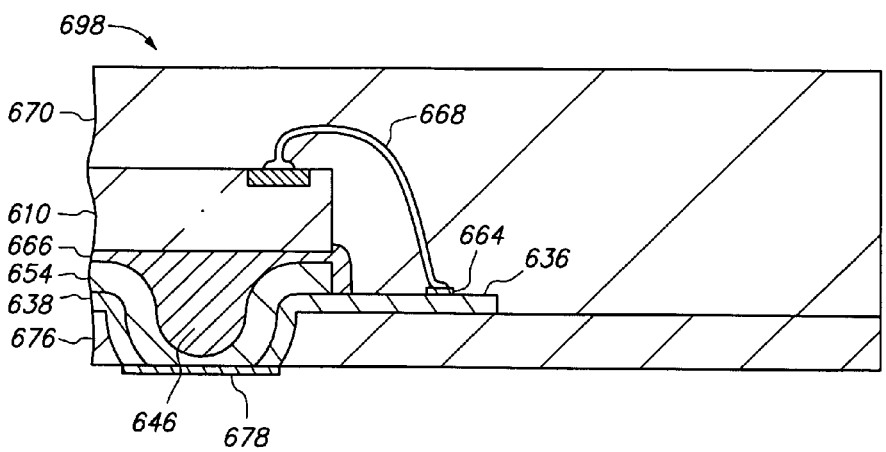
FIGS. 28A, 28B and 28C are cross-sectional, top and bottom views, respectively, of a semiconductor chip assembly in accordance with a sixth embodiment of the present invention.
Figure 28B:
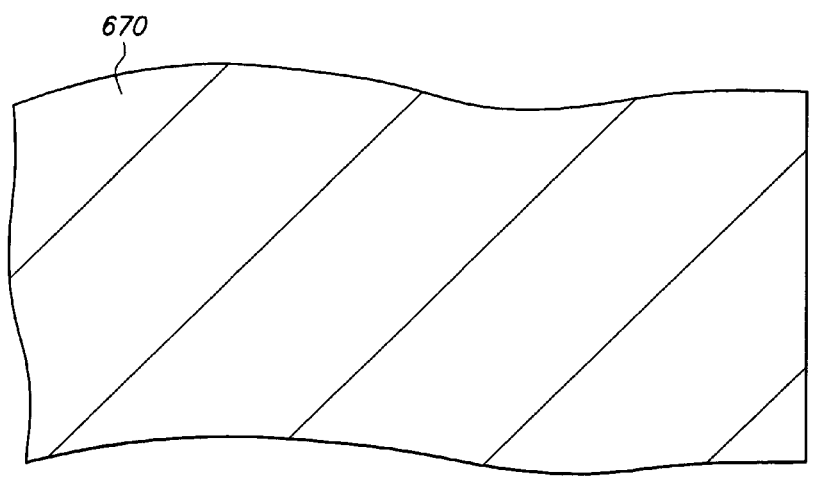
Figure 28C:
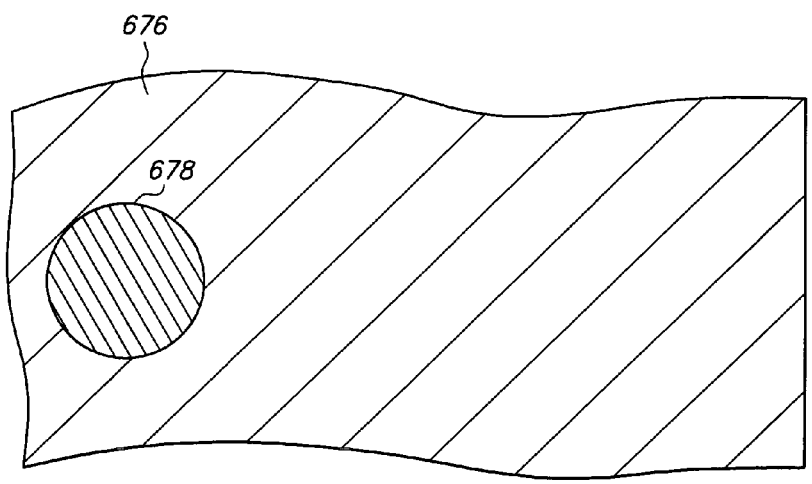

FIGS. 28A, 28B and 28C are cross-sectional, top and bottom views, respectively, of a semiconductor chip assembly in accordance with a sixth embodiment of the present invention. In the sixth embodiment, the adhesive extends into the cavity. For purposes of brevity, any description in the first embodiment is incorporated herein insofar as the same is applicable, and the same description need not be repeated. Likewise, elements of the sixth embodiment similar to those in the first embodiment have corresponding reference numerals indexed at six-hundred rather than one-hundred. For instance, chip 610 corresponds to chip 110, routing line 636 corresponds to routing line 136, etc.

Routing line 636 extends within and outside the periphery of chip 610, and bumped terminal 638 and metal filler 654 are disposed within the periphery of chip 610. This is accomplished by a slight adjustment to the etching operation previously described for recess 130 and the electroplating operations previously described for routing line 136, bumped terminal 138 and metal filler 154. In particular, the photoresist layer (corresponding to photoresist layer 126) is patterned to laterally shift the opening for the recess (corresponding to recess 130), and therefore the recess is laterally shifted relative to recess 130. Thereafter, the photoresist layer (corresponding to photoresist layer 132) is patterned to reshape the opening for routing line 636 and bumped terminal 638, and therefore routing line 636 is lengthened relative to routing line 136 and bumped terminal 638 is laterally shifted relative to bumped terminal 138. Thereafter, the photoresist layer (corresponding to photoresist layer 150) is patterned to laterally shift the opening for metal filler 654, and therefore metal filler 654 is laterally shifted relative to metal filler 154. As a result, bumped terminal 638, metal filler 654 and plated terminal 678 are disposed within the periphery of chip 610, adhesive 666 extends into cavity 646 and encapsulant 670 does not extend into cavity 646. Furthermore, metal filler 654 and adhesive 666 fill cavity 646.

Semiconductor chip assembly 698 includes chip 610, routing line 636, bumped terminal 638, metal filler 654, plated contact 664, adhesive 666, connection joint 668, encapsulant 670, insulative base 676 and plated terminal 678.

Figure 29A:
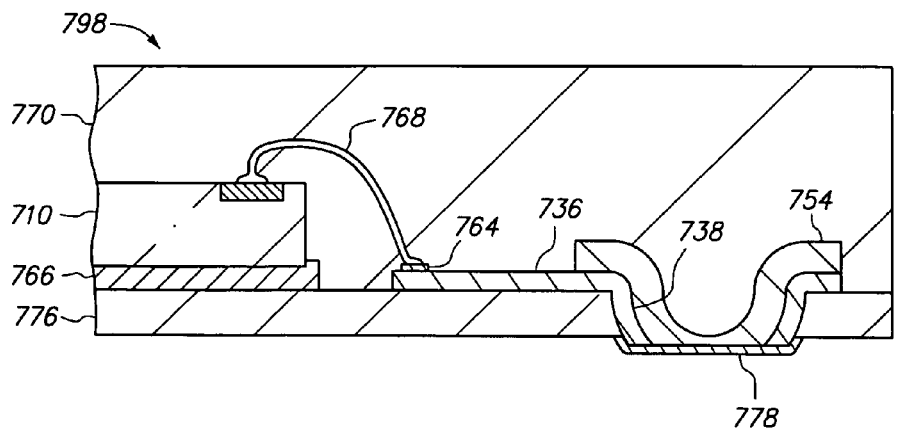
FIGS. 29A, 29B and 29C are cross-sectional, top and bottom views, respectively, of a semiconductor chip assembly in accordance with a seventh embodiment of the present invention.
Figure 29B:
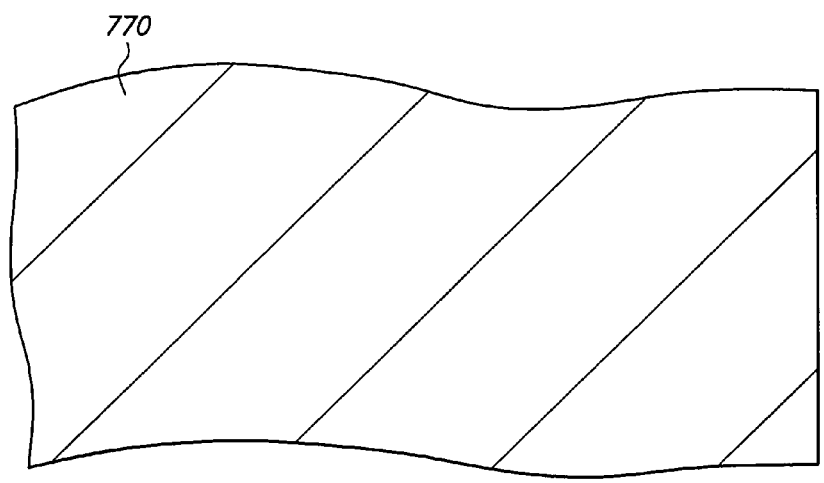
Figure 29C:
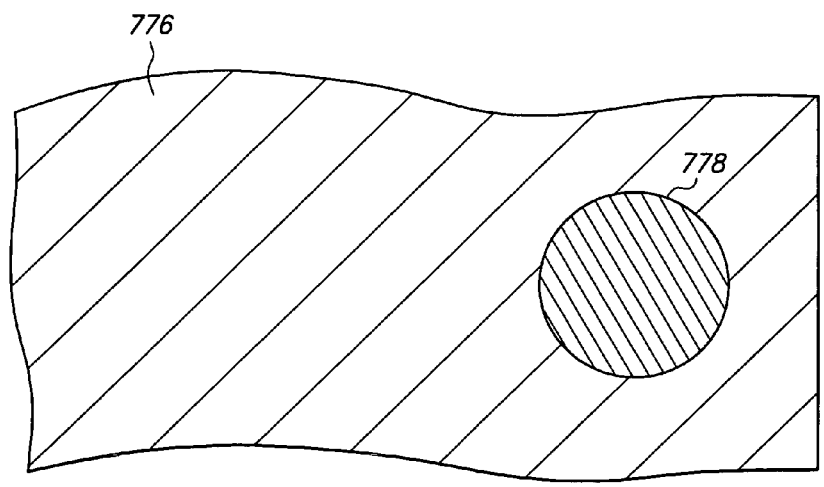

FIGS. 29A, 29B and 29C are cross-sectional, top and bottom views, respectively, of a semiconductor chip assembly in accordance with a seventh embodiment of the present invention. In the seventh embodiment, the insulative base is recessed relative to the bumped terminal and the metal filler. For purposes of brevity, any description in the first embodiment is incorporated herein insofar as the same is applicable, and the same description need not be repeated. Likewise, elements of the seventh embodiment similar to those in the first embodiment have corresponding reference numerals indexed at seven-hundred rather than one-hundred. For instance, chip 710 corresponds to chip 110, routing line 736 corresponds to routing line 136, etc.

Insulative base 776 is formed without a filler. As a result, insulative base 776 is more susceptible to plasma etching than insulative base 176. After the grinding operation, a blanket back-side plasma etch is applied to the structure. The plasma etch is highly selective of epoxy with respect to copper and nickel, and therefore, highly selective of insulative base 776 with respect to bumped terminal 738 and metal filler 754. The plasma etch removes a 20 micron thick lower portion of insulative base 776. As a result, bumped terminal 738 and metal filler 754 extend downwardly beyond insulative base 776, and thus insulative base 776 is recessed relative to bumped terminal 738 and metal filler 754 in the downward direction.

Thereafter, plated terminal 778 is formed.

Semiconductor chip assembly 798 includes chip 710, routing line 736, bumped terminal 738, metal filler 754, plated contact 764, adhesive 766, connection joint 768, encapsulant 770, insulative base 776 and plated terminal 778.

Figure 30A:
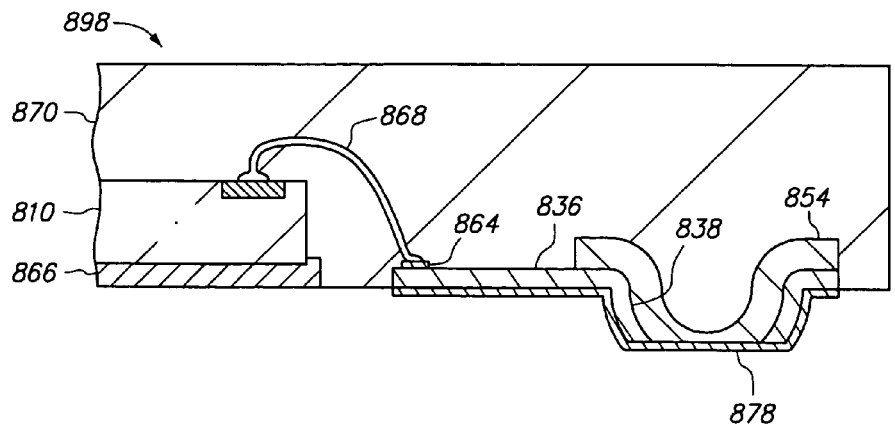
FIGS. 30A, 30B and 30C are cross-sectional, top and bottom views, respectively, of a semiconductor chip assembly in accordance with an eighth embodiment of the present invention.
Figure 30B:
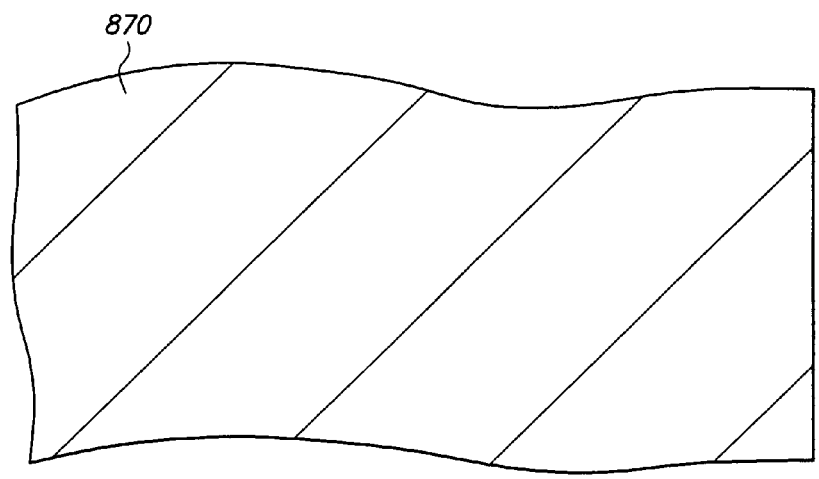
Figure 30C:
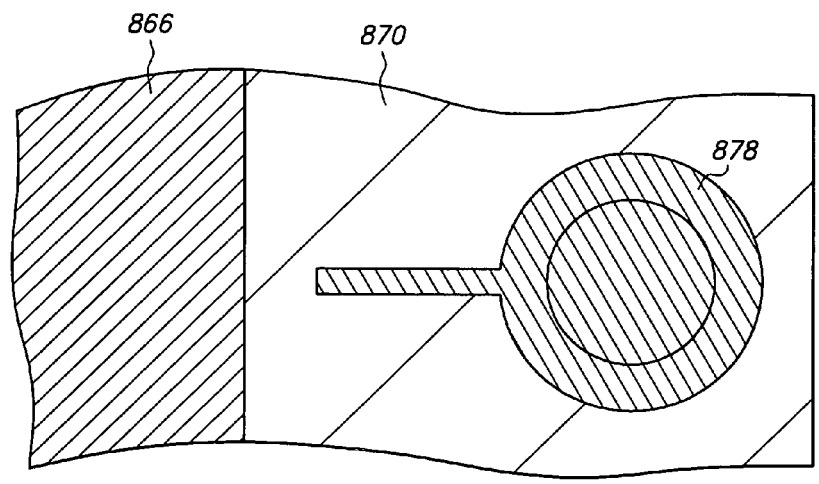

FIGS. 30A, 30B and 30C are cross-sectional, top and bottom views, respectively, of a semiconductor chip assembly in accordance with an eighth embodiment of the present invention. In the eighth embodiment, the insulative base is omitted. For purposes of brevity, any description in the first embodiment is incorporated herein insofar as the same is applicable, and the same description need not be repeated. Likewise, elements of the eighth embodiment similar to those in the first embodiment have corresponding reference numerals indexed at eight-hundred rather than one-hundred. For instance, chip 810 corresponds to chip 110, routing line 836 corresponds to routing line 136, etc.

Semiconductor chip assembly 898 includes chip 810, routing line 836, bumped terminal 838, metal filler 854, plated contact 864, adhesive 866, connection joint 868, encapsulant 870, insulative base 876 and plated terminal 878.

Figure 31A:
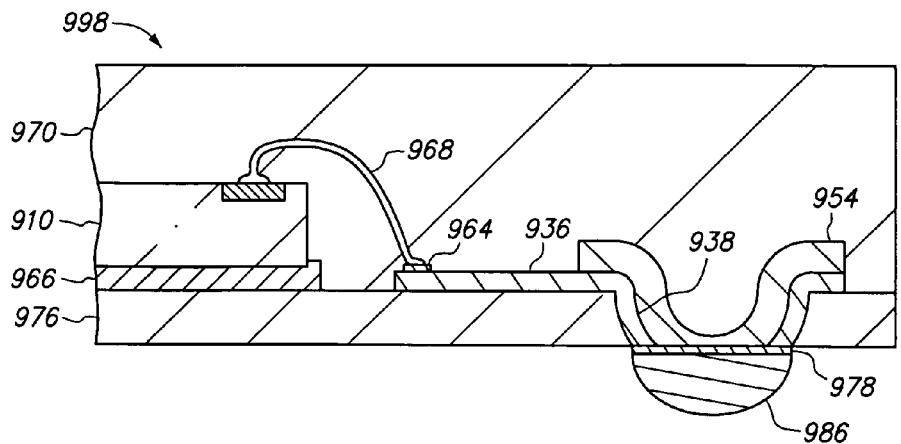
FIGS. 31A, 31B and 31C are cross-sectional, top and bottom views, respectively, of a semiconductor chip assembly in accordance with a ninth embodiment of the present invention.
Figure 31B:
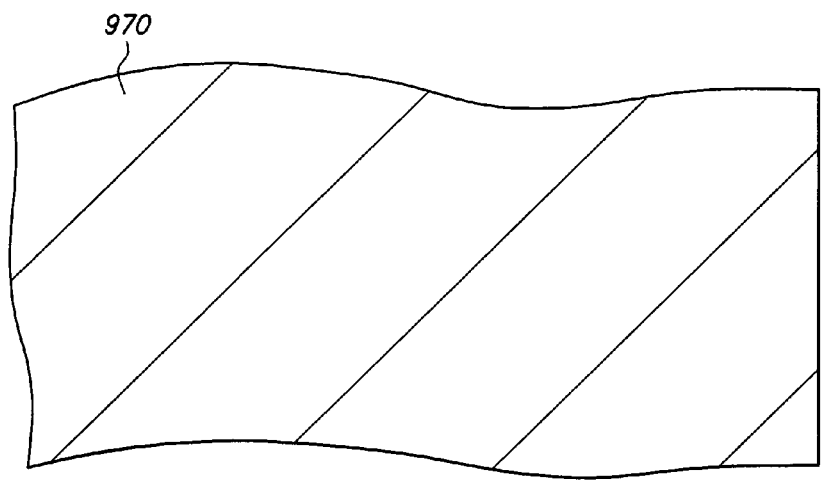
Figure 31C:
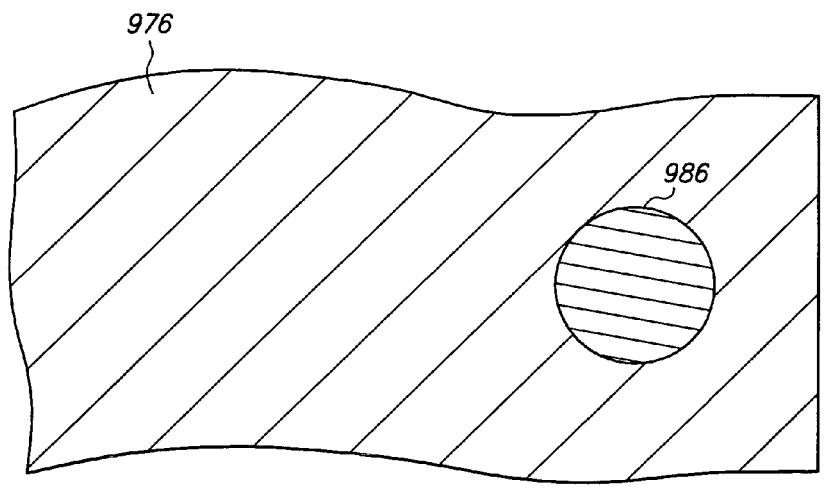

FIGS. 31A, 31B and 31C are cross-sectional, top and bottom views, respectively, of a semiconductor chip assembly in accordance with a ninth embodiment of the present invention. In the ninth embodiment, the assembly includes a solder terminal. For purposes of brevity, any description in the first embodiment is incorporated herein insofar as the same is applicable, and the same description need not be repeated. Likewise, elements of the ninth embodiment similar to those in the first embodiment have corresponding reference numerals indexed at nine-hundred rather than one-hundred. For instance, chip 910 corresponds to chip 110, routing line 936 corresponds to routing line 136, etc.

Solder terminal 986 is initially a tin-lead ball with a spherical shape. The tin-lead ball is dipped in flux to provide solder terminal 986 with a flux surface coating that surrounds the tin-lead ball. Thereafter, the structure is inverted so that plated terminal 978 faces upwardly, and solder terminal 986 is deposited on plated terminal 978. Solder terminal 986 weakly adheres to plated terminal 978 due to the flux surface coating of solder terminal 986. Thereafter, heat is applied to reflow solder terminal 986. Plated terminal 978 contains a gold surface layer that provides a wettable surface for solder reflow. As a result, solder terminal 986 wets plated terminal 978. The heat is then removed and solder terminal 986 cools and solidifies.

Solder terminal 986 contacts and is electrically connected to plated terminal 978 and extends downwardly beyond insulative base 976 and plated terminal 978. Thus, solder terminal 986 provides a reflowable electrical connection to plated terminal 978, and the assembly is a ball grid array (BGA) package.

Semiconductor chip assembly 998 includes chip 910, routing line 936, bumped terminal 938, metal filler 954, plated contact 964, adhesive 966, connection joint 968, encapsulant 970, insulative base 976, plated terminal 978 and solder terminal 986.

Figure 32A:
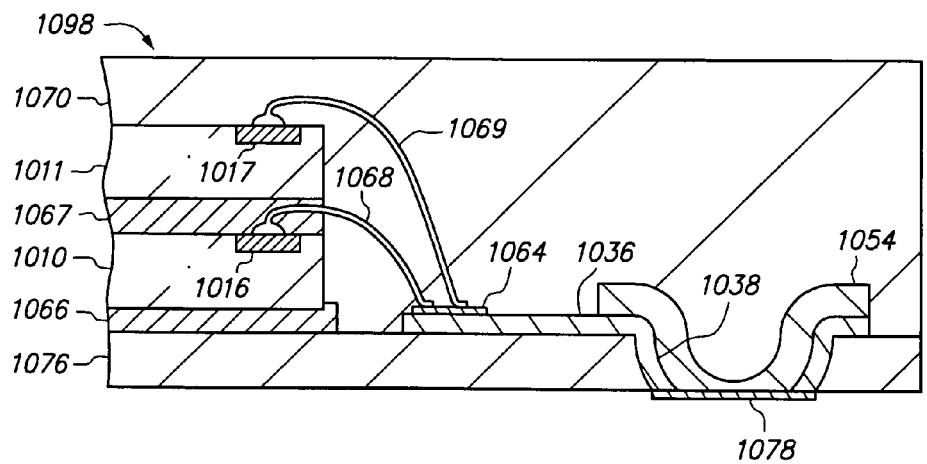
FIGS. 32A, 32B and 32C are cross-sectional, top and bottom views, respectively, of a semiconductor chip assembly in accordance with a tenth embodiment of the present invention.
Figure 32B:
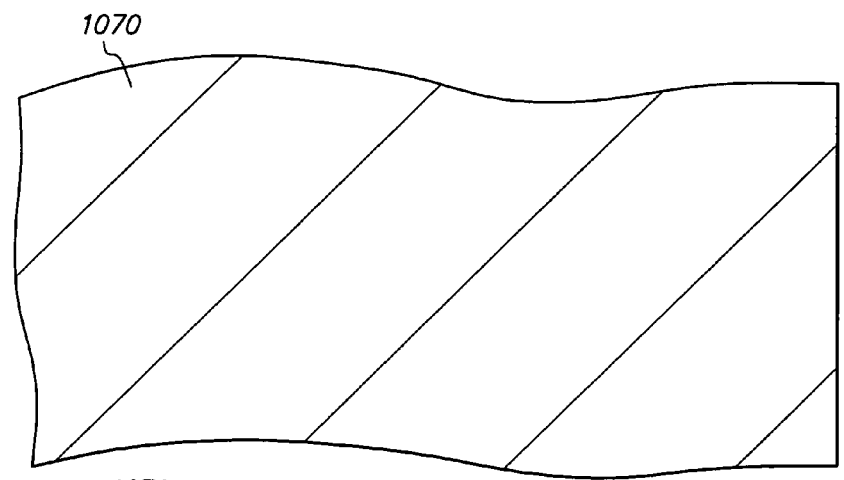
Figure 32C:
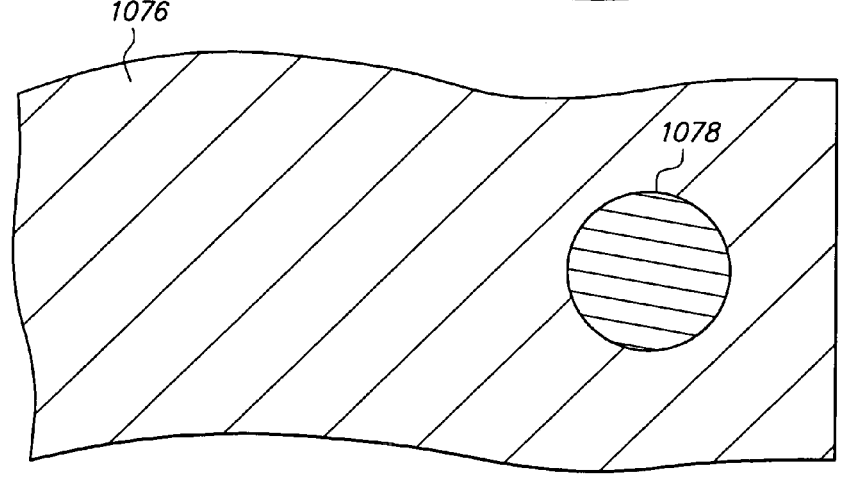

FIGS. 32A, 32B and 32C are cross-sectional, top and bottom views, respectively, of a semiconductor chip assembly in accordance with a tenth embodiment of the present invention. In the tenth embodiment, the assembly is a multi-chip package. For purposes of brevity, any description in the first embodiment is incorporated herein insofar as the same is applicable, and the same description need not be repeated. Likewise, elements of the tenth embodiment similar to those in the first embodiment have corresponding reference numerals indexed at one-thousand rather than one-hundred. For instance, chip 1010 corresponds to chip 110, routing line 1036 corresponds to routing line 136, etc.

Plated contact 1064 is lengthened. This is accomplished by a slight adjustment to the electroplating operation previously described for plated contact 164. In particular, the photoresist layer (corresponding to photoresist layer 160) is patterned to lengthen the opening for plated contact 1064, and therefore plated contact 1064 is lengthened relative to plated contact 164.

Chip 1010 is mechanically attached to routing line 1036, bumped terminal 1038, metal filler 1054 and plated contact 1064 by adhesive 1066 and electrically connected to routing line 1036 by connection joint 1068.

Thereafter, adhesive 1067 is deposited as a spacer paste that includes silicon spacers on chip 1010, then chip 1011 (which includes pad 1017 and is essentially identical to chip 1010) is placed on adhesive 1067 such that adhesive 1067 contacts and is sandwiched between chips 1010 and 1011, and then the structure is placed in an oven and adhesive 1067 is fully cured (C stage) at relatively low temperature in the range of 100 to 200° C. to form a solid adhesive insulative layer that mechanically attaches chips 1010 and 1011. Adhesive 1067 is 100 microns thick between chips 1010 and 1011, and chips 1010 and 1011 are spaced and separated from and vertically aligned with one another. A suitable spacer paste is Hysol QMI 500.

Thereafter, chip 1011 is electrically connected to routing line 1036 by connection joint 1069 in the same manner that chip 1010 is electrically connected to routing line 1036 by connection joint 1068.

Thereafter, encapsulant 1070 with a thickness of 700 microns (rather than 400 microns) is formed so that encapsulant 1070 contacts and covers chips 1010 and 1011, routing line 1036, bumped terminal 1038, metal filler 1054, adhesives 1066 and 1067 and connection joints 1068 and 1069, and then insulative base 1076 and plated terminal 1078 are formed.

The semiconductor chip assembly is a multi-chip first-level package. Chips 1010 and 1011 are embedded in encapsulant 1070. Furthermore, an electrically conductive path between pad 1016 and bumped terminal 1038 and between pad 1016 and metal filler 1054 not only includes but also requires routing line 1036, and an electrically conductive path between pad 1017 and bumped terminal 1038 and between pad 1017 and metal filler 1054 not only includes but also requires routing line 1036. Thus, chips 1010 and 1011 are both embedded in encapsulant 1070 and electrically connected to bumped terminal 1038 and metal filler 1054 by an electrically conductive path that includes routing line 1036.

Semiconductor chip assembly 1098 includes chips 1010 and 1011, routing line 1036, bumped terminal 1038, metal filler 1054, plated contact 1064, adhesives 1066 and 1067, connection joints 1068 and 1069, encapsulant 1070, insulative base 1076 and plated terminal 1078.

The semiconductor chip assemblies described above are merely exemplary. Numerous other embodiments are contemplated. For instance, the plated contact, plated terminal and insulative base can be omitted. In addition, the embodiments described above can generally be combined with one another. For instance, the flip-chip in the second embodiment and the plated connection joints in the third and fourth embodiments can be used in the other embodiments except for the multi-chip assembly in the tenth embodiment since the chips are not inverted. Likewise, the solder metal filler in the fifth embodiment, the adhesive-containing cavity in the sixth embodiment, the recessed insulative base in the seventh embodiment, the omitted insulative base in the eighth embodiment and the solder terminal in the ninth embodiment can be used in the other embodiments. Likewise, the multi-chip assembly in the tenth embodiment can be used in the other embodiments except for the second to fourth embodiments since the chips are inverted. The embodiments described above can be mixed-and-matched with one another and with other embodiments depending on design and reliability considerations.

The metal base need not necessarily be removed. For instance, a portion of the metal base that extends within the periphery of the chip and is spaced from the routing line and the bumped terminal can remain intact and provide a heat sink.

The routing line can be various conductive metals including copper, gold, nickel, silver, palladium, tin, combinations thereof, and alloys thereof. The preferred composition of the routing line will depend on the nature of the connection joint as well as design and reliability factors. Furthermore, those skilled in the art will understand that in the context of a semiconductor chip assembly, a copper material is typically a copper alloy that is mostly copper but not pure elemental copper, such copper-zirconium (99.9% copper), copper-silver-phosphorus-magnesium (99.7% copper), or copper-tin-iron-phosphorus (99.7% copper). Likewise, the routing line can fan-in as well as fan-out.

The routing line can be formed on the metal base by numerous deposition techniques including electroplating and electroless plating. In addition, the routing line can be deposited on the metal base as a single layer or multiple layers. For instance, the routing line can be a 10 micron layer of gold, or alternatively, a 9.5 micron layer of nickel electroplated on a 0.5 micron layer of gold electroplated on a copper base to reduce costs, or alternatively, a 9 micron layer of nickel electroplated on a 0.5 micron layer of gold electroplated on a 0.5 micron layer of tin electroplated on a copper base to reduce costs and avoid gold-copper alloys that may be difficult to remove when the copper base is etched. As another example, the routing line can consist of a non-copper layer electroplated on a copper base and a copper layer electroplated on the non-copper layer. Suitable non-copper layers include nickel, gold, palladium and silver. After the routing line is formed, a wet chemical etch can be applied that is highly selective of copper with respect to the non-copper layer to etch the copper base and expose the routing line without removing the copper or non-copper layers. The non-copper layer provides an etch stop that prevents the wet chemical etch from removing the copper layer. Furthermore, it is understood that in the context of the present invention, the routing line and the metal base are different metals (or metallic materials) even if a multi-layer routing line includes a single layer that is similar to the metal base (such as the example described above) or a single layer of a multi-layer metal base.

The routing line can also be formed by etching a metal layer attached to the metal base. For instance, a photoresist layer can be formed on the metal layer, the metal layer can be etched using the photoresist layer as an etch mask, and then the photoresist layer can be stripped. Alternatively, a photoresist layer can be formed on the metal layer, a plated metal can be selectively electroplated on the metal layer using the photoresist layer as a plating mask, the photoresist layer can be stripped, and then the metal layer can be etched using the plated metal as an etch mask. In this manner, the routing line can be formed semi-additively and include unetched portions of the metal layer and the plated metal. Likewise, the routing line can be formed subtractively from the metal layer, regardless of whether the plated metal etch mask remains attached to the routing line.

The routing line can be spot plated near the pad to make it compatible with receiving the connection joint. For instance, a copper routing line can be spot plated with nickel and then silver to make it compatible with a gold ball bond connection joint and avoid the formation of brittle silver-copper intermetallic compounds. Likewise, the bumped terminal can be spot plated in the cavity to make it compatible with receiving the metal filler. For instance, a copper bumped terminal can be spot plated in the cavity with nickel and then gold to facilitate solder reflow of a solder metal filler in the cavity.

The bumped terminal can be formed in the same manner as and simultaneously with the routing line.

The metal filler can be various conductive metals including copper, gold, nickel, silver, palladium, tin, solder, combinations thereof, and alloys thereof, and can be deposited on the bumped terminal and into the cavity by a wide variety of processes including electroplating, electroless plating, evaporating, sputtering, solder reflowing, conductive adhesive curing, dispensing and welding, and can have a wide variety of shapes and sizes.

The bumped terminal and the metal filler can be uncovered in the downward direction by the encapsulant, the insulative base or any other insulative material of the assembly. For instance, the bumped terminal and the metal filler can be exposed in the downward direction, or alternatively, the bumped terminal and the metal filler can be unexposed in the downward direction and a plated terminal that contacts and is overlapped by the bumped terminal and the metal filler can be exposed in the downward direction, or alternatively, the bumped terminal and the metal filler can be unexposed in the downward direction, a plated terminal that contacts and is overlapped by the bumped terminal and the metal filler can be unexposed in the downward direction, and a solder terminal that contacts and is overlapped by the plated terminal and is spaced from and overlapped by the bumped terminal and the metal filler can be exposed in the downward direction, or alternatively, the bumped terminal and the metal filler can be covered in the downward direction by an insulative material external to the assembly such as another semiconductor chip assembly in a stacked arrangement. In every case, the bumped terminal and the metal filler are not covered in the downward direction by the encapsulant, the insulative base or any other insulative material of the assembly.

The conductive trace can function as a signal, power or ground layer depending on the purpose of the associated chip pad.

The pad can have numerous shapes including a flat rectangular shape and a bumped shape. If desired, the pad can be treated to accommodate the connection joint.

Numerous adhesives can be applied to mechanically attach the chip to the metal base. For instance, the adhesive can be applied as a paste, a laminated layer, or a liquid applied by screen-printing, spin-on, or spray-on. The adhesive can be a single layer that is applied to the metal base or a solder mask and then contacted to the chip or a single layer that is applied to the chip and then contacted to the metal base or a solder mask. Similarly, the adhesive can be multiple layers with a first layer applied to the metal base or a solder mask, a second layer applied to the chip and then the layers contacted to one another. Thermosetting adhesive liquids and pastes such as epoxies are generally suitable. Likewise, thermoplastic adhesives such as an insulative thermoplastic polyimide film with a glass transition temperature (Tg) of 400° C. are also generally suitable. Silicone adhesives are also generally suitable.

The encapsulant can be deposited using a wide variety of techniques including printing and transfer molding. For instance, the encapsulant can be printed on the chip and the metal filler as an epoxy paste and then cured or hardened to form a solid adherent protective layer. The encapsulant can be any of the adhesives mentioned above. Moreover, the encapsulant need not necessarily contact the chip or the metal filler. For instance, a glob-top coating can be deposited on the chip after attaching the chip to the metal filler, and then the encapsulant can be formed on the glob-top coating. Likewise, a coating (such as flux or solder) can be deposited on the metal filler, and then the encapsulant can be formed on the coating.

The insulative base may be rigid or flexible, and can be various dielectric films or prepregs formed from numerous organic or inorganic insulators such as tape (polyimide), epoxy, silicone, glass, aramid and ceramic. Organic insulators are preferred for low cost, high dielectric applications, whereas inorganic insulators are preferred when high thermal dissipation and a matched thermal coefficient of expansion are important. For instance, the insulative base can initially be an epoxy paste that includes an epoxy resin, a curing agent, an accelerator and a filler, that is subsequently cured or hardened to form a solid adherent insulative layer.

The filler can be an inert material such as silica (powdered fused quartz) that improves thermal conductivity, thermal shock resistance and thermal coefficient of expansion matching. Organic fiber reinforcement may also be used in resins such as epoxy, cyanate ester, polyimide, PTFE and combinations thereof. Fibers that may be used include aramid, polyester, polyamide, poly-ether-ether-ketone, polyimide, polyetherimide and polysulfone. The fiber reinforcement can be woven fabric, woven glass, random microfiber glass, woven quartz, woven, aramid, non-woven fabric, non-woven aramid fiber or paper. Commercially available dielectric materials such as SPEEDBOARD C prepreg by W. L. Gore & Associates of Eau Claire, Wis. are suitable.

The insulative base can be deposited in numerous manners, including printing and transfer molding. Furthermore, the insulative base can be formed before or after attaching the chip to the routing line.

The insulative base can have its lower portion removed using a wide variety of techniques including grinding (including mechanical polishing and chemical-mechanical polishing), blanket laser ablation and blanket plasma etching. Likewise, the insulative base can have a selected portion below the bumped terminal and the metal filler removed using a wide variety of techniques including selective laser ablation, selective plasma etching and photolithography.

The insulative base can be laterally aligned with the bumped terminal and the metal filler along a downwardly facing surface that extends downwardly beyond the routing line by grinding the insulative base without grinding the bumped terminal or the metal filler, then grinding the insulative base and the bumped terminal without grinding the metal filler, then grinding the insulative base, the bumped terminal and the metal filler, and then discontinuing the grinding before reaching the routing line.

The connection joint can be formed from a wide variety of materials including copper, gold, nickel, palladium, tin, alloys thereof, and combinations thereof, can be formed by a wide variety of processes including electroplating, electroless plating, ball bonding, wire bonding, stud bumping, solder reflowing, conductive adhesive curing, and welding, and can have a wide variety of shapes and sizes. The shape and composition of the connection joint depends on the composition of the routing line as well as design and reliability considerations. Further details regarding an electroplated connection joint are disclosed in U.S. application Ser. No. 09/865,367 filed May 24, 2001 by Charles W. C. Lin entitled "Semiconductor Chip Assembly with Simultaneously Electroplated Contact Terminal and Connection Joint" which is incorporated by reference. Further details regarding an electrolessly plated connection joint are disclosed in U.S. application Ser. No. 09/864,555 filed May 24, 2001 by Charles W. C. Lin entitled "Semiconductor Chip Assembly with Simultaneously Electrolessly Plated Contact Terminal and Connection Joint" which is incorporated by reference. Further details regarding a ball bond connection joint are disclosed in U.S. application Ser. No. 09/864,773 filed May 24, 2001 by Charles W. C. Lin entitled "Semiconductor Chip Assembly with Ball Bond Connection Joint" which is incorporated by reference. Further details regarding a solder or conductive adhesive connection joint are disclosed in U.S. application Ser. No. 09/927,216 filed Aug. 10, 2001 by Charles W. C. Lin entitled "Semiconductor Chip Assembly with Hardened Connection Joint" which is incorporated by reference. Further details regarding a welded connection joint are disclosed in U.S. application Ser. No. 10/302,642 filed Nov. 23, 2002 by Cheng-Lien Chiang et al. entitled "Method of Connecting a Conductive Trace to a Semiconductor Chip Using Plasma Undercut Etching" which is incorporated by reference.

After the connection joint is formed, if a plating bus exists then it is disconnected from the conductive trace. The plating bus can be disconnected by mechanical sawing, laser cutting, chemical etching, and combinations thereof. If the plating bus is disposed about the periphery of the assembly but is not integral to the assembly, then the plating bus can be disconnected when the assembly is singulated from other assemblies. However, if the plating bus is integral to the assembly, or singulation has already occurred, then a photolithography step can be added to selectively cut related circuitry on the assembly that is dedicated to the plating bus since this circuitry would otherwise short the conductive traces together. Furthermore, the plating bus can be disconnected by etching the metal base.

A soldering material or solder ball can be deposited on the conductive trace by plating or printing or placement techniques if required for the next level assembly. However, the next level assembly may not require that the semiconductor chip assembly contain solder. For instance, in land grid array (LGA) packages, the soldering material is normally provided by the panel rather than the contact terminals on the semiconductor chip assembly.

Various cleaning steps, such as a brief oxygen plasma cleaning step, or a brief wet chemical cleaning step using a solution containing potassium permanganate, can be applied to the structure at various stages, such as immediately before forming the connection joint to clean the conductive trace and the pad.

It is understood that, in the context of the present invention, any chip embedded in the encapsulant is electrically connected to the bumped terminal and the metal filler by an electrically conductive path that includes the routing line means that the routing line is in an electrically conductive path between the bumped terminal and any chip embedded in the encapsulant and between the metal filler and any chip embedded in the encapsulant. This is true regardless of whether a single chip is embedded in the encapsulant (in which case the chip is electrically connected to the bumped terminal and the metal filler by an electrically conductive path that includes the routing line) or multiple chips are embedded in the encapsulant (in which case each of the chips is electrically connected to the bumped terminal and the metal filler by an electrically conductive path that includes the routing line). This is also true regardless of whether the electrically conductive path includes or requires a connection joint and/or a plated contact between the routing line and the chip. This is also true regardless of whether the electrically conductive path includes or requires a passive component such as a capacitor or a resistor. This is also true regardless of whether multiple chips are electrically connected to the routing line by multiple connection joints, and the multiple connection joints are electrically connected to one another only by the routing line. This is also true regardless of whether multiple chips are electrically connected to the bumped terminal and the metal filler by different electrically conductive paths (such as the multiple connection joint example described above) as long as each of the electrically conductive paths includes the routing line.

The "upward" and "downward" vertical directions do not depend on the orientation of the assembly, as will be readily apparent to those skilled in the art. For instance, the encapsulant extends vertically beyond the routing line in the "upward" direction, the bumped terminal extends vertically beyond the routing line in the "downward" direction and the insulative base extends vertically beyond the encapsulant in the "downward" direction, regardless of whether the assembly is inverted and/or mounted on a printed circuit board. Likewise, the routing line extends "laterally" beyond the bumped terminal and the metal filler regardless of whether the assembly is inverted, rotated or slated. Thus, the "upward" and "downward" directions are opposite one is another and orthogonal to the "lateral" direction, and the "laterally aligned" surfaces are coplanar with one another in a lateral plane orthogonal to the upward and downward directions. Moreover, the chip is shown above the routing line, the bumped terminal and the insulative base, and the encapsulant is shown above the chip, the routing line, the bumped terminal, the metal filler and the insulative base with a single orientation throughout the drawings for ease of comparison between the figures, although the assembly and its components may be inverted at various manufacturing stages.

The working format for the semiconductor chip assembly can be a single assembly or multiple assemblies based on the manufacturing design. For instance, a single assembly that includes a single chip can be manufactured individually. Alternatively, numerous assemblies can be simultaneously batch manufactured on a single metal base with a single encapsulant and a single insulative base then separated from one another. For example, routing lines and bumped terminals for multiple assemblies can be simultaneously electroplated on the metal base, then metal fillers can be simultaneously electroplated on the corresponding bumped terminals, then plated contacts can be simultaneously electroplated on the corresponding routing lines, then separate spaced adhesives for the respective assemblies can be selectively disposed on the metal base, then the chips can be disposed on the corresponding adhesives, then the adhesives can be simultaneously fully cured, then the connection joints can be formed on the corresponding plated contacts and pads, then the encapsulant can be formed, then the metal base can be etched and removed, then the insulative base can be formed, then the insulative base, the bumped terminals and the metal fillers can be grinded, then the plated terminals can be simultaneously electrolessly plated on the corresponding bumped terminals and metal fillers, and then the encapsulant and the insulative base can be cut, thereby separating the individual single chip-substrate assemblies.

The semiconductor chip assembly can have a wide variety of packaging formats as required by the next level assembly. For instance, the conductive traces can be configured so that the assembly is a grid array such as a ball grid array (BGA), column grid array (CGA), land grid array (LGA) or pin grid array (PGA).

The semiconductor chip assembly can be a first-level package that is a single-chip package (such as the first to ninth embodiments) or a multi-chip package (such as the tenth embodiment). Furthermore, a multi-chip first-level package can include chips that are stacked and vertically aligned with one another or are coplanar and laterally aligned with one another.

Advantageously, the semiconductor chip assembly of the present invention is reliable and inexpensive. The encapsulant and the insulative base can protect the chip from handling damage, provide a known dielectric barrier for the conductive trace and protect the assembly from contaminants and unwanted solder reflow during the next level assembly. The encapsulant can provide mechanical support for the conductive trace as the metal base is etched and removed. In addition, the metal filler can contact the bumped terminal in the cavity, thereby improving reliability. The mode of the connection can shift from the initial mechanical coupling to metallurgical coupling to assure sufficient metallurgical bond strength. Furthermore, the conductive trace can be mechanically and metallurgically coupled to the chip without wire bonding, TAB, solder or conductive adhesive, although the process is flexible enough to accommodate these techniques if desired. The process is highly versatile and permits a wide variety of mature connection joint technologies to be used in a unique and improved manner. As a result, the assembly of the present invention significantly enhances throughput, yield and performance characteristics compared to conventional packaging techniques. Moreover, the assembly of the present invention is well-suited for use with materials compatible with copper chip requirements.

Various changes and modifications to the presently preferred embodiments described herein will be apparent to those skilled in the art. For instance, the materials, dimensions and shapes described above are merely exemplary. Such changes and modifications may be made without departing from the spirit and scope of the present invention as defined in the appended claims.

We claim:

1. A semiconductor chip assembly, comprising:
   a semiconductor chip that includes first and second opposing surfaces, wherein the first surface of the chip includes a conductive pad;
   a conductive trace that includes a routing line, a bumped terminal and a metal filler, wherein the bumped terminal includes a cavity;
   a connection joint that electrically connects the routing line and the pad; and
   an encapsulant that includes first and second opposing surfaces, wherein the first surface of encapsulant faces in a first direction, the second surface of the encapsulant faces in a second direction opposite the first direction, the chip is embedded in the encapsulant, the routing line extends laterally beyond the bumped terminal and the metal filler and extends vertically beyond the chip in the second direction, the bumped terminal is contiguous with and integral with the routing line and extends vertically beyond the routing line in the second direction, the cavity extends through the bumped terminal in the first and second directions, the metal filler contacts the bumped terminal in the cavity, extends vertically beyond the routing line, the bumped terminal and the cavity in the first direction and extends vertically beyond the routing line in the second direction, and the bumped terminal, the cavity and the metal filler are laterally aligned with one another at a surface that faces in the second direction and are not covered in the second direction by the encapsulant or any other insulative material of the assembly.

2. The assembly of claim 1, wherein the first surface of the chip faces in the first direction, and the second surface of the chip faces in the second direction.

3. The assembly of claim 1, wherein the first surface of the chip faces in the second direction, and the second surface of the chip faces in the first direction.

4. The assembly of claim 1, wherein the chip is the only chip embedded in the encapsulant.

5. The assembly of claim 1, wherein the chip and another chip are embedded in the encapsulant.

6. The assembly of claim 1, wherein the chip extends vertically beyond the routing line, the bumped terminal and the metal filler in the first direction.

7. The assembly of claim 1, wherein any chip embedded in the encapsulant extends vertically beyond the routing line, the bumped terminal and the metal filler in the first direction.

8. The assembly of claim 1, wherein the chip extends vertically beyond the conductive trace in the first direction.

9. The assembly of claim 1, wherein the any chip embedded in the encapsulant extends vertically beyond the conductive trace in the first direction.

10. The assembly of claim 1, wherein any chip embedded in the encapsulant is electrically connected to the bumped terminal and the metal filler by an electrically conductive path that includes the routing line.

11. The assembly of claim 1, wherein the routing line extends laterally beyond the bumped terminal and the metal filler towards the chip.

12. The assembly of claim 1, wherein the routing line is disposed vertically beyond the chip in the second direction.

13. The assembly of claim 1, wherein the routing line extends within and outside a periphery of the chip.

14. The assembly of claim 1, wherein the routing line is disposed outside a periphery of the chip.

15. The assembly of claim 1, wherein the routing line is essentially flat and parallel to the first and second surfaces of the chip.

16. The assembly of claim 1, wherein the bumped terminal has a curved shape.

17. The assembly of claim 1, wherein the bumped terminal is disposed vertically beyond the routing line in the second direction.

18. The assembly of claim 1, wherein the bumped terminal is disposed within a periphery of the chip.

19. The assembly of claim 1, wherein the bumped terminal is disposed outside a periphery of the chip.

20. The assembly of claim 1, wherein the bumped terminal has a uniform thickness.

21. The assembly of claim 1, wherein the cavity includes first and second opposing ends that are adjacent to the bumped terminal, the first end of the cavity faces in the first direction, and the second end of the cavity faces in the second direction.

22. The assembly of claim 21, wherein the cavity includes tapered sidewalls that are adjacent to the first and second ends of the cavity and slant inwardly towards the second end of the cavity.

23. The assembly of claim 21, wherein the second end of the cavity is disposed within a surface area of the first end of the cavity.

24. The assembly of claim 21, wherein the second end of the cavity is disposed within a surface area of the metal filler.

25. The assembly of claim 21, wherein a surface area of the first end of the cavity is at least 20 percent larger than a surface area of the second end of the cavity.

26. The assembly of claim 21, wherein a surface area of the metal filler is at least 20 percent larger than a surface area of the second end of the cavity.

27. The assembly of claim 1, wherein the cavity extends across a majority of a diameter of the bumped terminal.

28. The assembly of claim 1, wherein the cavity extends across a majority of a height of the metal filler.

29. The assembly of claim 1, wherein the cavity extends across a majority of a diameter of the metal filler.

30. The assembly of claim 1, wherein the cavity extends across a majority of a diameter of the bumped terminal and a height and diameter of the metal filler.

31. The assembly of claim 1, wherein the metal filler includes first and second opposing surfaces, the first surface of the metal filler faces in the first direction, and the second surface of the metal filler faces in the second direction.

32. The assembly of claim 31, wherein the first surface of the metal filler extends into the cavity.

33. The assembly of claim 31, wherein the first surface of the metal filler extends into and outside the cavity.

34. The assembly of claim 31, wherein the first surface of the metal filler does not extend into the cavity.

35. The assembly of claim 1, wherein the metal filler covers the bumped terminal in the first direction.

36. The assembly of claim 1, wherein the metal filler does not cover the bumped terminal in the first direction.

37. The assembly of claim 1, wherein the metal filler fills the cavity.

38. The assembly of claim 1, wherein the metal filler does not fill the cavity.

39. The assembly of claim 1, wherein the metal filler has a uniform thickness.

40. The assembly of claim 1, wherein the metal filler does not have a uniform thickness.

41. The assembly of claim 1, wherein the connection joint is electroplated metal.

42. The assembly of claim 1, wherein the connection joint is electrolessly plated metal.

43. The assembly of claim 1, wherein the connection joint is solder.

44. The assembly of claim 1, wherein the connection joint is conductive adhesive.

45. The assembly of claim 1, wherein the connection joint is a wire bond.

46. The assembly of claim 1, wherein the encapsulant contacts the chip and covers the chip in the first direction.

47. The assembly of claim 1, wherein the encapsulant contacts the conductive trace and covers the conductive trace in the first direction.

48. The assembly of claim 1, wherein the encapsulant extends into the cavity.

49. The assembly of claim 1, wherein the encapsulant does not extend into the cavity.

50. The assembly of claim 1, wherein the encapsulant and the metal filler fill the cavity.

51. The assembly of claim 1, including an insulative base that contacts the routing line and the bumped terminal, is spaced from and overlapped by the chip and extends vertically beyond the chip, the routing line and the encapsulant in the second direction.

52. The assembly of claim 51, wherein the insulative base is spaced from the metal filler.

53. The assembly of claim 51, wherein the insulative base is laterally aligned with the bumped terminal, the cavity and the metal filler at a surface that faces in the second direction.

54. The assembly of claim 1, including an insulative adhesive that contacts the chip and the encapsulant and extends vertically beyond the chip in the second direction.

55. The assembly of claim 54, wherein the adhesive extends into the cavity.

56. The assembly of claim 54, wherein the adhesive does not extend into the cavity.

57. The assembly of claim 54, wherein the adhesive and the metal filler fill the cavity.

58. The assembly of claim 1, including a plated terminal that contacts and is electrically connected to the bumped terminal and the metal filler, is spaced from the routing line and the connection joint and extends vertically beyond the chip, the routing line, the bumped terminal, the metal filler, the connection joint and the encapsulant in the second direction.

59. The assembly of claim 58, wherein the plated terminal is exposed, and the routing line, the bumped terminal and the metal filler are unexposed.

60. The assembly of claim 1, wherein the assembly is a first-level package.

61. A semiconductor chip assembly, comprising:
a semiconductor chip that includes first and second opposing surfaces, wherein the first surface of the chip includes a conductive pad;
a conductive trace that includes a routing line, a bumped terminal and a metal filler, wherein the bumped terminal includes a cavity;
a connection joint that electrically connects the routing line and the pad; and
an encapsulant that includes first and second opposing surfaces, wherein the first surface of encapsulant faces in a first direction, the second surface of the encapsulant faces in a second direction opposite the first direction, the chip is embedded in the encapsulant, the routing line extends laterally beyond the bumped terminal and the metal filler towards the chip and extends vertically beyond the chip in the second direction, the bumped terminal is contiguous with and integral with the routing line and extends vertically beyond the routing line in the second direction, the cavity extends through the bumped terminal in the first and second directions, the metal filler contacts the bumped terminal in the cavity, extends vertically beyond the routing line, the bumped terminal and the cavity in the first direction and extends vertically beyond the routing line in the second direction, and the bumped terminal, the cavity and the metal filler are disposed outside a periphery of the chip, are laterally aligned with one another at a surface that faces in the second direction and are not covered in the second direction by the encapsulant or any other insulative material of the assembly.

62. The assembly of claim 61, wherein the chip is the only chip embedded in the encapsulant.

63. The assembly of claim 61, wherein the chip extends vertically beyond the conductive trace in the first direction.

64. The assembly of claim 61, wherein the routing line is essentially flat and parallel to the first and second surfaces of the chip.

65. The assembly of claim 61, wherein the cavity extends across a majority of a diameter of the bumped terminal.

66. The assembly of claim 61, wherein the cavity extends across a majority of a height and diameter of the metal filler.

67. The assembly of claim 61, wherein:
the cavity includes first and second opposing ends that are adjacent to the bumped terminal, the first end of the cavity faces in the first direction, and the second end of the cavity faces in the second direction; and
the metal filler includes first and second opposing surfaces, the first surface of the metal filler faces in the first direction, and the second surface of the metal filler faces in the second direction and has identical size, shape and location as the second end of the cavity.

68. The assembly of claim 67, wherein the second end of the cavity is disposed within a surface area of the first end of the cavity and within a surface area of the bumped terminal, the surface area of the first end of the cavity is at least 20 percent larger than a surface area of the second end of the cavity, and the surface area of the bumped terminal is at least 20 percent larger than the surface area of the second end of the cavity.

69. The assembly of claim 67, wherein the metal filler fills the cavity.

70. The assembly of claim 67, wherein the metal filler and the encapsulant fill the cavity.

71. A semiconductor chip assembly, comprising:
a semiconductor chip that includes first and second opposing surfaces, wherein the first surface of the chip includes a conductive pad;
a conductive trace that includes a routing line, a bumped terminal and a metal filler, wherein the bumped terminal includes a cavity;
a connection joint that electrically connects the routing line and the pad; and
an encapsulant that includes first and second opposing surfaces, wherein the first surface of encapsulant faces in a first direction, the second surface of the encapsulant faces in a second direction opposite the first direction, the chip is embedded in the encapsulant, the routing line extends laterally beyond the bumped terminal and the metal filler towards the chip and extends vertically beyond the chip in the second direction, the bumped terminal is contiguous with and integral with the routing line and extends vertically beyond the routing line in the second direction, the cavity extends through the bumped terminal in the first and second directions and has a diameter that decreases as the cavity extends in the second direction, the metal filler contacts the bumped terminal in the cavity, extends vertically beyond the routing line, the bumped terminal and the cavity in the first direction and extends vertically beyond the routing line in the second direction, and the bumped terminal, the cavity and the metal filler are disposed outside a periphery of the chip, are laterally aligned with one another at a surface that faces in the second direction and are not covered in the second direction by the encapsulant or any other insulative material of the assembly.

72. The assembly of claim 71, wherein the chip is the only chip embedded in the encapsulant.

73. The assembly of claim 71, wherein the chip extends vertically beyond the conductive trace in the first direction.

74. The assembly of claim 71, wherein the routing line is essentially flat and parallel to the first and second surfaces of the chip.

75. The assembly of claim 71, wherein the cavity extends across a majority of a diameter of the bumped terminal.

76. The assembly of claim 71, wherein the cavity extends across a majority of a height and diameter of the metal filler.

77. The assembly of claim 71, wherein:
the cavity includes first and second opposing ends that are adjacent to the bumped terminal, the first end of the cavity faces in the first direction, and the second end of the cavity faces in the second direction; and
the metal filler includes first and second opposing surfaces, the first surface of the metal filler faces in the first direction, and the second surface of the metal filler faces in the second direction and has identical size, shape and location as the second end of the cavity.

78. The assembly of claim 77, wherein the second end of the cavity is disposed within a surface area of the first end of the cavity and within a surface area of the bumped terminal, the surface area of the first end of the cavity is at least 20 percent larger than a surface area of the second end of the cavity, and the surface area of the bumped terminal is at least 20 percent larger than the surface area of the second end of the cavity.

79. The assembly of claim 77, wherein the metal filler fills the cavity.

80. The assembly of claim 77, wherein the metal filler and the encapsulant fill the cavity.

81. A semiconductor chip assembly, comprising:
a semiconductor chip that includes first and second opposing surfaces, wherein the first surface of the chip includes a conductive pad;
a conductive trace that includes a routing line, a bumped terminal and a metal filler, wherein the bumped terminal includes a cavity;
a connection joint that electrically connects the routing line and the pad;
an insulative base; and
an encapsulant that includes first and second opposing surfaces, wherein the first surface of encapsulant faces in a first direction, the second surface of the encapsulant faces in a second direction opposite the first direction, the chip is embedded in the encapsulant, the routing line extends laterally beyond the bumped terminal and the metal filler towards the chip and extends vertically beyond the chip in the second direction, the bumped terminal is contiguous with and integral with the routing line and extends vertically beyond the routing line in the second direction, the cavity extends through the bumped terminal in the first and second directions, the metal filler contacts the bumped terminal in the cavity, extends vertically beyond the routing line, the bumped terminal and the cavity in the first direction and extends vertically beyond the routing line in the second direction, the bumped terminal, the cavity and the metal filler are disposed outside a periphery of the chip and are not covered in the second direction by the encapsulant, the insulative base or any other insulative material of the assembly, the insulative base contacts the routing line and the bumped terminal, is spaced from and overlapped by the chip, is spaced from the metal filler and extends vertically beyond the chip, the routing line and the encapsulant in the second direction, and the bumped terminal, the cavity, the metal filler and the insulative base are laterally aligned with one another at a surface that faces in the second direction.

82. The assembly of claim 81, wherein the chip is the only chip embedded in the encapsulant.

83. The assembly of claim 81, wherein the chip extends vertically beyond the conductive trace in the first direction.

84. The assembly of claim 81, wherein the routing line is essentially flat and parallel to the first and second surfaces of the chip.

85. The assembly of claim 81, wherein the cavity extends across a majority of a diameter of the bumped terminal.

86. The assembly of claim 81, wherein the cavity extends across a majority of a height and diameter of the metal filler.

87. The assembly of claim 81, wherein:
the cavity includes first and second opposing ends that are adjacent to the bumped terminal, the first end of the cavity faces in the first direction, and the second end of the cavity faces in the second direction; and
the metal filler includes first and second opposing surfaces, the first surface of the metal filler faces in the first direction, and the second surface of the metal filler faces in the second direction and has identical size, shape and location as the second end of the cavity.

88. The assembly of claim 87, wherein the second end of the cavity is disposed within a surface area of the first end of the cavity and within a surface area of the bumped terminal, the surface area of the first end of the cavity is at least 20 percent larger than a surface area of the second end of the cavity, and the surface area of the bumped terminal is at least 20 percent larger than the surface area of the second end of the cavity.

89. The assembly of claim 87, wherein the metal filler fills the cavity.

90. The assembly of claim 87, wherein the metal filler and the encapsulant fill the cavity.

91. The assembly of claims 1, 61, 71 or 81, wherein the routing line and the bumped terminal include first and second metal layers, the first metal layer is adjacent to the cavity and contacts the metal filler and extends vertically beyond the second metal layer in the first direction, the second metal layer is spaced from the cavity and is laterally aligned with the first metal layer, the cavity and the metal filler at a surface that faces in the second direction, and the first and second metal layers are different metals.

92. The assembly of claim 91, wherein the first and second metal layers contact one another.

93. The assembly of claim 91, wherein the first metal layer is thicker than the second metal layer.

94. The assembly of claim 91, wherein the first metal layer and the metal filler have a same composition.

95. The assembly of claim 91, wherein the first metal layer and the metal filler are copper, and the second metal layer is nickel.

96. The assembly of claim 91, wherein the first metal layer is copper, the second metal layer is nickel, and the metal filler is solder.

97. The assembly of claim 91, wherein the metal filler is solder.

98. The assembly of claim 91, wherein the first and second metal layers contact one another, and the first metal layer is thicker than the second metal layer.

99. The assembly of claim 98, wherein the first metal layer and the metal filler are copper, and the second metal layer is nickel.

100. The assembly of claim 98, wherein the first metal layer is copper, the second metal layer is nickel and the metal filler is solder.

* * * * *

UNITED STATES PATENT AND TRADEMARK OFFICE
CERTIFICATE OF CORRECTION

PATENT NO.       : 7,132,741 B1
APPLICATION NO.  : 10/994836
DATED            : November 7, 2006
INVENTOR(S)      : Charles W.C. Lin et al.

It is certified that error appears in the above-identified patent and that said Letters Patent is hereby corrected as shown below:

<u>Column 14</u>
Line 8, insert -- 10A, -- after "FIGS.".
Line 50, change "1A," to -- 11A, --.

Signed and Sealed this

Fifteenth Day of May, 2007

JON W. DUDAS
*Director of the United States Patent and Trademark Office*